(12) United States Patent
Sasaki et al.

(10) Patent No.: US 8,618,646 B2
(45) Date of Patent: Dec. 31, 2013

(54) LAYERED CHIP PACKAGE AND METHOD OF MANUFACTURING SAME

(75) Inventors: Yoshitaka Sasaki, Santa Clara, CA (US); Hiroyuki Ito, Milpitas, CA (US); Hiroshi Ikejima, Hong Kong (CN); Atsushi Iijima, Hong Kong (CN)

(73) Assignees: Headway Technologies, Inc., Milpitas, CA (US); Sae Magnetics (H.K.) Ltd., Hong Kong (CN)

( * ) Notice: Subject to any disclaimer, the term of this patent is extended or adjusted under 35 U.S.C. 154(b) by 332 days.

(21) Appl. No.: 12/902,600

(22) Filed: Oct. 12, 2010

(65) Prior Publication Data
US 2012/0086130 A1    Apr. 12, 2012

(51) Int. Cl.
*H01L 23/02* (2006.01)

(52) U.S. Cl.
USPC .... 257/686; 257/723; 257/724; 257/E25.013; 257/E25.021; 257/E25.026; 257/E25.027

(58) Field of Classification Search
USPC .................. 257/686, 777, 723, 724, E25.013, 257/E25.021, E25.026, E25.027
See application file for complete search history.

(56) References Cited

U.S. PATENT DOCUMENTS

| | | | |
|---|---|---|---|
| 5,953,588 A | | 9/1999 | Camien et al. |
| 6,582,992 B2 | | 6/2003 | Poo et al. |
| 7,127,807 B2 | | 10/2006 | Yamaguchi et al. |
| 7,745,259 B2 | | 6/2010 | Sasaki et al. |
| 7,755,176 B1 * | | 7/2010 | St. Amand et al. ............ 257/678 |
| 7,863,095 B2 | | 1/2011 | Sasaki et al. |
| 7,868,442 B2 | | 1/2011 | Sasaki et al. |
| 7,877,874 B2 | | 2/2011 | Val |
| 7,968,374 B2 | | 6/2011 | Sasaki et al. |
| 8,324,741 B2 * | | 12/2012 | Sasaki et al. .................. 257/786 |
| 8,358,015 B2 | | 1/2013 | Sasaki et al. |
| 2001/0000053 A1 | | 3/2001 | Suh et al. |
| 2003/0146012 A1 | | 8/2003 | Song et al. |

(Continued)

FOREIGN PATENT DOCUMENTS

| | | |
|---|---|---|
| JP | A-2002-50735 | 2/2002 |
| JP | 2003-163324 | 6/2003 |

(Continued)

OTHER PUBLICATIONS

U.S. Appl. No. 13/156,808, filed Jun. 9, 2011 in the name of Sasaki et al.

(Continued)

*Primary Examiner* — Long K Tran
(74) *Attorney, Agent, or Firm* — Oliff & Berridge, PLC

(57) ABSTRACT

A layered chip package includes a main body. The main body includes a main part, and further includes first terminals and second terminals disposed on the top and bottom surfaces of the main part, respectively. The main part includes first and second layer portions, and through electrodes penetrating them. The through electrodes are electrically connected to the first and second terminals. Each of the layer portions includes a semiconductor chip having a first surface and a second surface opposite thereto, and further includes surface electrodes. The surface electrodes are disposed on a side of the semiconductor chip opposite to the second surface. The first and second layer portions are bonded to each other such that the respective second surfaces face each other. The first terminals are formed by using the surface electrodes of the first layer portion. The second terminals are formed by using the surface electrodes of the second layer portion.

26 Claims, 28 Drawing Sheets

(56) References Cited

U.S. PATENT DOCUMENTS

| | | | |
|---|---|---|---|
| 2007/0165461 | A1 | 7/2007 | Cornwell et al. |
| 2007/0216006 | A1* | 9/2007 | Park et al. .................... 257/686 |
| 2008/0179728 | A1 | 7/2008 | Ikeda |
| 2008/0227238 | A1* | 9/2008 | Ko et al. ........................ 438/108 |
| 2008/0289174 | A1 | 11/2008 | Val |
| 2009/0051046 | A1 | 2/2009 | Yamazaki et al. |
| 2010/0008058 | A1 | 1/2010 | Saen et al. |
| 2010/0200977 | A1 | 8/2010 | Sasaki et al. |
| 2011/0221073 | A1 | 9/2011 | Sasaki et al. |

FOREIGN PATENT DOCUMENTS

| | | |
|---|---|---|
| JP | A-2006-148161 | 6/2006 |
| JP | A-2009-111384 | 5/2007 |
| JP | A-2009-521116 | 5/2009 |
| JP | A-2010-114155 | 5/2010 |
| JP | A-2010-183058 | 8/2010 |
| WO | WO 2008/085391 A2 | 7/2008 |

OTHER PUBLICATIONS

U.S. Appl. No. 13/156,941, filed Jun. 9, 2011 in the name of Sasaki et al.

Gann; "Neo-Stacking Technology;" *HDI Magazine*; Dec. 1999; Miller Freeman, Inc.

U.S. Appl. No. 12/875,710, filed Sep. 3, 2010 in the name of Sasaki et al.

U.S. Appl. No. 12/896,283, filed Oct. 1, 2010 in the name of Sasaki et al.

Jan. 25, 2013 Office Action issued in U.S. Appl. No. 12/875,710.

Sep. 25, 2012 Notice of Reasons for Rejection issued in Japanese Patent Application No. 2011-106804 (with translation).

Sep. 25, 2012 Notice of Reasons for Rejection issued in Japanese Patent Application No. 2011-106803 (with translation).

Jun. 5, 2013 Office Action issued in U.S. Appl. No. 13/156,808.

\* cited by examiner

LAYERED CHIP PACKAGE AND METHOD OF MANUFACTURING SAME

BACKGROUND OF THE INVENTION

1. Field of the Invention

The present invention relates to a layered chip package that includes a plurality of semiconductor chips stacked, and to a method of manufacturing the same.

2. Description of the Related Art

In recent years, lighter weight and higher performance have been demanded of portable devices typified by cellular phones and notebook personal computers. Accordingly, there has been a need for higher integration of electronic components for use in the portable devices. With the development of image- and video-related equipment such as digital cameras and video recorders, semiconductor memories of larger capacity and higher integration have also been demanded.

As an example of highly integrated electronic components, a system-in-package (hereinafter referred to as SiP), especially an SiP utilizing a three-dimensional packaging technology for stacking a plurality of semiconductor chips, has attracting attention in recent years. In the present application, a package that includes a plurality of semiconductor chips (hereinafter, also simply referred to as chips) stacked is called a layered chip package. Since the layered chip package allows a reduction in wiring length, it provides the advantage of allowing quick circuit operation and a reduced stray capacitance of the wiring, as well as the advantage of allowing higher integration.

Major examples of the three-dimensional packaging technology for fabricating a layered chip package include a wire bonding method and a through electrode method. The wire bonding method stacks a plurality of chips on a substrate and connects a plurality of electrodes formed on each chip to external connecting terminals formed on the substrate by wire bonding. The through electrode method forms a plurality of through electrodes in each of chips to be stacked and wires the chips together by using the through electrodes.

U.S. Patent Application Publication No. US 2008/0179728 A1 describes a laminated memory formed using the through electrode method.

JP-A-2003-163324 describes a three-dimensional laminated semiconductor device in which a plurality of chips stacked are wired by using wiring plugs that are similar to through electrodes. The three-dimensional laminated semiconductor device includes a stack of a plurality of unit semiconductor devices. Each single unit semiconductor device includes a semiconductor chip having a chip electrode, a wiring pattern, molding resin, and wiring plugs. The chip electrode is mounted on one surface of the wiring pattern. The molding resin covers the semiconductor chip and the wiring pattern. The wiring plugs penetrate the molding resin outside the semiconductor chip. The wiring plugs each have one end in contact with the one surface of the wiring pattern, and the other end exposed from the molding resin. The other surface of the wiring pattern is exposed in the surface of the molding resin. In the three-dimensional laminated semiconductor device, the wiring plugs of the lower one of two unit semiconductor devices are put into contact with the exposed surface of the wiring pattern of the upper one of the two unit semiconductor devices, whereby the plurality of semiconductor chips are wired together.

The wire bonding method has the problem that it is difficult to reduce the distance between the electrodes so as to avoid contact between the wires, and the problem that the high resistances of the wires hamper quick circuit operation. The through electrode method eliminates the above problems with the wire bonding method.

For a wafer to be cut into a plurality of chips, the yield of the chips, that is, the rate of conforming chips with respect to all chips obtained from the wafer, is 90% to 99% in many cases. Since a layered chip package includes a plurality of chips, the rate of layered chip packages in which all of the plurality of chips are conforming ones is lower than the yield of the chips. The larger the number of chips included in each layered chip package, the lower the rate of layered chip packages in which all of the chips are conforming ones.

A case will now be considered where a layered chip package is used to form a memory device such as a flash memory. For a memory device such as a flash memory, a redundancy technique of replacing a defective column of memory cells with a redundant column of memory cells is typically employed so that the memory device can normally function even when some memory cells are defective. The redundancy technique can also be employed in the case of forming a memory device using a layered chip package. This makes it possible that, even if some of memory cells included in any chip are defective, the memory device can normally function while using the chip including the defective memory cells. Suppose, however, that a chip including a control circuit and a plurality of memory cells has become defective due to, for example, a wiring failure of the control circuit, and the chip cannot function normally even by employing the redundancy technique. In such a case, the defective chip is no longer usable. While the defective chip can be replaced with a conforming one, it increases the cost for the layered chip package.

In order to reduce the possibility for a single layered chip package to include a defective chip, a possible approach is to reduce the number of chips included in each layered chip package. In such a case, a plurality of layered chip packages that include only conforming chips can be electrically connected to each other to form a memory device that includes a desired number of chips. This, however, gives rise to the problem of complicated wiring for electrically connecting the plurality of layered chip packages.

OBJECT AND SUMMARY OF THE INVENTION

It is an object of the present invention to provide a layered chip package, a composite layered chip package, and methods of manufacturing the same that make it possible to stack a plurality of layered chip packages and electrically connect them to each other in a simple configuration, whereby a package including a desired number of semiconductor chips can be provided at low cost.

A layered chip package of the present invention includes a main body having a top surface and a bottom surface. The main body includes: a main part having a top surface and a bottom surface; a plurality of first terminals disposed on the top surface of the main part; and a plurality of second terminals disposed on the bottom surface of the main part. The main part includes a first layer portion and a second layer portion stacked, and a plurality of through electrodes that each penetrate the first and second layer portions. The plurality of through electrodes are electrically connected to the plurality of first terminals and the plurality of second terminals. Each of the first and second layer portions includes a semiconductor chip and a plurality of surface electrodes, the semiconductor chip having a first surface and a second surface opposite to the first surface. The plurality of surface electrodes are disposed on a side of the semiconductor chip opposite to the second surface. The first layer portion and the second layer portion are bonded to each other such that the respective second surfaces face each other. The plurality of first terminals are formed by using the plurality of surface electrodes of the first layer portion. The plurality of second terminals are formed by using the plurality of surface electrodes of the second layer portion.

A composite layered chip package of the present invention includes a plurality of subpackages stacked, every vertically adjacent two of the subpackages being electrically connected to each other. Each of the plurality of subpackages includes a main body having a top surface and a bottom surface. The main body includes: a main part having a top surface and a bottom surface; a plurality of first terminals disposed on the top surface of the main part; and a plurality of second terminals disposed on the bottom surface of the main part. The main part includes a first layer portion and a second layer portion stacked, and a plurality of through electrodes that each penetrate the first and second layer portions. The plurality of through electrodes are electrically connected to the plurality of first terminals and the plurality of second terminals. Each of the first and second layer portions includes a semiconductor chip and a plurality of surface electrodes, the semiconductor chip having a first surface and a second surface opposite to the first surface. The plurality of surface electrodes are disposed on a side of the semiconductor chip opposite to the second surface. The first layer portion and the second layer portion are bonded to each other such that the respective second surfaces face each other. The plurality of first terminals are formed by using the plurality of surface electrodes of the first layer portion. The plurality of second terminals are formed by using the plurality of surface electrodes of the second layer portion. For any vertically adjacent two of the subpackages, the plurality of second terminals of the upper one of the subpackages are electrically connected to the plurality of first terminals of the lower one.

In the layered chip package or the composite layered chip package of the present invention, the plurality of surface electrodes of the first layer portion and those of the second layer portion may have the same layout. In such a case, the plurality of surface electrodes may include a plurality of first terminal component parts that are used to form the plurality of first terminals in the first layer portion, and a plurality of second terminal component parts that are used to form the plurality of second terminals in the second layer portion. The plurality of surface electrodes may further include one or more connecting parts that electrically connect one of the first terminal component parts and one of the second terminal component parts to each other.

In the layered chip package or the composite layered chip package of the present invention, the plurality of surface electrodes may include a plurality of chip connection surface electrodes for electrical connection to the semiconductor chip. In at least one of the first and second layer portions, the plurality of chip connection surface electrodes may be in contact with and electrically connected to the semiconductor chip.

In the layered chip package or the composite layered chip package of the present invention, the plurality of surface electrodes of the first layer portion may include one or more surface electrodes that are not used to form the plurality of first terminals, while the plurality of surface electrodes of the second layer portion may include one or more surface electrodes that are not used to form the plurality of second terminals.

In the layered chip package or the composite layered chip package of the present invention, the plurality of second terminals may be positioned to overlap the plurality of first terminals as viewed in a direction perpendicular to the top surface of the main body. In such a case, the plurality of second terminals may be electrically connected to corresponding ones of the first terminals via the respective through electrodes to constitute a plurality of pairs of the first and second terminals, the first and second terminals in each of the pairs being electrically connected to each other. The plurality of pairs may include a plurality of non-overlapping terminal pairs. Each of the non-overlapping terminal pairs consists of any one of the first terminals and any one of the second terminals, the first and second terminals in each of the non-overlapping terminal pairs being electrically connected to each other and being positioned not to overlap each other as viewed in the direction perpendicular to the top surface of the main body.

When the plurality of pairs include the plurality of non-overlapping terminal pairs, the plurality of pairs may further include a plurality of overlapping terminal pairs. Each of the overlapping terminal pairs consists of any one of the first terminals and any one of the second terminals, the first and second terminals in each of the overlapping terminal pairs being electrically connected to each other and being positioned to overlap each other as viewed in the direction perpendicular to the top surface of the main body. The plurality of through electrodes may include: a chip connection through electrode that is electrically connected to any one of the plurality of non-overlapping terminal pairs and used for electrical connection to the semiconductor chip of at least one of the first and second layer portions; and a bypass through electrode that is electrically connected to any one of the plurality of non-overlapping terminal pairs and to neither of the semiconductor chips included in the first and second layer portions.

In the layered chip package or the composite layered chip package of the present invention, the semiconductor chip may include a plurality of memory cells.

In the layered chip package of the present invention, one of the first and second layer portions may be a first-type layer portion, whereas the other of the first and second layer portions may be a second-type layer portion. In the first-type layer portion, the semiconductor chip is electrically connected to two or more of the plurality of through electrodes. In the second-type layer portion, the semiconductor chip is electrically connected to none of the through electrodes. The semiconductor chip of the first-type layer portion may be a normally functioning one, whereas the semiconductor chip of the second-type layer portion may be a malfunctioning one.

In at least one of the plurality of subpackages of the composite layered chip package of the present invention, one of the first and second layer portions may be a first-type layer portion, whereas the other of the first and second layer portions may be a second-type layer portion. In the first-type layer portion, the semiconductor chip is electrically connected to two or more of the plurality of through electrodes. In the second-type layer portion, the semiconductor chip is electrically connected to none of the through electrodes. In such a case, the composite layered chip package may further include an additional portion that is electrically connected to any of the plurality of subpackages. The additional portion includes at least one additional semiconductor chip, and additional portion wiring that defines electrical connections between the at least one additional semiconductor chip and the plurality of first or second terminals of any of the plurality of subpackages so that the at least one additional semiconductor chip substitutes for the semiconductor chip of the second-type layer portion of the at least one of the subpackages. The semiconductor chip in each of the layer portions and the additional semiconductor chip may each include a plurality of memory cells.

A method of manufacturing layered chip packages of the present invention is a method by which a plurality of layered chip packages of the invention are manufactured. The manufacturing method includes the steps of: fabricating a layered substructure by stacking two substructures each of which includes an array of a plurality of preliminary layer portions, each of the preliminary layer portions being intended to become one of the first and second layer portions, the substructures being intended to be cut later at positions of boundaries between every adjacent ones of the preliminary layer portions; and forming the plurality of layered chip packages from the layered substructure.

In the method of manufacturing the layered chip packages of the present invention, the step of fabricating the layered substructure may include the steps of: fabricating an initial layered substructure that is to later become the layered substructure by being provided with a plurality of holes for the plurality of through electrodes to be accommodated in and the plurality of through electrodes; forming the plurality of holes in the initial layered substructure; and forming the plurality of through electrodes in the plurality of holes.

In the method of manufacturing the layered chip packages of the present invention, each of the two substructures may include a plurality of conductor parts for forming the plurality of through electrodes. In the step of fabricating the layered substructure, the plurality of conductor parts of one of the two substructures and those of the other of the two substructures may be electrically connected to each other to form the plurality of through electrodes.

In the method of manufacturing the layered chip packages of the present invention, the plurality of surface electrodes may include a plurality of chip connection surface electrodes for electrical connection to the semiconductor chip. In such a case, the step of fabricating the layered substructure may include, as a series of steps for forming each of the substructures, the steps of: fabricating a pre-substructure wafer that includes an array of a plurality of pre-semiconductor-chip portions, the pre-semiconductor-chip portions being intended to become the semiconductor chips, respectively; distinguishing the plurality of pre-semiconductor-chip portions included in the pre-substructure wafer into normally functioning pre-semiconductor-chip portions and malfunctioning pre-semiconductor-chip portions; and forming the plurality of chip connection surface electrodes so that the pre-substructure wafer is made into the substructure, the plurality of chip connection surface electrodes being formed such that they are in contact with and electrically connected to the normally functioning pre-semiconductor-chip portions while not in contact with the malfunctioning pre-semiconductor-chip portions.

A first manufacturing method according to the present invention is a method of manufacturing a composite layered chip package including a plurality of subpackages. The method includes the steps of: fabricating the plurality of subpackages; and stacking the plurality of subpackages and electrically connecting them to each other.

A second manufacturing method according to the present invention is a method of manufacturing a composite layered chip package including a plurality of subpackages and an additional portion. The method includes the steps of: fabricating the plurality of subpackages; fabricating the additional portion; and stacking the plurality of subpackages and the additional portion and electrically connecting them to each other.

According to the layered chip package, the composite layered chip package, and the methods of manufacturing the same of the present invention, the plurality of first terminals and the plurality of second terminals can be used to stack and electrically connect a plurality of layered chip packages (subpackages). In the present invention, the first layer portion and the second layer portion are bonded to each other such that the respective second surfaces face each other. The plurality of first terminals are formed by using the plurality of surface electrodes of the first layer portion. The plurality of second terminals are formed by using the plurality of surface electrodes of the second layer portion. The present invention thus allows a plurality of layered chip packages (subpackages) to be electrically connected to each other in a simple configuration. Consequently, according to the present invention, it is possible to stack a plurality of layered chip packages (subpackages) and electrically connect them to each other in a simple configuration. A package that includes a desired number of semiconductor chips can thus be provided at low cost.

Other and further objects, features and advantages of the present invention will appear more fully from the following description.

DETAILED DESCRIPTION OF THE PREFERRED EMBODIMENTS

[First Embodiment]

Figure 1:
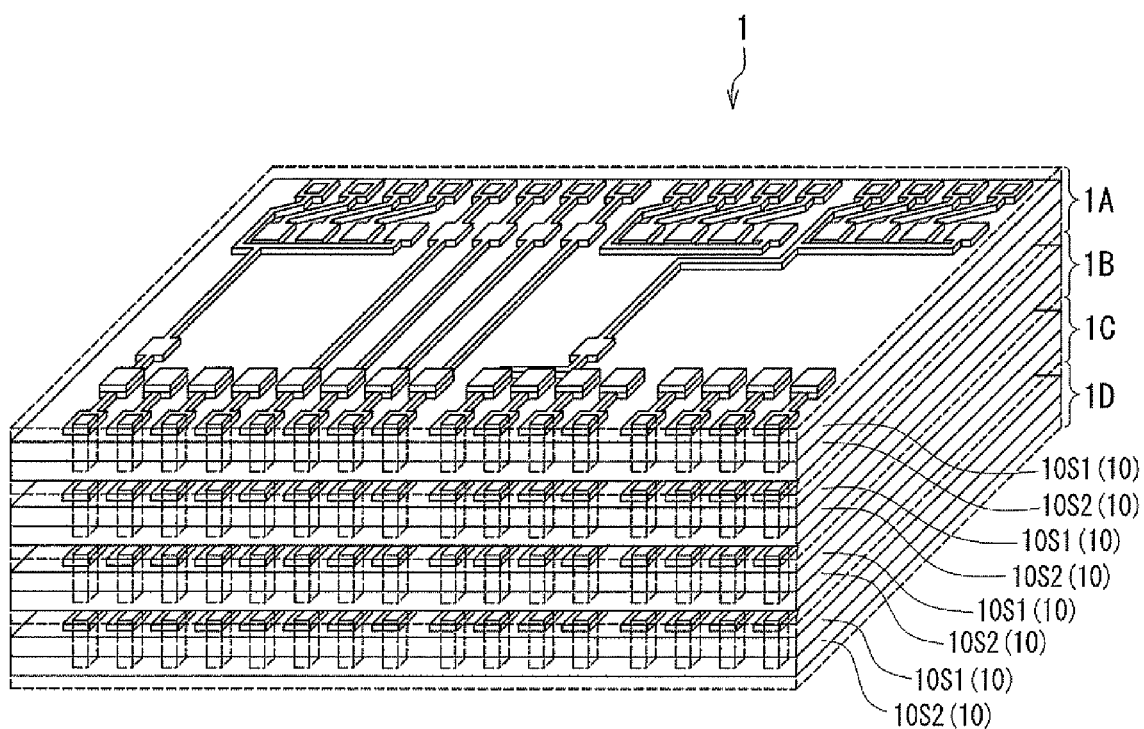
FIG. 1 is a perspective view of a composite layered chip package according to a first embodiment of the invention.
Figure 2:
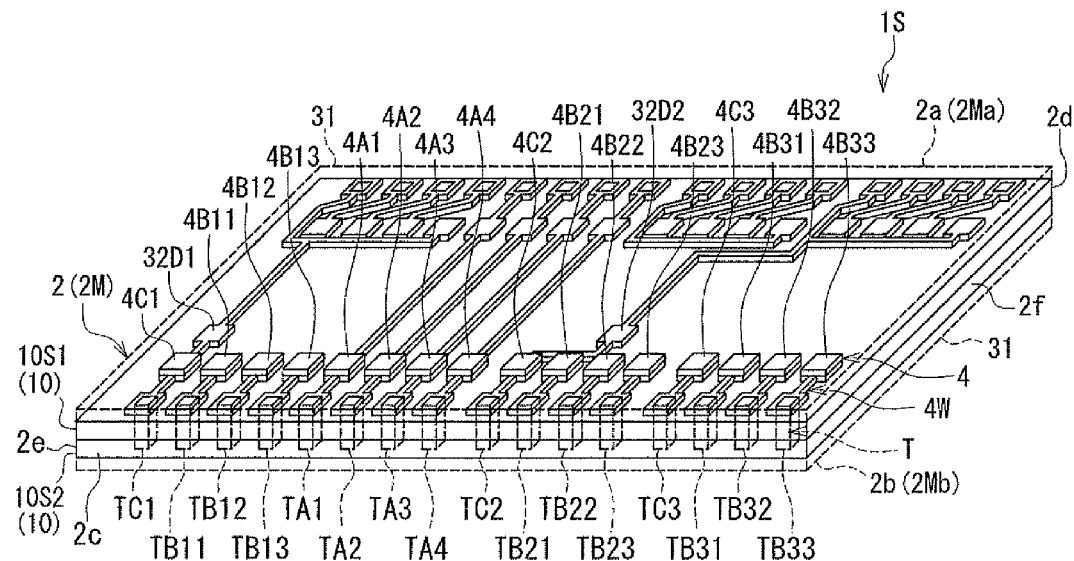
FIG. 2 is a perspective view of a layered chip package according to the first embodiment of the invention.
Figure 3:
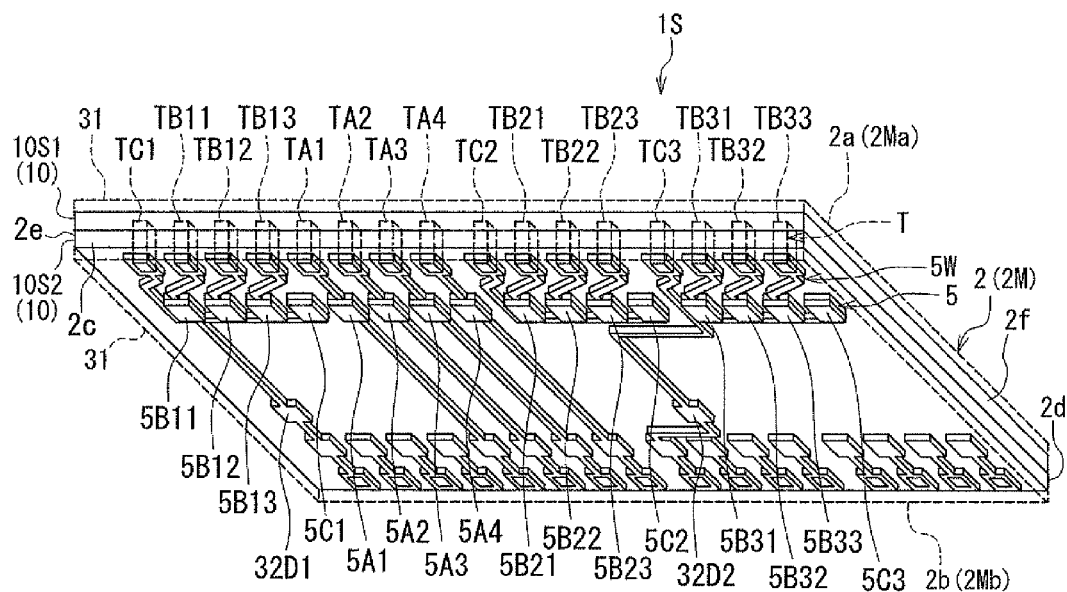
FIG. 3 is a perspective view showing the layered chip package of FIG. 2 as viewed from below.
Figure 4:
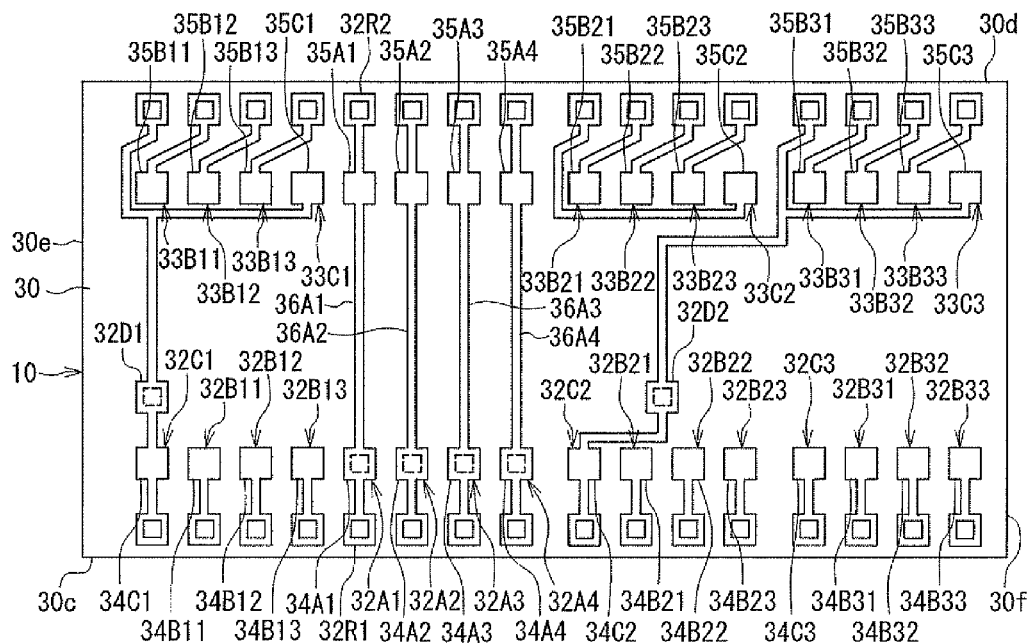
FIG. 4 is a plan view showing a layer portion included in the layered chip package of FIG. 2.
Figure 5:
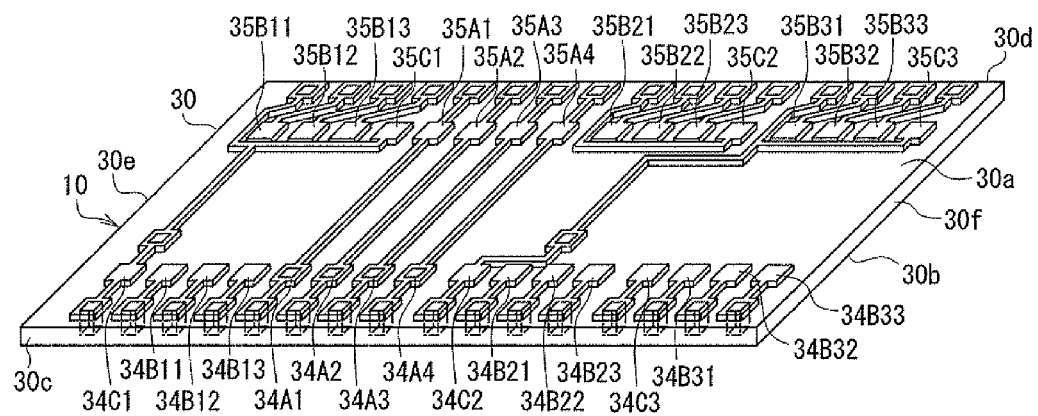
FIG. 5 is a perspective view of the layer portion shown in FIG. 4.

Preferred embodiments of the present invention will now be described in detail with reference to the drawings. First, reference is made to FIG. 1 to FIG. 5 to describe the configurations of a layered chip package and a composite layered chip package according to a first embodiment of the invention. FIG. 1 is a perspective view of the composite layered chip package according to the present embodiment. FIG. 2 is a perspective view of the layered chip package according to the present embodiment. FIG. 3 is a perspective view showing the layered chip package of FIG. 2 as viewed from below. FIG. 4 is a plan view showing a layer portion included in the layered chip package of FIG. 2. FIG. 5 is a perspective view of the layer portion shown in FIG. 4.

As shown in FIG. 1, the composite layered chip package 1 according to the present embodiment includes a plurality of subpackages stacked, every two vertically adjacent subpackages being electrically connected to each other. FIG. 1 shows an example where the composite layered chip package 1 includes four subpackages 1A, 1B, 1C, and 1D that are arranged in order from the top. In the following description, any subpackage will be designated by reference symbol 1S. The subpackage 1S is the layered chip package according to the present embodiment.

As shown in FIG. 2 and FIG. 3, the subpackage 1S includes a main body 2 having a top surface 2a, a bottom surface 2b, and four side surfaces 2c, 2d, 2e and 2f. The side surfaces 2c and 2d are mutually opposite to each other. The side surfaces 2e and 2f are mutually opposite to each other. The main body 2 includes a main part 2M having a top surface 2Ma and a bottom surface 2Mb. The main part 2M includes a first layer portion 10S1 and a second layer portion 10S2 stacked. The first layer portion 10S1 lies on the second layer portion 10S2. Hereinafter, either layer portion will be represented by reference numeral 10. The main part 2M further includes a plurality of through electrodes T penetrating the first and second layer portions 10S1 and 10S2.

The main body 2 further includes a plurality of first terminals 4 disposed on the top surface 2Ma of the main part 2M, and a plurality of second terminals 5 disposed on the bottom surface 2Mb of the main part 2M. The plurality of through electrodes T are electrically connected to the plurality of first terminals 4 and the plurality of second terminals 5. The main body 2 further includes top wiring 4W and bottom wiring 5W. The top wiring 4W is disposed on the top surface 2Ma of the main part 2M and electrically connects the plurality of first terminals 4 to the plurality of through electrodes T. The bottom wiring 5W is disposed on the bottom surface 2Mb of the main part 2M and electrically connects the plurality of second terminals 5 to the plurality of through electrodes T.

The plurality of second terminals 5 are positioned to overlap the plurality of first terminals 4 as viewed in a direction perpendicular to the top surface 2a of the main body 2. When a plurality of subpackages 1S are stacked on each other, the plurality of second terminals 5 of the upper one of the subpackages 1S are therefore opposed to the plurality of first terminals 4 of the lower one. In the present embodiment, when a plurality of subpackages 1S are stacked on each other, the plurality of second terminals 5 of the upper one of any two vertically adjacent subpackages 1S are electrically connected to the plurality of first terminals 4 of the lower one.

At least either the terminals 4 or the terminals 5 may each include a solder layer made of a solder material, the solder layer being exposed in the surface of each of the terminals 4 or each of the terminals 5. In such a case, the solder layers are heated to melt and then solidified, whereby the plurality of second terminals 5 of the upper one of two vertically adjacent subpackages 1S are electrically connected to the plurality of first terminals 4 of the lower one.

The first and second layer portions 10S1 and 10S2 are stacked between the top surface 2Ma and the bottom surface 2Mb of the main part 2M. The first and second layer, portions 10S1 and 10S2 are bonded to each other with an adhesive, for example.

A description will now be given of the layer portions 10 with reference to FIG. 4 and FIG. 5. Each of the layer portions 10 includes a semiconductor chip 30. The semiconductor chip 30 has: a first surface 30a with a device formed thereon; a second surface 30b opposite to the first surface 30a; a first side surface 30c and a second side surface 30d that are mutually opposite to each other; and a third side surface 30e and a fourth side surface 30f that are mutually opposite to each other.

Each of the layer portions 10 further includes a plurality of surface electrodes and an insulating portion 31. The plurality of surface electrodes are disposed on a side of the semiconductor chip 30 opposite to the second surface 30b. The insulating portion 31 covers the first surface 30a of the semiconductor chip 30 and part of the surface electrodes.

In the present embodiment, the first and second layer portions 10S1 and 10S2 have the same configuration in appearance, both being as shown in FIG. 4 and FIG. 5. The layer portion 10S1 and the layer portion 10S2, however, are situated in different orientations in the main part 2M. More specifically, the first layer portion 10S1 is arranged with the first surface 30a of the semiconductor chip 30 upward and the side surfaces 30c, 30d, 30e, and 30f of the semiconductor chip 30 toward the side surfaces 2c, 2d, 2e, and 2f of the main body 2, respectively. The second layer portion 10S2 is arranged with the first surface 30a of the semiconductor chip 30 downward and the side surfaces 30d, 30c, 30e, and 30f of the semiconductor chip 30 toward the side surfaces 2c, 2d, 2e, and 2f of the main body 2, respectively. The first layer portion 10S1 and the second layer portion 10S2 are bonded to each other such that the respective second surfaces 30b face each other.

In at least one of the first and second layer portions 10S1 and 10S2 in a single subpackage 1S, the semiconductor chip 30 is electrically connected to two or more of the plurality of through electrodes T via two or more of the plurality of surface electrodes.

A detailed description will now be given of the plurality of terminals 4 and 5, the plurality of through electrodes T, and the plurality of surface electrodes of the present embodiment. In the present embodiment, the plurality of second terminals 5 are electrically connected to corresponding ones of the first terminals 4 via the respective through electrodes T to constitute a plurality of pairs of the first terminal 4 and the second terminal 5. The first terminal 4 and the second terminal 5 in each of the pairs are electrically connected to each other. The plurality of pairs include a plurality of non-overlapping terminal pairs. Each of the non-overlapping terminal pairs consists of any one of the first terminals 4 and any one of the second terminals 5, the first and second terminals 4 and 5 in each of the non-overlapping terminal pairs being electrically connected to each other and being positioned not to overlap each other as viewed in the direction perpendicular to the top surface 2a of the main body 2. The plurality of pairs further include a plurality of overlapping terminal pairs. Each of the overlapping terminal pairs consists of any one of the first terminals 4 and any one of the second terminals 5, the first and second terminals 4 and 5 in each of the overlapping terminal pairs being electrically connected to each other and being positioned to overlap each other as viewed in the direction perpendicular to the top surface 2a of the main body 2.

In the example shown in FIG. 2 and FIG. 3, the plurality of first terminals 4 include first-type terminals 4A1, 4A2, 4A3, and 4A4, second-type terminals 4B11, 4B12, 4B13, 4B21, 4B22, 4B23, 4B31, 4B32, and 4B33, and third-type terminals 4C1, 4C2, and 4C3. Similarly, the plurality of second terminals 5 include first-type terminals 5A1, 5A2, 5A3, and 5A4, second-type terminals 5B11, 5B12, 5B13, 5B21, 5B22, 5B23, 5B31, 5B32, and 5B33, and third-type terminals 5C1, 5C2, and 5C3. The terminals 5A1 to 5A4, 5B11 to 5B13, 5B21 to 5B23, 5B31 to 5B33, and 5C1 to 5C3 are paired with the terminals 4A1 to 4A4, 4B11 to 4B13, 4B21 to 4B23, 4B31 to 4B33, and 4C1 to 4C3, respectively.

In each of the pairs of terminals (4A1, 5A1), (4A2, 5A2), (4A3, 5A3), and (4A4, 5A4), the first terminal 4 and the second terminal 5 are electrically connected to each other and are positioned to overlap each other as viewed in the direction perpendicular to the top surface 2a of the main body 2. These pairs are thus the overlapping terminal pairs.

In each of the pairs of terminals (4B11, 5B11), (4B12, 5B12), (4B13, 5B13), (4B21, 5B21), (4B22, 5B22), (4B23, 5B23), (4B31, 5B31), (4B32, 5B32), (4B33, 5B33), (4C1, 5C1), (4C2, 5C2), and (4C3, 5C3), the first terminal 4 and the second terminal 5 are electrically connected to each other and are positioned not to overlap each other as viewed in the direction perpendicular to the top surface 2a of the main body 2. These pairs are thus the non-overlapping terminal pairs.

The terminals 5B11, 5B12, 5B13, 5C1, 5B21, 5B22, 5B23, 5C2, 5B31, 5B32, 5B33, and 5C3 are positioned to overlap the terminals 4C1, 4B11, 4B12, 4B13, 4C2, 4B21, 4B22, 4B23, 4C3, 4B31, 4B32, and 4B33, respectively, as viewed in the direction perpendicular to the top surface 2a of the main body 2.

The plurality of through electrodes T include first-type through electrodes TA1, TA2, TA3, and TA4, second-type through electrodes TB11, TB12, TB13, TB21, TB22, TB23, TB31, TB32, and TB33, and third-type through electrodes TC1, TC2, and TC3. The first-type through electrodes TA1, TA2, TA3, and TA4 electrically connect the first terminal 4 and the second terminal 5 in the overlapping terminal pairs (4A1, 5A1), (4A2, 5A2), (4A3, 5A3), and (4A4, 5A4), respectively. The plurality of first-type through electrodes TA1 to TA4 have a use common to the first and second layer portions 10S1 and 10S2 in the main part 2M.

The second-type through electrodes TB11, TB12, TB13, TB21, TB22, TB23, TB31, TB32, and TB33 electrically connect the first terminal 4 and the second terminal 5 in the non-overlapping terminal pairs (4B11, 5B11), (4B12, 5B12), (4B13, 5B13), (4B21, 5B21), (4B22, 5B22), (4B23, 5B23), (4B31, 5B31), (4B32, 5B32), and (4B33, 5B33), respectively. The second-type through electrodes are electrically connected to neither of two semiconductor chips 30 included in the first and second layer portions 10S1 and 10S2 in the main part 2M. The second-type through electrodes are thus the bypass through electrodes according to the invention.

The third-type through electrodes TC1, TC2, and TC3 electrically connect the first terminal 4 and the second terminal 5 in the non-overlapping terminal pairs (4C1, 5C1), (4C2, 5C2), and (4C3, 5C3), respectively. The third-type through electrodes are used for electrical connection to the semiconductor chip 30 of at least one of the first and second layer portions 10S1 and 10S2 in the main part 2M. The third-type through electrodes are thus the chip connection through electrodes according to the invention.

On the top surface 2Ma of the main part 2M, as shown in FIG. 2, the first terminals 4A1 to 4A4, 4B11 to 4B13, 4B21 to 4B23, 4B31 to 4B33, and 4C1 to 4C3 are electrically connected to their respective closest through electrodes TA1 to TA4, TB11 to TB13, TB21 to TB23, TB31 to TB33, and TC1 to TC3. On the bottom surface 2Mb of the main part 2M, as shown in FIG. 3, the terminals 5A1 to 5A4 among the plurality of second terminals 5 are electrically connected to their respective closest through electrodes TA1 to TA4. Meanwhile, among the plurality of second terminals 5, the terminals 5B11 to 5B13, 5B21 to 5B23, and 5B31 to 5B33 are respectively electrically connected to the through electrodes TB11 to TB13, TB21 to TB23, and TB31 to TB33 which are adjacent to their respective closest through electrodes. The terminals 5C1, 5C2, and 5C3 are respectively electrically connected to the through electrodes TC1, TC2, and TC3 which are closest to the terminals 5B11, 5B21, and 5B31, respectively.

As will be detailed later, the plurality of first terminals 4 are formed by using the plurality of surface electrodes of the first layer portion 10S1, and the plurality of second terminals 5 are formed by using the plurality of surface electrodes of the second layer portion 10S2. In the present embodiment, the plurality of surface electrodes of the first layer portion 10S1 and those of the second layer portion 10S2 have the same layout. The plurality of surface electrodes include a plurality of first terminal component parts that are used to form the plurality of first terminals 4 in the first layer portion 10S1, and a plurality of second terminal component parts that are used to form the plurality of second terminals 5 in the second layer portion 10S2. As shown in FIG. 4 and FIG. 5, the plurality of surface electrodes include the following first- to sixth-type electrodes.

The first-type electrodes 32A1, 32A2, 32A3, and 32A4 extend in a direction parallel to the side surfaces 30e and 30f of the semiconductor chip 30. The electrodes 32A1, 32A2, 32A3, and 32A4 have their respective ring-shaped portions 32R1 located closer to the side surface 30c of the semiconductor chip 30, and their respective ring-shaped portions 32R2 located closer to the side surface 30d of the semiconductor chip 30. None of the ring-shaped portions 32R1 are exposed in the side surface 30c. None of the ring-shaped portions 32R2 are exposed in the side surface 30d. The ring-shaped portions 32R1 and 32R2 have their respective openings.

The electrode 32A1 includes a first terminal component part 34A1 that is used to form the terminal 4A1 in the first layer portion 10S1, a second terminal component part 35A1 that is used to form the terminal 5A1 in the second layer portion 10S2, and a connecting part 36A1 that electrically connects the terminal component parts 34A1 and 35A1 to each other.

The electrode 32A2 includes a first terminal component part 34A2 that is used to form the terminal 4A2 in the first layer portion 10S1, a second terminal component part 35A2 that is used to form the terminal 5A2 in the second layer portion 10S2, and a connecting part 36A2 that electrically connects the terminal component parts 34A2 and 35A2 to each other.

The electrode 32A3 includes a first terminal component part 34A3 that is used to form the terminal 4A3 in the first layer portion 10S1, a second terminal component part 35A3 that is used to form the terminal 5A3 in the second layer portion 10S2, and a connecting part 36A3 that electrically connects the terminal component parts 34A3 and 35A3 to each other.

The electrode 32A4 includes a first terminal component part 34A4 that is used to form the terminal 4A4 in the first layer portion 10S1, a second terminal component part 35A4 that is used to form the terminal 5A4 in the second layer portion 10S2, and a connecting part 36A4 that electrically connects the terminal component parts 34A4 and 35A4 to each other.

In the first layer portion 10S1, the first-type through electrodes TA1 to TA4 are electrically connected to the ring-shaped portions 32R1 of the electrodes 32A1 to 32A4, respectively. On the other hand, in the second layer portion 10S2, the first-type through electrodes TA1 to TA4 are electrically connected to the ring-shaped portions 32R2 of the electrodes 32A1 to 32A4, respectively. In at least one of the first and second layer portions 10S1 and 10S2, the first-type electrodes 32A1 to 32A4 are in contact with and electrically connected to the semiconductor chip 30. In FIG. 4, the dashed squares in the electrodes 32A1 to 32A4 represent the areas where the electrodes 32A1 to 32A4 make contact with the semiconductor chip 30.

The second-type electrodes 32B11 to 32B13, 32B21 to 32B23, and 32B31 to 32B33 have their respective ring-shaped portions 32R1 located closer to the side surface 30c of the semiconductor chip 30. The electrodes 32B11 to 32B13, 32B21 to 32B23, and 32B31 to 32B33 respectively include first terminal component parts 34B11 to 34B13, 34B21 to 34B23, and 34B31 to 34B33 that are used to form the terminals 4B11 to 4B13, 4B21 to 4B23, and 4B31 to 4B33, respectively, in the first layer portion 10S1. In the first layer portion 10S1, the ring-shaped portions 32R1 of the electrodes 32B11 to 32B13, 32B21 to 32B23, and 32B31 to 32B33 are electrically connected to the second-type through electrodes TB11 to TB13, TB21 to TB23, and TB31 to TB33, respectively. On the other hand, in the second layer portion 10S2, the electrodes 32B11 to 32B13, 32B21 to 32B23, and 32B31 to 32B33 are electrically connected to none of the through electrodes. The second-type electrodes are in non-contact with the semiconductor chip 30.

The third-type electrodes 32C1 to 32C3 have their respective ring-shaped portions 32R1 located closer to the side surface 30c of the semiconductor chip 30. The electrodes 32C1 to 32C3 respectively include first terminal component parts 34C1 to 34C3 that are used to form the terminals 4C1 to 4C3, respectively, in the first layer portion 10S1. In the first layer portion 10S1, the ring-shaped portions 32R1 of the electrodes 32C1 to 32C3 are electrically connected to the third-type through electrodes TC1 to TC3, respectively. On the other hand, in the second layer portion 10S2, the electrodes 32C1 to 32C3 are electrically connected to none of the through electrodes. The third-type electrodes are in non-contact with the semiconductor chip 30.

The fourth-type electrodes 33B11 to 33B13, 33B21 to 33B23, and 33B31 to 33B33 have their respective ring-shaped portions 32R2 located closer to the side surface 30d of the semiconductor chip 30. The electrodes 33B11 to 33B13, 33B21 to 33B23, and 33B31 to 33B33 respectively include second terminal component parts 35B11 to 35B13, 35B21 to 35B23, and 35B31 to 35B33 that are used to form the terminals 5B11 to 5B13, 5B21 to 5B23, and 5B31 to 5B33, respectively, in the second layer portion 10S2. In the second layer portion 10S2, the ring-shaped portions 32R2 of the electrodes 33B11 to 33B13, 33B21 to 33B23, and 33B31 to 33B33 are electrically connected to the second-type through electrodes TB11 to TB13, TB21 to TB23, and TB31 to TB33, respectively. On the other hand, in the first layer portion 10S1, the electrodes 33B11 to 33B13, 33B21 to 33B23, and 33B31 to 33B33 are electrically connected to none of the through electrodes. The fourth-type electrodes are in non-contact with the semiconductor chip 30.

The fifth-type electrodes 33C1 to 33C3 have their respective ring-shaped portions 32R2 located closer to the side surface 30d of the semiconductor chip 30. The electrodes 33C1 to 33C3 respectively include second terminal component parts 35C1 to 35C3 that are used to form the terminals 5C1 to 5C3, respectively, in the second layer portion 10S2. In the second layer portion 10S2, the ring-shaped portions 32R2 of the electrodes 33C1 to 33C3 are electrically connected to the third-type through electrodes TC1 to TC3, respectively. On the other hand, in the first layer portion 10S1, the electrodes 33C1 to 33C3 are electrically connected to none of the through electrodes. The fifth-type electrodes are in non-contact with the semiconductor chip 30.

The sixth-type electrodes 32D1 and 32D2 are ones that are not used to form the terminals 4 or 5. The electrode 32D1 is electrically connected to the electrodes 32C1 and 33C1. The electrode 32D2 is electrically connected to the electrodes 32C2 and 33C3.

In at least one of the first and second layer portions 10S1 and 10S2, the sixth-type electrodes 32D1 and 32D2 are in contact with and electrically connected to the semiconductor chip 30. In FIG. 4, the dashed squares in the electrodes 32D1 and 32D2 represent the areas where the electrodes 32D1 and 32D2 make contact with the semiconductor chip 30.

The first-type electrodes 32A1 to 32A4 and the sixth-type electrodes 32D1 and 32D2 are surface electrodes intended for electrical connection to the semiconductor chip 30, and thus correspond to the chip connection surface electrodes according to the invention.

The electrode 32D1 of the layer portion 10S1 is electrically connected to the through electrode TC1 via the electrode 32C1. The electrode 32D1 of the layer portion 10S2 is electrically connected to the through electrode TC1 via the electrode 33C1. The electrode 32D2 of the layer portion 10S1 is electrically connected to the through electrode TC2 via the electrode 32C2. The electrode 32D2 of the layer portion 10S2 is electrically connected to the through electrode TC3 via the electrode 33C3.

Hereinafter, any surface electrode will be designated by reference numeral 32. In the layer portions 10S1 and 10S2, the insulating portion 31 does not cover the plurality of first and second terminal component parts of the plurality of surface electrodes 32, but covers the first surface 30a of the semiconductor chip 30 and the other portions of the plurality of surface electrodes 32. The first and second terminal component parts not covered by the insulating portion 31 form respective conductor pads. Conductor layers are formed on the conductor pads. The first terminal component parts and the conductor layers in the first layer portion 10S1 constitute the first terminals 4. The second terminal component parts and the conductor layers in the second layer portion 10S2 constitute the second terminals 5. In the present embodiment, the plurality of first terminals 4 are thus formed by using the plurality of surface electrodes 32 (the plurality of first terminal component parts) of the first layer portion 10S1. Part of the portions of the plurality of surface electrodes 32 covered by the insulating portion 31 in the layer portion 10S1 forms the top wiring 4W. The plurality of second terminals 5 are formed by using the plurality of surface electrodes 32 (the plurality of second terminal component parts) of the second layer portion 10S2. Part of the portions of the plurality of surface electrodes 32 covered by the insulating portion 31 in the layer portion 10S2 forms the bottom wiring 5W. In FIG. 1 to FIG. 3, the insulating portions 31 in the layer portions 10S1 and 10S2 are shown in broken lines.

At least one of the first and second layer portions 10S1 and 10S2 in a subpackage 1S is a first-type layer portion. The first and second layer portions 10S1 and 10S2 in a subpackage 1S may include a second-type layer portion. More specifically, one of the first and second layer portions 10S1 and 10S2 may be the first-type layer portion whereas the other of the first and second layer portions 10S1 and 10S2 may be the second-type layer portion.

The semiconductor chip 30 of the first-type layer portion is a normally functioning one, whereas the semiconductor chip 30 of the second-type layer portion is a malfunctioning one. Hereinafter, a normally functioning semiconductor chip 30 will be referred to as a conforming semiconductor chip 30, and a malfunctioning semiconductor chip 30 will be referred to as a defective semiconductor chip 30. Hereinafter, the first-type layer portion will be designated by reference symbol 10A and the second-type layer portion will be designated by reference symbol 10B when the first-type layer portion and the second-type layer portion are to be distinguished from each other.

In the first-type layer portion 10A, the semiconductor chip 30 is electrically connected to two or more of the plurality of through electrodes T. Specifically, in the first-type layer portion 10A, the electrodes 32A1 to 32A4, 32D1, and 32D2 are in contact with and electrically connected to the semiconductor chip 30. Consequently, in the first-type layer portion 10A, the semiconductor chip 30 is electrically connected to the through electrodes TA1 to TA4, the through electrode TC1, and either one of the through electrodes TC2 and TC3. In the second-type layer portion 10B, none of the electrodes 32A1 to 32A4, 32D1, and 32D2 are in contact with the semiconductor chip 30. Consequently, in the second-type layer portion 10B, the semiconductor chip 30 is electrically connected to none of the through electrodes T.

If at least one of the subpackages 1S in the composite layered chip package 1 includes the second-type layer portion 10B, an additional portion to be described later is added to the plurality of subpackages 1S to form a composite layered chip package 1. This will be described in detail later.

The semiconductor chip 30 may be a memory chip that constitutes a memory such as a flash memory, DRAM, SRAM, MRAM, PROM, or FeRAM. Here, the semiconductor chip 30 includes a plurality of memory cells. In such a case, it is possible to implement a memory device of large capacity by using the composite layered chip package 1 which includes a plurality of semiconductor chips 30. With the composite layered chip package 1 according to the present embodiment, it is also possible to easily implement a memory of various capacities such as 64 GB (gigabytes), 128 GB, and 256 GB, by changing the number of the semiconductor chips 30 to be included in the composite layered chip package 1.

Suppose that the semiconductor chip 30 includes a plurality of memory cells. In this case, even if one or more of the memory cells are defective, the semiconductor chip 30 is still conforming if it can function normally by employing the redundancy technique.

The semiconductor chips 30 are not limited to memory chips, and may be ones used for implementing other devices such as CPUs, sensors, and driving circuits for sensors.

The subpackage 1S or the layered chip package according to the present embodiment includes a plurality of pairs of the first terminal 4 and the second terminal 5, the first and second terminals 4 and 5 being electrically connected to each other by the respective through electrodes T. The plurality of pairs include the plurality of non-overlapping terminal pairs. Consequently, according to the present embodiment, when a plurality of subpackages 1S having the same configuration are stacked on each other and electrically connected to each other, some of a plurality of signals associated with the semiconductor chips 30 that fall on the same layers in the respective plurality of subpackages 1S can be easily made different from one subpackage 1S to another.

Figure 11:
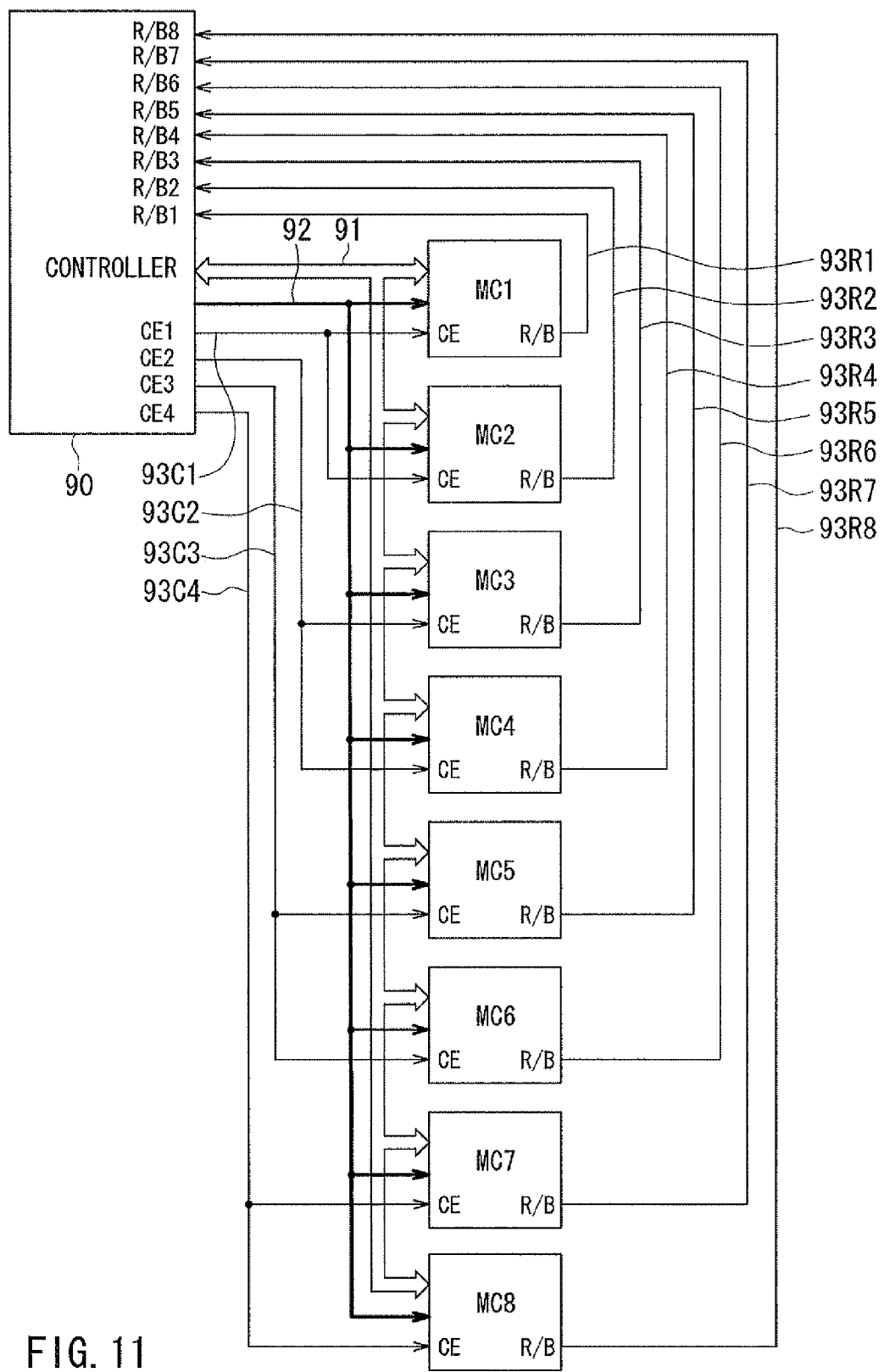
FIG. 11 is a block diagram showing the configuration of a memory device that uses the composite layered chip package according to the first embodiment of the invention.

The layered chip package and the composite layered chip package 1 according to the present embodiment will now be described in more detail with reference to a case where the composite layered chip package 1 is used to construct a memory device. FIG. 11 is a block diagram showing the configuration of the memory device that uses the composite layered chip package 1 according to the embodiment. The memory device includes eight memory chips MC1, MC2, MC3, MC4, MC5, MC6, MC7, and MC8, and a controller 90 which controls these memory chips.

The memory chips MC1, MC2, MC3, MC4, MC5, MC6, MC7, and MC8 are the respective semiconductor chips 30 in the layer portions 10S1 and 10S2 of the subpackage 1A, the layer portions 10S1 and 10S2 of the subpackage 1B, the layer portions 10S1 and 10S2 of the subpackage 1C, and the layer portions 10S1 and 10S2 of the subpackage 1D, which are shown in FIG. 1. Each of the memory chips includes a plurality of memory cells and a peripheral circuit such as an address decoder. The controller 90 is provided independent of the composite layered chip package 1, and is electrically connected to the plurality of first terminals 4 of the subpackage 1A or the plurality of second terminals 5 of the subpackage 1D.

The memory device further includes a data bus 91 which electrically connects the controller 90 to the eight memory chips, and one or more common lines 92 which electrically connect the controller 90 to the eight memory chips. Each of the eight memory chips includes a plurality of electrode pads to which the data bus 91 is electrically connected, and one or more electrode pads to which the one or more common lines 92 are electrically connected. The data bus 91 transmits addresses, commands, data, etc. The one or more common lines 92 include power lines as well as signal lines for transmitting signals that are other than those transmitted by the data bus 91 and are used in common by the eight memory chips.

Each of the eight memory chips further includes an electrode pad CE for receiving a chip enable signal and an electrode pad R/B for outputting a ready/busy signal. The chip enable signal is a signal for controlling whether to select or deselect the memory chip. The ready/busy signal is a signal for indicating the operating state of the memory chip.

The memory device shown in FIG. 11 further includes signal lines 93C1, 93C2, 93C3, and 93C4. The signal line 93C1 electrically connects the controller 90 to the electrode pads CE of the memory chips MC1 and MC2, and transmits a chip enable signal CE1. The signal line 93C2 electrically connects the controller 90 to the electrode pads CE of the memory chips MC3 and MC4, and transmits a chip enable signal CE2. The signal line 93C3 electrically connects the controller 90 to the electrode pads CE of the memory chips MC5 and MC6, and transmits a chip enable signal CE3. The signal line 93C4 electrically connects the controller 90 to the electrode pads CE of the memory chips MC7 and MC8, and transmits a chip enable signal CE4. Thus, in the example shown in FIG. 11, the signal line 93C1 is used by the memory chips MC1 and MC2 in common, the signal line 93C2 is used by the memory chips MC3 and MC4 in common, the signal line 93C3 is used by the memory chips MC5 and MC6 in common, and the signal line 93C4 is used by the memory chips MC7 and MC8 in common. Nevertheless, eight signal lines for transmitting respective different chip enable signals to the memory chips may be provided instead of the signal lines 93C1, 93C2, 93C3, and 93C4.

The memory device shown in FIG. 11 further includes signal lines 93R1, 93R2, 93R3, 93R4, 93R5, 93R6, 93R7, and 93R8. One end of each of the signal lines 93R1 to 93R8 is electrically connected to the controller 90. The other ends of the signal lines 93R1 to 93R8 are electrically connected to the electrode pads R/B of the memory chips MC1 to MC8, respectively. The signal lines 93R1 to 93R8 transmit ready/busy signals R/B1 to R/B8, respectively.

A description will now be given of the relationship between the plurality of through electrodes T in the subpackages 1A to 1D shown in FIG. 1 and the plurality of signal lines shown in FIG. 11. In the subpackages 1A to 1D, the terminals 4A1 and 5A1 are electrically connected the through electrode TA1, the terminals 4A2 and 5A2 are electrically connected to the through electrode TA2, the terminals 4A3 and 5A3 are electrically connected to the through electrode TA3, and the terminals 4A4 and 5A4 are electrically connected to the through electrode TA4. As a result, there are formed a plurality of electrical paths from the terminals 4A1-4A4 of the subpackage 1A to the terminals 5A1-5A4 of the subpackage 1D. The plurality of electrical paths constitute parts of the data bus 91 and the one or more common lines 92.

The terminal 4C1 of the subpackage 1A is electrically connected to the terminal 5C1 of the subpackage 1A via the through electrode TC1 of the subpackage 1A. The terminal 5C1 of the subpackage 1A is electrically connected to the terminal 4B13 of the subpackage 1B. The terminal 4B13 of the subpackage 1B is electrically connected to the terminal 5B13 of the subpackage 1B via the through electrode TB13 of the subpackage 1B. The terminal 5B13 of the subpackage 1B is electrically connected to the terminal 4B12 of the subpackage 1C. The terminal 4B12 of the subpackage 1C is electrically connected to the terminal 5B12 of the subpackage 1C via the through electrode TB12 of the subpackage 1C. The terminal 5B12 of the subpackage 1C is electrically connected to the terminal 4B11 of the subpackage 1D. The terminal 4B11 of the subpackage 1D is electrically connected to the terminal 5B11 of the subpackage 1D via the through electrode TB11 of the subpackage 1D.

As a result, an electrical path is formed through the terminal 4C1 of the subpackage 1A, the through electrode TC1 of the subpackage 1A, the terminal 5C1 of the subpackage 1A, the terminal 4B13 of the subpackage 1B, the through electrode TB13 of the subpackage 1B, the terminal 5B13 of the subpackage 1B, the terminal 4B12 of the subpackage 1C, the through electrode TB12 of the subpackage 1C, the terminal 5B12 of the subpackage 1C, the terminal 4B11 of the subpackage 1D, the through electrode TB11 of the subpackage 1D, and the terminal 5B11 of the subpackage 1D. This electrical path constitutes part of the signal line 93C1 shown in FIG. 11. The chip enable signal CE1 is supplied to the electrical path via the terminal 4C1 of the subpackage 1A or the terminal 5B11 of the subpackage 1D. Such an electrical path is electrically connected only to the memory chips MC1 and MC2, that is, the semiconductor chips 30 in the layer portions 10S1 and 10S2 of the subpackage 1A, among the semiconductor chips 30 in all of the layer portions 10 in the subpackages 1A to 1D. The reason is that, in the subpackage 1A, the electrical path runs through the chip connection through electrode TC1 which is electrically connected to the semiconductor chips 30 in the layer portions 10S1 and 10S2, while in the subpackages 1B to 1D, the electrical path runs through the bypass through electrodes TB13, TB12, and TB11. The electrical path can thus supply the chip enable signal CE1 to only the memory chips MC1 and MC2 among the memory chips MC1 to MC8.

Similarly, there are formed the following three electrical paths: one that can supply the chip enable signal CE2 to only the memory chips MC3 and MC4; one that can supply the chip enable signal CE3 to only the memory chips MC5 and MC6; and one that can supply the chip enable signal CE4 to only the memory chips MC7 and MC8.

In the composite layered chip package 1, an electrical path is also formed through the terminal 4C2 of the subpackage 1A, the through electrode TC2 of the subpackage 1A, the terminal 5C2 of the subpackage 1A, the terminal 4B23 of the subpackage 1B, the through electrode TB23 of the subpackage 1B, the terminal 5B23 of the subpackage 1B, the terminal 4B22 of the subpackage 1C, the through electrode TB22 of the subpackage 1C, the terminal 5B22 of the subpackage 1C, the terminal 4B21 of the subpackage 1D, the through electrode TB21 of the subpackage 1D, and the terminal 5B21 of the subpackage 1D. This electrical path constitutes part of the signal line 93R1 shown in FIG. 11. The electrical path is electrically connected only to the memory chip MC1, that is, the semiconductor chip 30 in the layer portion 10S1 of the subpackage 1A, among the semiconductor chips 30 in all of the layer portions 10 in the subpackages 1A to 1D. The electrical path can thus transmit the ready/busy signal of only the memory chip MC1 among the memory chips MC1 to MC8, and output the ready/busy signal from the terminal 4C2 of the subpackage 1A or the terminal 5B21 of the subpackage 1D.

Similarly, there are formed seven electrical paths that are each electrically connected to only a corresponding one of the memory chips MC2 to MC8 and can transmit and output the ready/busy signal of that memory chip alone.

According to the example described so far, the chip enable signals or ready/busy signals associated with the semiconductor chips 30 (memory chips) that fall on the same layers in the respective subpackages 1A to 1D of the same configuration can easily be made different between the subpackages 1A to 1D.

Now, a description will be given of remedies according to the present embodiment for coping with situations where at least one of the subpackages 1S in the composite layered chip package 1 includes the second-type layer portion 10B. In such cases, according to the present embodiment, an additional portion 51 is added to the plurality of subpackages 1S to form a composite layered chip package 1.

The additional portion 51 includes at least one additional semiconductor chip, and additional portion wiring. The additional portion wiring defines electrical connections between the at least one additional semiconductor chip and the plurality of first terminals 4 or second terminals 5 of any of the plurality of subpackages 1S so that the at least one additional semiconductor chip substitutes for the semiconductor chip 30 of the second-type layer portion 10B of at least one of the subpackages 1S.

Figure 6:
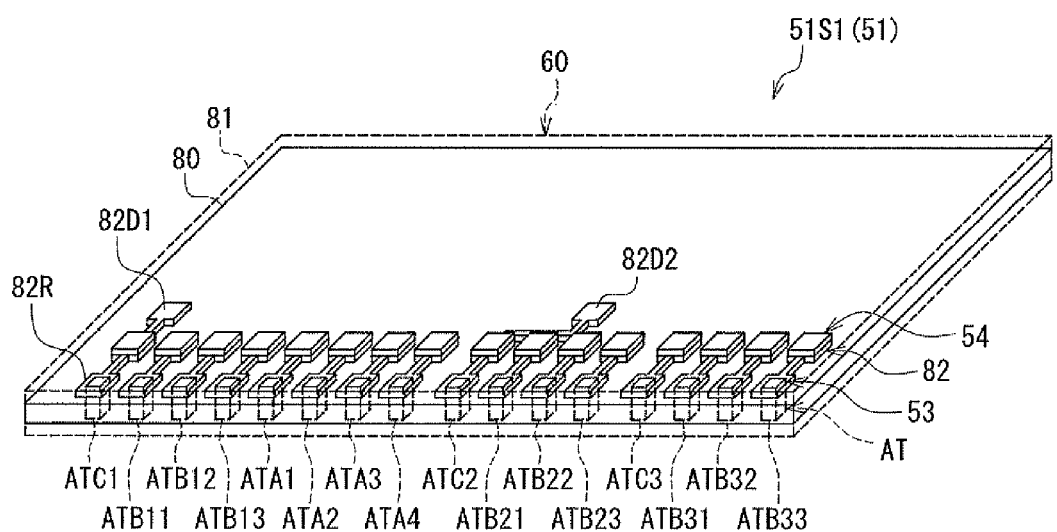
FIG. 6 is a perspective view showing a first example of an additional portion in the first embodiment of the invention.
Figure 7:
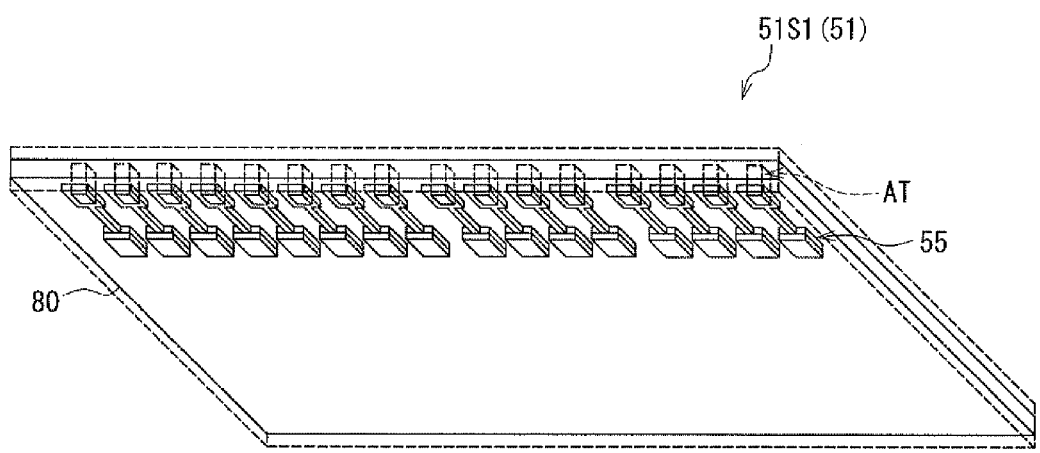
FIG. 7 is a perspective view showing the additional portion of FIG. 6 as viewed from below.
Figure 8:
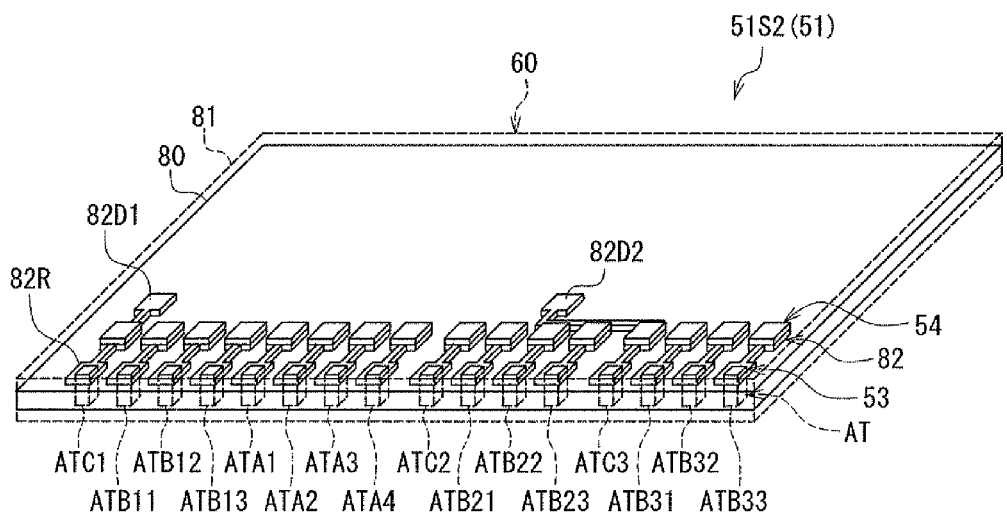
FIG. 8 is a perspective view showing a second example of the additional portion in the first embodiment of the invention.

First and second examples of the additional portion 51 will now be described with reference to FIG. 6 to FIG. 8. Hereinafter, the first example of the additional portion 51 will be designated by reference symbol 51S1, and the second example of the additional portion 51 will be designated by reference symbol 51S2. FIG. 6 is a perspective view of the additional portion 51S1. FIG. 7 is a perspective view showing the additional portion 51S1 of FIG. 6 as viewed from below. FIG. 8 is a perspective view of the additional portion 51S2.

Each of the additional portions 51S1 and 51S2 includes an additional portion main body 60 and additional portion wiring 53. The additional portion main body 60 has a top surface, a bottom surface, and four side surfaces. The additional portion main body 60 includes an additional semiconductor chip 80. The additional semiconductor chip 80 has the same configuration as that of a conforming semiconductor chip 30. The additional portion main body 60 corresponds to a single first-type layer portion 10A.

The additional portion wiring 53 includes: a plurality of through electrodes AT penetrating the additional semiconductor chip 80; a plurality of first additional portion terminals 54 disposed on the top surface of the additional portion main body 60 and electrically connected to the plurality of through electrodes AT; and a plurality of second additional portion terminals 55 disposed on the bottom surface of the additional portion main body 60 and electrically connected to the plurality of through electrodes AT. The shape and layout of the plurality of first additional portion terminals 54 are the same as those of the plurality of first terminals 4 shown in FIG. 2. The plurality of second additional portion terminals 55 are positioned to overlap the plurality of first additional portion terminals 54. The plurality of through electrodes AT electrically connect the first additional portion terminals 54 and the second additional portion terminals 55 that are positioned to overlap each other.

The additional portion main body 60 further includes an insulating portion 81 that covers the top and bottom surfaces of the additional semiconductor chip 80, and a plurality of electrodes 82 that are electrically connected to the plurality of through electrodes AT. The electrodes 82 have their respective ring-shaped portions 82R located closer to one of the side surfaces of the additional portion main body 60. None of the ring-shaped portions 82R are exposed in the side surface of the additional portion main body 60. The ring-shaped portions 82R have their respective openings. The ring-shaped portions 82R are electrically connected to the through electrodes AT. The plurality of first additional portion terminals 54 and the plurality of second additional portion terminals 55 are exposed from the insulating portion 81. In FIG. 6 to FIG. 8, the insulating portion 81 is shown by broken lines.

The plurality of electrodes 82 include a plurality of electrodes corresponding to the electrodes 32A1 to 32A4, 32B11 to 32B13, 32B21 to 32B23, 32B31 to 32B33, and 32C1 to 32C3 among the plurality of surface electrodes 32 shown in FIG. 4 and FIG. 5. Such electrodes each include a terminal component part that constitutes a first additional portion terminal 54, and a part that electrically connects the terminal component part to a through electrode AT. The plurality of electrodes 82 further include electrodes 82D1 and 82D2 corresponding to the electrodes 32D1 and 32D2. The plurality of first additional portion terminals 54 are formed by using the plurality of electrodes 82 except the electrodes 82D1 and 82D2. To be more specific, the terminal component parts of the plurality of electrodes 82 except the electrodes 82D1 and 82D2 form conductor pads. Conductor layers are formed on the conductor pads. The conductor pads and conductor layers constitute the first additional portion terminals 54. The plurality of electrodes 82 corresponding to the electrodes 32A1 to 32A4, and the electrodes 82D1 and 82D2 are in contact with and electrically connected to the additional semiconductor chip 80.

The plurality of through electrodes AT include through electrodes ATA1 to ATA4, ATB11 to ATB13, ATB21 to ATB23, ATB31 to ATB33, and ATC1 to ATC3 that correspond to the through electrodes TA1 to TA4, TB11 to TB13, TB21 to TB23, TB31 to TB33, and TC1 to TC3, respectively.

In the additional portion 51S1, as shown in FIG. 6 and FIG. 7, the electrode 82D1 is electrically connected to an electrode that is electrically connected to the through electrode ATC1. The electrode 82D1 of the additional portion 51S1 is thereby electrically connected to the through electrode ATC1. The electrode 82D2 of the additional portion 51S1 is electrically connected to an electrode that is electrically connected to the through electrode ATC2. The electrode 82D2 of the additional portion 51S1 is thereby electrically connected to the through electrode ATC2. The additional portion 51S1 has the same configuration and functions as those of the layer portion 10S1. The additional portion 51S1 is to substitute for the layer portion 10S1 when the layer portion 10S1 is the second-type layer portion 10B.

In the additional portion 51S2 shown in FIG. 8, the electrode 82D1 is electrically connected to an electrode that is electrically connected to the through electrode ATC1. The electrode 82D1 of the additional portion 51S2 is thereby electrically connected to the through electrode ATC1. The electrode 82D2 of the additional portion 51S2 is electrically connected to an electrode that is electrically connected to the through electrode ATC3. The electrode 82D2 of the additional portion 51S2 is thereby electrically connected to the through electrode ATC3. The additional portion 51S2 has the same configuration and functions as those of the layer portion 10S2. The additional portion 51S2 is to substitute for the layer portion 10S2 when the layer portion 10S2 is the second-type layer portion 10B.

Figure 9:
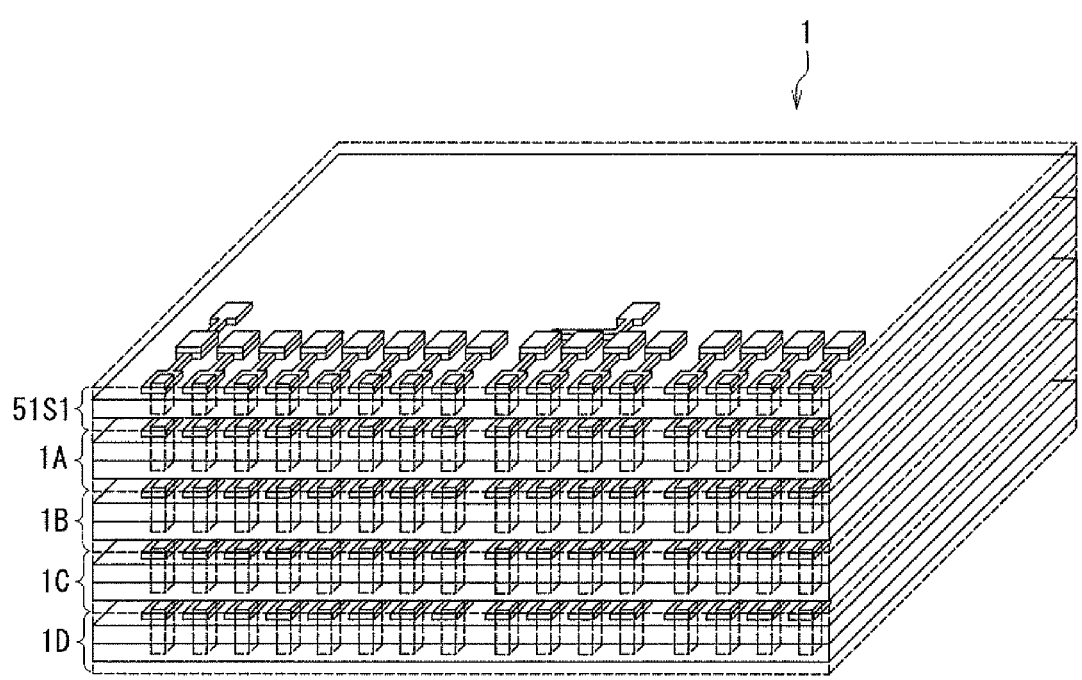
FIG. 9 is a perspective view showing a first example of the composite layered chip package including one additional portion in the first embodiment of the invention.
Figure 10:
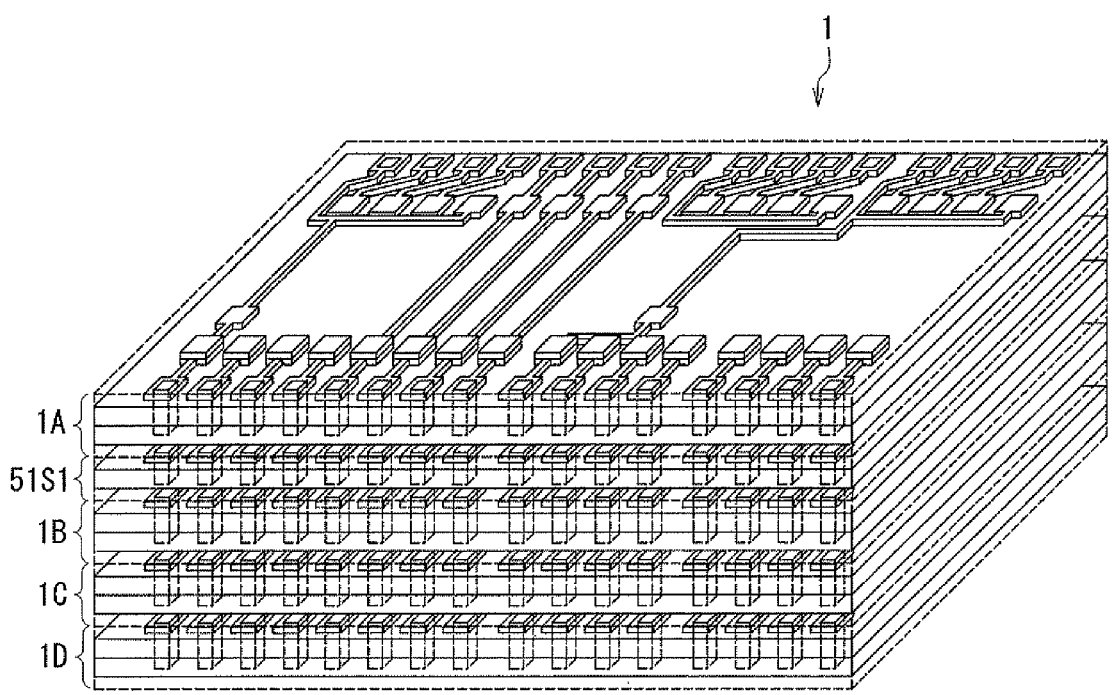
FIG. 10 is a perspective view showing a second example of the composite layered chip package including one additional portion in the first embodiment of the invention.

Now, with reference to FIG. 9 and FIG. 10, a specific description will be given of remedies using the additional portion 51 for coping with situations where at least one of the subpackages 1S in the composite layered chip package 1 includes the second-type layer portion 10B. FIG. 9 is a perspective view showing a first example of the composite layered chip package 1 including a single additional portion 51. FIG. 10 is a perspective view showing a second example of the composite layered chip package 1 including a single additional portion 51.

According to the present embodiment, in the second-type layer portion 10B, none of the plurality of surface electrodes 32 are electrically connected to the semiconductor chip 30. Consequently, the defective semiconductor chip 30 in the second-type layer portion 10B is electrically connected to none of the plurality of through electrodes T, and is thus disabled.

According to the present embodiment, if at least one of the subpackages 1S in the composite layered chip package 1 includes the second-type layer portion 10B, one or more additional portions 51 are added to form a composite layered chip package 1. Such a composite layered chip package 1 has the same functions as those of a composite layered chip package 1 that includes no defective semiconductor chip 30.

Suppose that in the composite layered chip package 1 shown in FIG. 1, the layer portion 10S1 of the subpackage 1A is the second-type layer portion 10B. In this case, as shown in FIG. 9, the additional portion 51S1 to substitute for the layer portion 10S1 is provided on the top of the subpackage 1A. Here, the plurality of second additional portion terminals 55 of the additional portion 51S1 are electrically connected to the plurality of first terminals 4 of the subpackage 1A. As with the layer portion 10S1 of the subpackage 1A, the electrodes 82D1 and 82D2 of the additional portion 51S1 are electrically connected to the through electrodes TC1 and TC2 of the subpackage 1A, respectively. If the layer portion 10S2 of the subpackage 1A is the second-type layer portion 10B, the additional portion 51S2 is provided on the top of the subpackage 1A, instead of the additional portion 51S1. When the layer portion 10S1 or 10S2 of the subpackage 1A is the second-type layer portion 10B, such a configuration is also possible that the additional portion 51S1 or 51S2 is provided on the bottom of the subpackage 1D.

Suppose that in the composite layered chip package 1 shown in FIG. 1, the layer portion 10S1 of the subpackage 1B is the second-type layer portion 10B. In this case, as shown in FIG. 10, the additional portion 51S1 to substitute for the layer portion 10S1 is provided on the top of the subpackage 1B, or in other words, between the subpackage 1A and the subpackage 1B. Here, the plurality of second additional portion terminals 55 of the additional portion 51S1 are electrically connected to the plurality of first terminals 4 of the subpackage 1B, and the plurality of first additional portion terminals 54 of the additional portion 51S1 are electrically connected to the plurality of second terminals 5 of the subpackage 1A. As with the layer portion 10S1 of the subpackage 1B, the electrodes 82D1 and 82D2 of the additional portion 51S1 are electrically connected to the through electrodes TC1 and TC2 of the subpackage 1B, respectively. If the layer portion 10S2 of the subpackage 1B is the second-type layer portion 10B, the additional portion 51S2 is provided on the top of the subpackage 1B, instead of the additional portion 51S1.

Similarly, if the layer portion 10S1 or 10S2 of the subpackage 1C is the second-type layer portion 10B, the additional portion 51S1 or 51S2 is provided on the top of the subpackage 1C. If the layer portion 10S1 or 10S2 of the subpackage 1D is the second-type layer portion 10B, the additional portion 51S1 or 51S2 is provided on the top of the subpackage 1D.

If the subpackages 1A to 1D include two or more second-type layer portions 10B, two or more additional portions 51 are added to form a composite layered chip package 1 in accordance with the principle described above.

In any of the composite layered chip packages 1 having the foregoing configurations, the additional semiconductor chip 80 in the additional portion 51 is electrically connected to the plurality of through electrodes T of the subpackages 1A to 1D via the additional portion wiring 53 so that the additional semiconductor chip 80 substitutes for a defective semiconductor chip 30.

Figure 12:
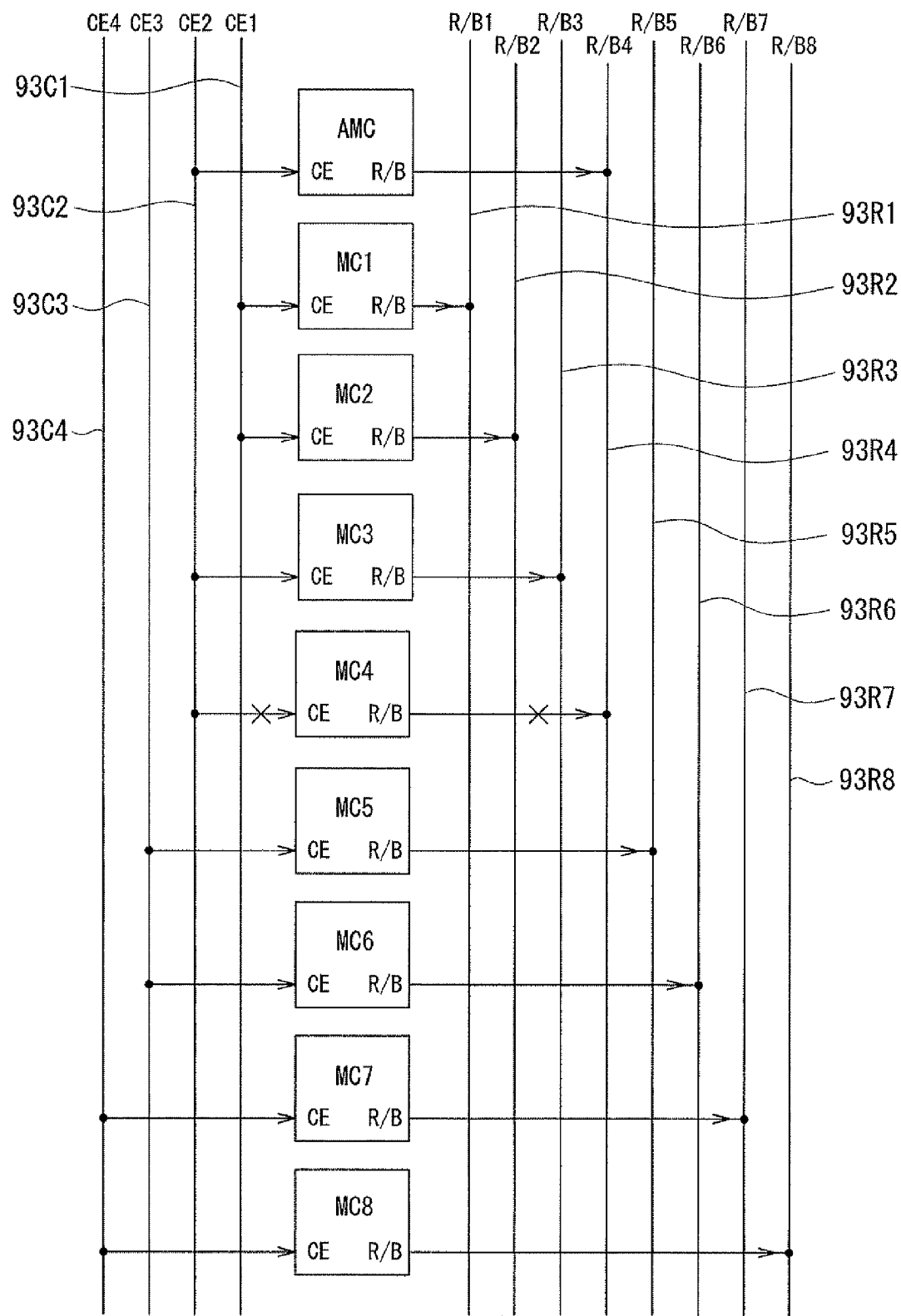
FIG. 12 is a block diagram showing a remedy for coping with situations where the memory device shown in FIG. 11 includes a defective semiconductor chip.

FIG. 11 shows a case where the composite layered chip package 1 includes no defective semiconductor chip 30 (memory chip). As one example, FIG. 12 shows a remedy for coping with the situation where the semiconductor chip 30 in the layer portion 10S2 of the subpackage 1B, i.e., the memory chip MC4, is defective. FIG. 12 shows the relationship between the plurality of memory chips and the signal lines 93C1 to 93C4 and 93R1 to 93R8.

The memory chip MC4 being defective, the plurality of electrodes in the layer portion 10S2 of the subpackage 1B are not electrically connected to the memory chip MC4. Consequently, the defective memory chip MC4 is electrically connected to none of the plurality of through electrodes T, and is thus disabled. In such a case, according to the present embodiment, the additional portion 51S2 to substitute for layer portion 10S2 is provided on the top of the subpackage 1B to form a composite layered chip package 1.

In FIG. 12, the symbol AMC represents the memory chip that is the additional semiconductor chip 80 of the additional portion 51S2. The memory chip AMC is electrically connected to the plurality of through electrodes T of the subpackage 1B via the additional portion wiring 53. In particular, the electrodes 82D1 and 82D2 of the additional portion 51S2 are electrically connected to the through electrodes TC1 and TC3 of the subpackage 1B, respectively, as with the layer portion 10S2 of the subpackage 1B. Consequently, as shown in FIG. 12, the electrode pads CE and R/B of the memory chip AMC are electrically connected to the signal lines 93C2 and 93R4, respectively. The composite layered chip package 1 therefore has the same functions as those of a composite layered chip package 1 that includes no defective semiconductor chip 30 (memory chip).

Figure 13:
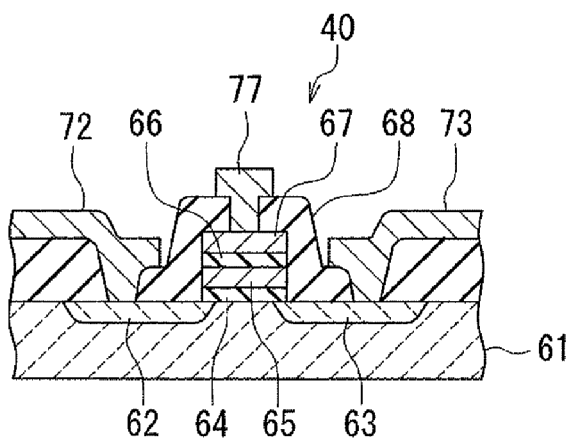
FIG. 13 is a cross-sectional view showing an example of a memory cell included in the semiconductor chip.

Reference is now made to FIG. 13 to describe an example of the configuration of the memory cells included in the semiconductor chip 30 (memory chip). The memory cell 40 shown in FIG. 13 includes a source 62 and a drain 63 formed near a surface of a P-type silicon substrate 61. The source 62 and the drain 63 are both N-type regions. The source 62 and the drain 63 are disposed at a predetermined distance from each other so that a channel composed of a part of the P-type silicon substrate 61 is provided between the source 62 and the drain 63. The memory cell 40 further includes an insulating film 64, a floating gate 65, an insulating film 66, and a control gate 67 that are stacked in this order on the surface of the substrate 61 at the location between the source 62 and the drain 63. The memory cell 40 further includes an insulating layer 68 that covers the source 62, the drain 63, the insulating film 64, the floating gate 65, the insulating film 66 and the control gate 67. The insulating layer 68 has contact holes that open in the tops of the source 62, the drain 63 and the control gate 67, respectively. The memory cell 40 includes a source electrode 72, a drain electrode 73, and a control gate electrode 77 that are formed on the insulating layer 68 at locations above the source 62, the drain 63 and the control gate 67, respectively. The source electrode 72, the drain electrode 73 and the control gate electrode 77 are connected to the source 62, the drain 63 and the control gate 67, respectively, through the corresponding contact holes.

A description will now be given of a method of manufacturing the layered chip package and a method of manufacturing the composite layered chip package 1 according to the present embodiment. The method of manufacturing the composite layered chip package 1 according to the embodiment includes the steps of fabricating a plurality of subpackages 1S; and stacking the plurality of subpackages 1S and, for any two vertically adjacent subpackages 1S, electrically connecting the plurality of second terminals 5 of the upper subpackage 1S to the plurality of first terminals 4 of the lower subpackage 1S. The method of manufacturing the layered chip package according to the embodiment is a method by which a plurality of layered chip packages or a plurality of subpackages 1S are manufactured.

The step of fabricating the plurality of subpackages 1S includes, as a series of steps for forming each subpackage 1S, the steps of: fabricating a layered substructure by stacking two substructures each of which includes an array of a plurality of preliminary layer portions, each of the preliminary layer portions being intended to become one of the first and second layer portions 10S1 and 10S2, the substructures being intended to be cut later at positions of boundaries between every adjacent ones of the preliminary layer portions; and cutting the layered substructure so that the plurality of subpackages 1S are formed. As will be detailed later, the layered substructure includes an array of a plurality of pre-separation main bodies that are to be separated from each other later into individual main bodies 2.

The step of fabricating the layered substructure includes the steps of: fabricating an initial layered substructure that is to later become the layered substructure by being provided with a plurality of holes for the plurality of through electrodes T to be accommodated in and the plurality of through electrodes T; forming the plurality of holes in the initial layered substructure; and forming the plurality of through electrodes T in the plurality of holes.

Figure 14:
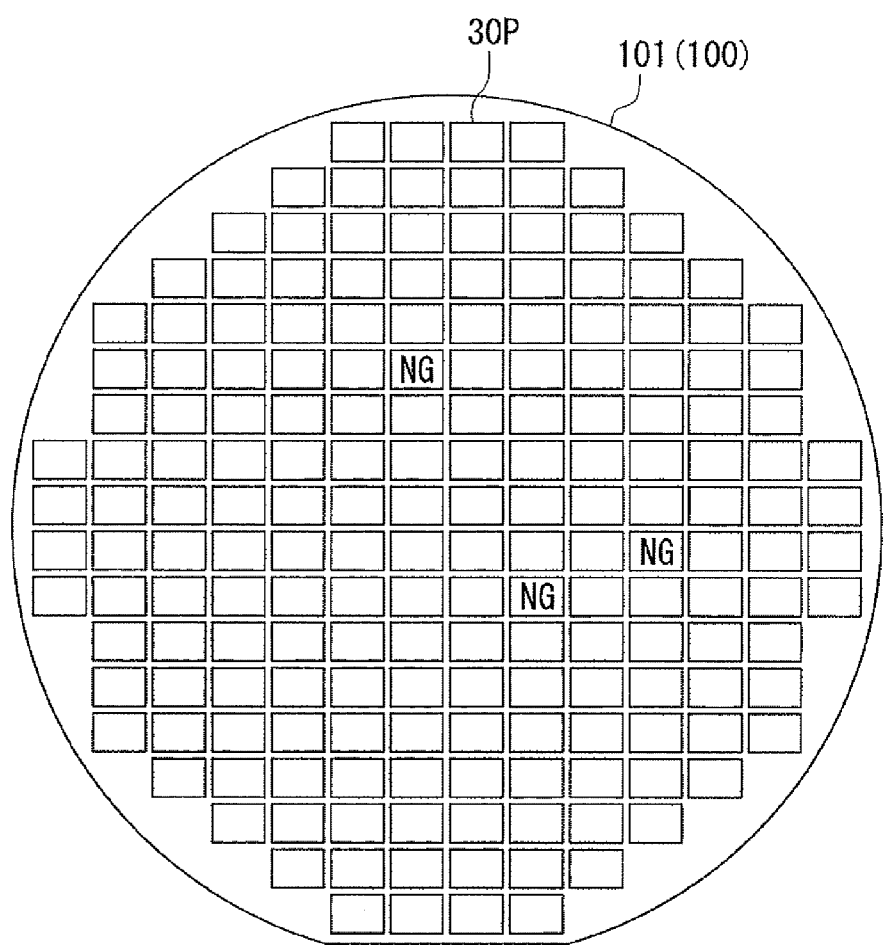
FIG. 14 is a plan view showing a pre-substructure wafer fabricated in a step of a method of manufacturing the composite layered chip package according to the first embodiment of the invention.
Figure 15:
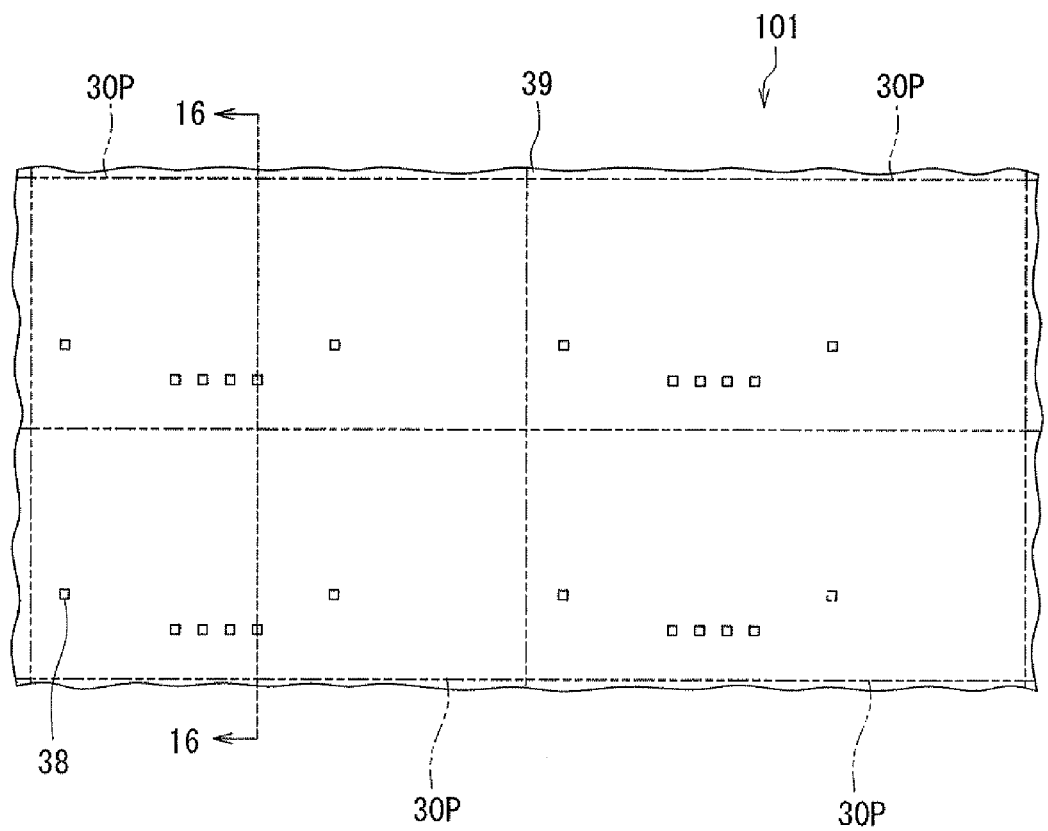
FIG. 15 is a magnified plan view of a part of the pre-substructure wafer shown in FIG. 14.
Figure 16:
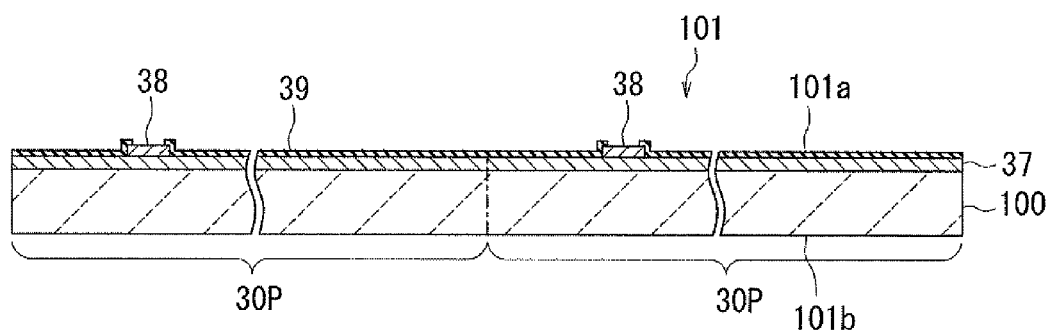
FIG. 16 shows a cross section taken along line 16-16 of FIG. 15.

The step of fabricating the initial layered substructure will now be described in detail with reference to FIG. 14 to FIG. 27. In the step of fabricating the initial layered substructure, a pre-substructure wafer 101 is initially fabricated. The pre-substructure wafer 101 includes an array of a plurality of pre-semiconductor-chip portions 30P that are intended to become individual semiconductor chips 30. FIG. 14 is a plan view of the pre-substructure wafer 101. FIG. 15 is a magnified plan view of a part of the pre-substructure wafer 101 shown in FIG. 14. FIG. 16 shows a cross section taken along line 16-16 of FIG. 15.

Specifically, in the step of fabricating the pre-substructure wafer 101, a semiconductor wafer 100 having two mutually opposite surfaces is subjected to processing, such as a wafer process, at one of the two surfaces. This forms the pre-substructure wafer 101 including an array of a plurality of pre-semiconductor-chip portions 30P, each of the pre-semiconductor-chip portions 30P including a device. In the pre-substructure wafer 101, the plurality of pre-semiconductor-chip portions 30P may be in a row, or in a plurality of rows such that a number of pre-semiconductor-chip portions 30P are arranged both in vertical and horizontal directions. In the following description, assume that the plurality of pre-semiconductor-chip portions 30P in the pre-substructure wafer 101 are in a plurality of rows such that a number of pre-semiconductor-chip portions 30P are arranged both in vertical and horizontal directions. The semiconductor wafer 100 may be a silicon wafer, for example. The wafer process is a process in which a semiconductor wafer is processed into a plurality of devices that are not yet separated into a plurality of chips. For ease of understanding, FIG. 14 depicts the pre-semiconductor-chip portions 30P larger relative to the semiconductor wafer 100. For example, if the semiconductor wafer 100 is a 12-inch wafer and the top surface of each pre-semiconductor-chip portion 30 is 8 to 10 mm long at each side, then 700 to 900 pre-semiconductor-chip portions 30P are obtainable from a single semiconductor wafer 100.

As shown in FIG. 16, the pre-semiconductor-chip portions 30P include a device-forming region 37 that is formed near one of the surfaces of the semiconductor wafer 100. The device-forming region 37 is a region where devices are formed by processing the one of the surfaces of the semiconductor wafer 100. The pre-semiconductor-chip portions 30P further include a plurality of electrode pads 38 disposed on the device-forming region 37, and a passivation film 39 disposed on the device-forming region 37. The passivation film 39 is made of an insulating material such as phospho-silicate-glass (PSG), silicon nitride, or polyimide resin. The passivation film 39 has a plurality of openings for exposing the top surfaces of the plurality of electrode pads 38. The plurality of electrode pads 38 are located in the positions corresponding to the plurality of surface electrodes 32 to be formed later, and are electrically connected to the devices formed in the device-forming region 37. Hereinafter, the surface of the pre-substructure wafer 101 located closer to the plurality of electrode pads 38 and the passivation film 39 will be referred to as a first surface 101a, and the opposite surface will be referred to as a second surface 101b.

In the step of fabricating the initial layered substructure, next, a wafer sort test is performed to distinguish the plurality of pre-semiconductor-chip portions 30P included in the pre-substructure wafer 101 into normally functioning pre-semiconductor-chip portions and malfunctioning pre-semiconductor-chip portions. In this step, a probe of a testing device is brought into contact with the plurality of electrode pads 38 of each pre-semiconductor-chip portion 30P so that whether the pre-semiconductor-chip portion 30P functions normally or not is tested with the testing device. In FIG. 14, the pre-semiconductor-chip portions 30P marked with "NG" are malfunctioning ones, and the other pre-semiconductor-chip portions 30P are normally functioning ones. This step provides location information on the normally functioning pre-semiconductor-chip portions 30P and the malfunctioning pre-semiconductor-chip portions 30P in each pre-substructure wafer 101. The location information is used in a step to be performed later. The passivation film 39 may be formed after the wafer sort test, and may thus be yet to be formed at the time of performing the wafer sort test.

Figure 17:
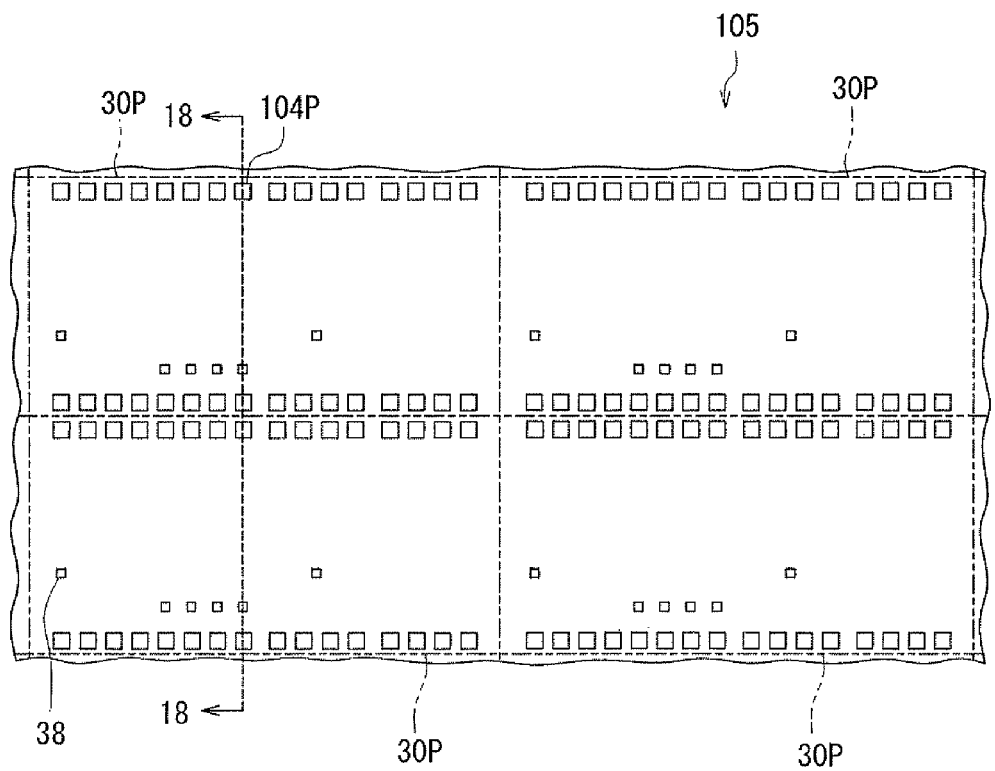
FIG. 17 is a plan view showing a step that follows the step shown in FIG. 15.
Figure 18:
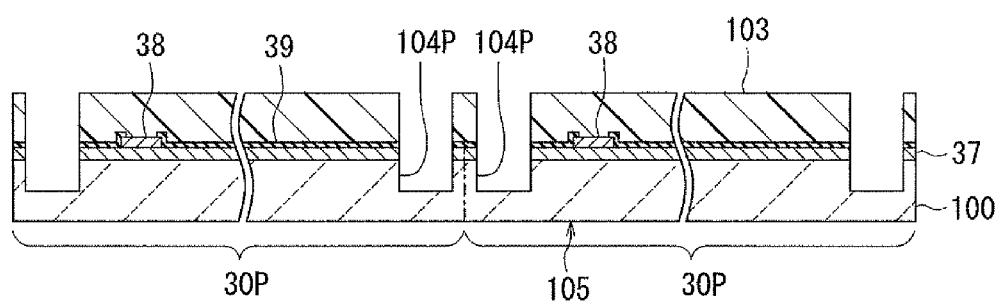
FIG. 18 shows a cross section taken along line 18-18 of FIG. 17.

FIG. 17 is a plan view showing a step that follows the step shown in FIG. 15. FIG. 18 shows a cross section taken along line 18-18 of FIG. 17. In this step, first, an etching mask 103 is formed on the first surface 101a of the pre-substructure wafer 101. The etching mask 103 has a plurality of openings formed at positions where the ring-shaped portions 32R1 and 32R2 of the plurality of surface electrodes are to be formed later. The etching mask 103 is formed by patterning a photoresist by photolithography, for example. Next, the pre-substructure wafer 101 is etched by using the etching mask 103 to form a plurality of grooves 104P in the pre-substructure wafer 101. The plurality of grooves 104P open in the first surface 101a. Note that the etching mask 103 is not shown in FIG. 17. The grooves 104P are formed such that their bottoms do not reach the second surface 101b of the pre-substructure wafer 101. The grooves 104P have a depth in the range of 20 to 80 μm, for example. In a cross section parallel to the first surface 101a of the pre-substructure wafer 101, the grooves 104P are larger than the through electrodes T to be formed later. The grooves 104P are formed by, for example, wet etching using KOH as the etchant, or reactive ion etching using a $Cl_2$-based etching gas. A pre-polishing substructure main body 105 is thus formed by the pre-substructure wafer 101 with the plurality of grooves 104P formed therein.

Figure 19:
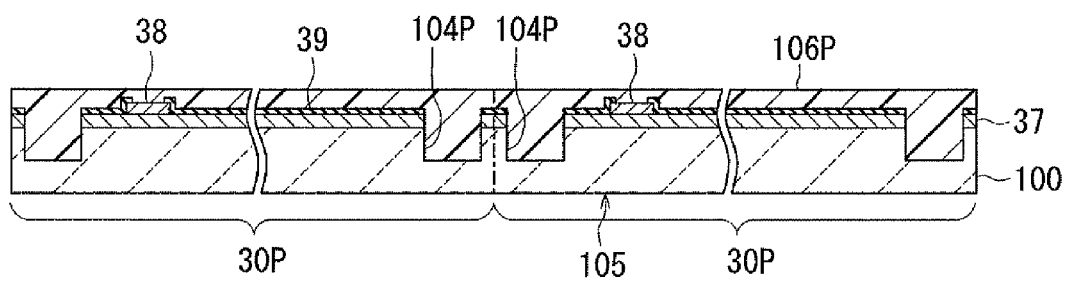
FIG. 19 is a cross-sectional view showing a step that follows the step shown in FIG. 18.

FIG. 19 shows a step that follows the step shown in FIG. 18. In this step, an insulating film 106P is formed to fill the plurality of grooves 104P of the pre-polishing substructure main body 105 and to cover the plurality of electrode pads 38 and the passivation film 39. The insulating film 106P is to become a part of the insulating portion 31 later. The insulating film 106P may be formed of a resin such as an epoxy resin or a polyimide resin. The insulating film 106P may also be formed of a photosensitive material such as a sensitizer-containing polyimide resin. The insulating film 106P may also be formed of an inorganic material such as silicon oxide or silicon nitride.

The insulating film 106P is preferably formed of a resin having a low thermal expansion coefficient. If the insulating film 106P is formed of a resin having a low thermal expansion coefficient, it becomes easy to cut the insulating film 106P when it is cut later with a dicing saw.

The insulating film 106P may include a first layer that fills the plurality of grooves 104P, and a second layer that covers the first layer, the plurality of electrode pads 38 and the passivation film 39. In such a case, the first layer and the second layer may be formed of the same material or different materials. The first layer is preferably formed of a resin having a low thermal expansion coefficient. The second layer may be formed of a photosensitive material such as a sensitizer-containing polyimide resin. The first layer may be flattened at the top by, for example, ashing or chemical mechanical polishing (CMP), before forming the second layer on the first layer.

If the passivation film 39 is not formed by the time of performing the wafer sort test, the second layer of the insulating film 106P may be used as the passivation film. In such a case, the second layer may be formed of an inorganic material such as silicon oxide or silicon nitride. If the second layer of the insulating film 106P is to be used as the passivation film, the plurality of openings for exposing the top surfaces of the plurality of electrode pads 38 are not formed in the second layer as initially formed.

Figure 20:
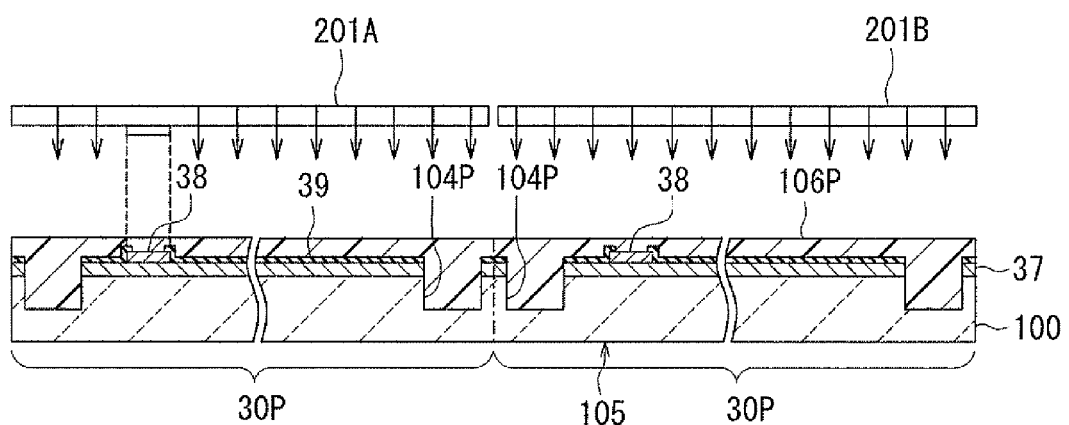
FIG. 20 is a cross-sectional view showing a step that follows the step shown in FIG. 19.
Figure 21:
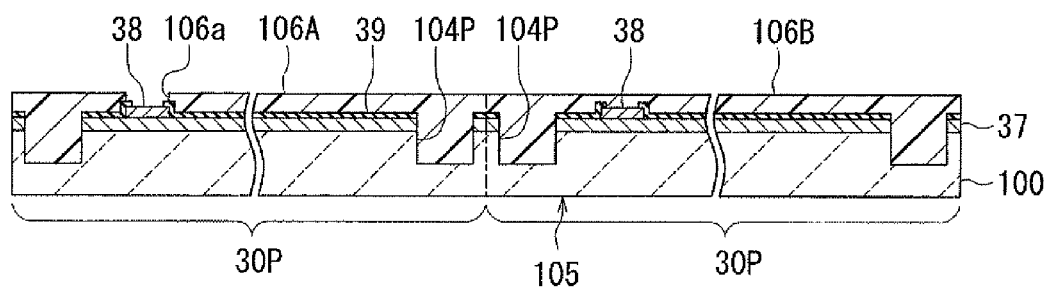
FIG. 21 is a cross-sectional view showing a step that follows the step shown in FIG. 20.

Reference is now made to FIG. 20 and FIG. 21 to describe the step of forming the plurality of openings for exposing the plurality of electrode pads 38 in the insulating film 106P in the normally functioning pre-semiconductor-chip portions 30P. FIG. 20 shows a step that follows the step shown in FIG. 19. FIG. 21 shows a step that follows the step shown in FIG. 20.

Here, a description will initially be given of a case where either the entire insulating film 106P or the second layer of the insulating film 106P is formed of a negative photosensitive material and photolithography is employed to form the openings in the insulating film 106P. In this case, all the pre-semiconductor-chip portions 30P are simultaneously subjected to the exposure of the insulating film 106P by using a mask 201A shown in FIG. 20. The mask 201A has such a pattern that the areas of the insulating film 106P where to form the openings are not irradiated with light while the other areas are irradiated with light. The non-irradiated areas of the insulating film 106P are soluble in a developing solution, and the irradiated areas become insoluble in the developing solution.

Next, using a stepping projection exposure apparatus, or a so-called stepper, the insulating film 106P is selectively exposed in the malfunctioning pre-semiconductor-chip portions 30P only, using a mask 201B shown in FIG. 20. This exposure process uses the location information on the normally functioning pre-semiconductor-chip portions 30P and the malfunctioning pre-semiconductor-chip portions 30P in each pre-substructure wafer 101 which was obtained by the wafer sort test. In FIG. 20, the pre-semiconductor-chip portion 30P on the left is a normally functioning one, whereas the pre-semiconductor-chip portion 30P on the right is a malfunctioning one. The mask 201B entirely transmits light. As a result of this exposure process, the entire insulating film 106P in the malfunctioning pre-semiconductor-chip portions 30P becomes insoluble in the developing solution.

Next, the insulating film 106P is developed with the developing solution. As a result, as shown in FIG. 21, a plurality of openings 106a for exposing the plurality of electrode pads 38 are formed in the insulating film 106P in the normally functioning pre-semiconductor-chip portion 30P (the left side). On the other hand, no openings 106P are formed in the insulating film 106P in the malfunctioning pre-semiconductor-chip portion 30P (the right side). After the development, the area of the insulating film 106P corresponding to the normally functioning pre-semiconductor-chip portion 30P becomes a first-type insulating layer 106A, and the area corresponding to the malfunctioning pre-semiconductor-chip portion 30P becomes a second-type insulating layer 106B. The first-type insulating layer 106A has the plurality of openings 106a for exposing the plurality of electrode pads 38 and surrounds the plurality of electrode pads 38. The second-type insulating layer 106B covers the plurality of electrode pads 38 so as to avoid exposure.

Now, an example of the method for forming the plurality of openings 106a in the insulating film 106P will be described for the case where either the entire insulating film 106P or the second layer of the insulating film 106P is formed of a non-photosensitive material. In the example, a negative photoresist layer is initially formed on the insulating film 106P. The photoresist layer is then exposed and developed by the same method as with the exposure and development of the foregoing insulating film 106P. Consequently, in the normally functioning pre-semiconductor-chip portions 30P, a plurality of openings are formed in the photoresist layer at positions corresponding to the plurality of electrode pads 38. Meanwhile, no opening is formed in the photoresist layer in the malfunctioning pre-semiconductor-chip portions 30P. Next, the insulating film 106P is selectively etched by using the photoresist layer as the etching mask, whereby the plurality of openings 106a are formed in the insulating film 106P. The photoresist layer may be subsequently removed, or may be left and used as part of the insulating layers 106A and 106B.

Figure 22:
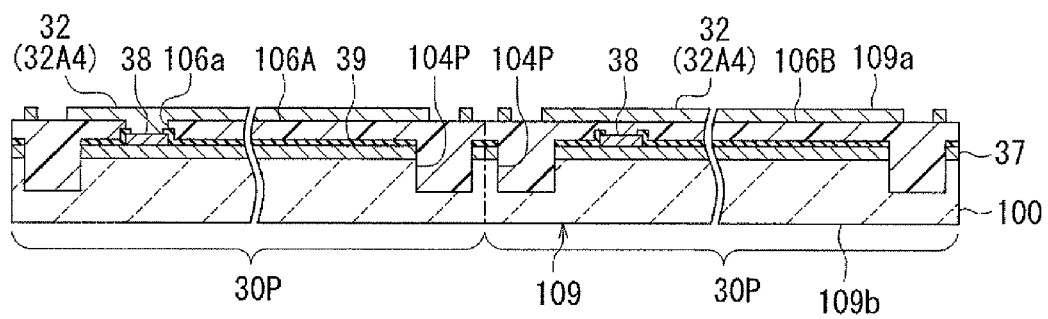
FIG. 22 is a cross-sectional view showing a step that follows the step shown in FIG. 21.
Figure 23:
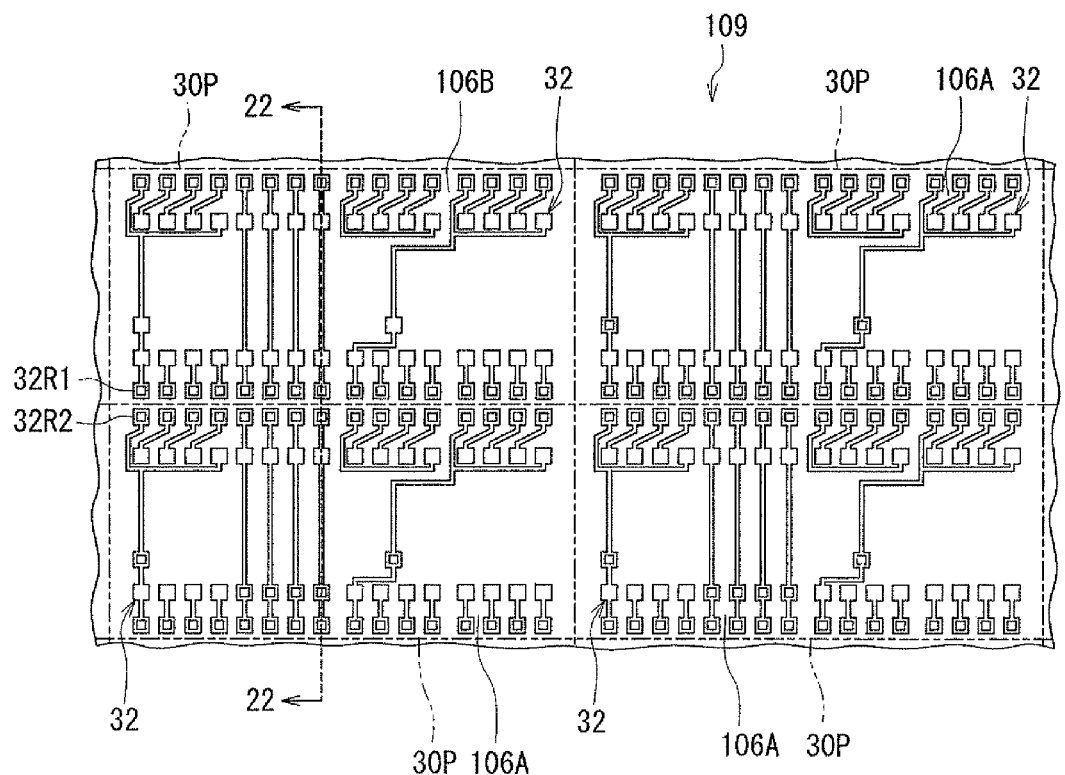
FIG. 23 is a plan view showing the step of FIG. 22.

FIG. 22 and FIG. 23 show a step that follows the step shown in FIG. 21. In this step, the plurality of surface electrodes 32 are formed on the insulating layers 106A and 106B by plating, for example. FIG. 22 shows the electrode 32A4. In each of the normally functioning pre-semiconductor-chip portions 30P, the surface electrodes 32 that are to become the first-type and sixth-type electrodes are brought into contact with and electrically connected to the respective corresponding electrode pads 38 through the plurality of openings 106a of the insulating layer 106A. In each of the normally functioning pre-semiconductor-chip portions 30P, the surface electrodes 32 that are to become the electrodes other than the first-type and sixth-type electrodes later are in non-contact with the pre-semiconductor-chip portion 30P. In each of the malfunctioning pre-semiconductor-chip portions 30P, on the other hand, none of the surface electrodes 32 are in contact with the pre-semiconductor-chip portion 30P since no openings 106a are formed in the insulating layer 106B.

In this way, there is fabricated a pre-polishing substructure 109 shown in FIG. 22 and FIG. 23. The pre-polishing substructure 109 has a first surface 109a corresponding to the first surface 101a of the pre-substructure wafer 101, and a second surface 109b corresponding to the second surface 101b of the pre-substructure wafer 101.

The surface electrodes 32 are formed of a conductive material such as Cu. In the case of forming the surface electrodes 32 by plating, a seed layer for plating is initially formed. Next, a photoresist layer is formed on the seed layer. The photoresist layer is then patterned by photolithography to form a frame that has a plurality of openings in which the surface electrodes 32 are to be accommodated later. Next, plating layers that are intended to constitute respective portions of the surface electrodes 32 are formed by plating on the seed layer in the openings of the frame. The plating layers have a thickness in the range of 5 to 15 μm, for example. Next, the frame is removed, and portions of the seed layer other than those lying under the plating layers are also removed by etching. The plating layers and the remaining portions of the seed layer under the plating layers thus form the surface electrodes 32.

As shown in FIG. 23, the plurality of surface electrodes 32 include the respective ring-shaped portions 32R1 that are disposed near a side of the top surface of the pre-semiconductor-chip portion 30P corresponding to the side surface 30c of the semiconductor chip 30. The plurality of surface electrodes 32 further include the respective ring-shaped portions 32R2 that are disposed near a side of the top surface of the pre-semiconductor-chip portion 30P corresponding to the side surface 30d of the semiconductor chip 30. The ring-shaped portions 32R1 and 32R2 are located above the plurality of grooves 104P.

Figure 24:
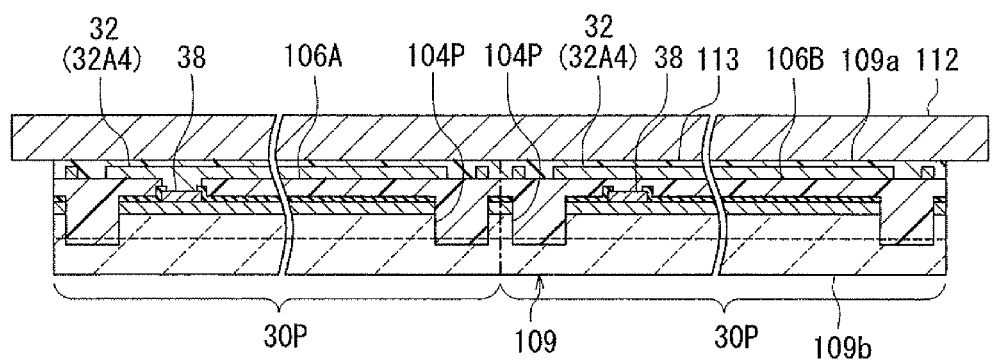
FIG. 24 is a cross-sectional view showing a step that follows the step shown in FIG. 22.

FIG. 24 shows a step that follows the step shown in FIG. 22. In this step, using an insulating adhesive, the pre-polishing substructure 109 is bonded to a plate-shaped jig 112 shown in FIG. 24, with the first surface 109a of the pre-polishing substructure 109 arranged to face a surface of the jig 112. In FIG. 24, the reference numeral 113 indicates an insulating layer formed by the adhesive. The insulating layer 113 is to become a part of the insulating portion 31 later. The plurality of surface electrodes 32 are covered by the insulating layer 113. The insulating layer 113 may be formed of a photosensitive adhesive.

Figure 25:
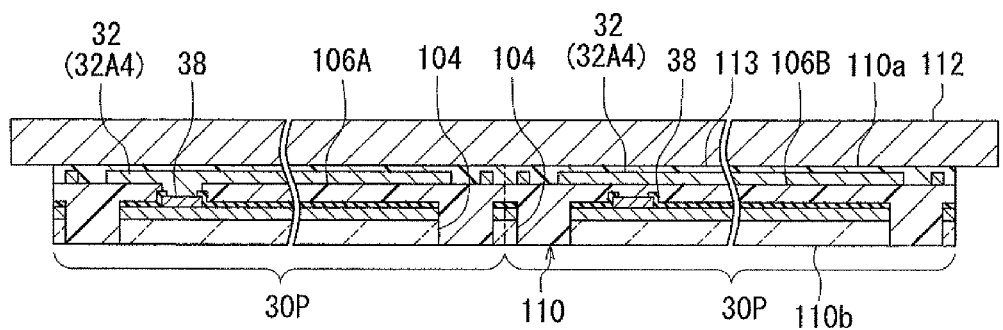
FIG. 25 is a cross-sectional view showing a step that follows the step shown in FIG. 24.

FIG. 25 shows a step that follows the step shown in FIG. 24. In this step, the second surface 109b of the pre-polishing substructure 109 bonded to the jig 112 is polished. The polishing is performed until the plurality of grooves 104P are exposed. The broken line in FIG. 24 indicates the level of the second surface 109b after the polishing. By polishing the second surface 109b of the pre-polishing substructure 109, the pre-polishing substructure 109 is thinned. Consequently, there is formed a substructure 110 in the state of being bonded to the jig 112. The substructure 110 has a thickness of 20 to 80 μm, for example. The substructure 110 has a first surface 110a corresponding to the first surface 109a of the pre-polishing substructure 109, and a second surface 110b opposite to the first surface 110a. The second surface 110b is the polished surface. As a result of polishing the second surface 109b of the pre-polishing substructure 109 until the plurality of grooves 104P are exposed, the plurality of grooves 104P become a plurality of insulator fill holes 104. The insulator fill holes 104 are filled with an insulator that constitutes part of the insulating layer 106A or 106B.

Figure 26:
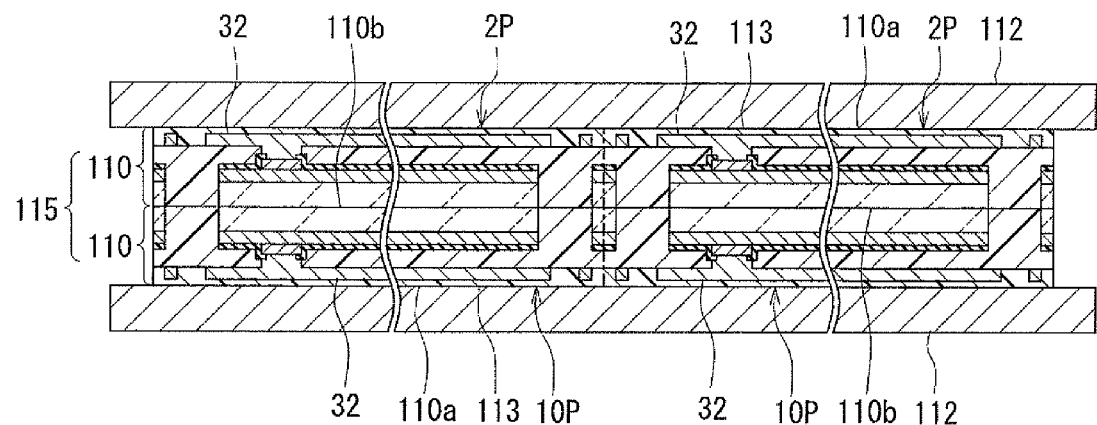
FIG. 26 is a cross-sectional view showing a step that follows the step shown in FIG. 25.
Figure 27:
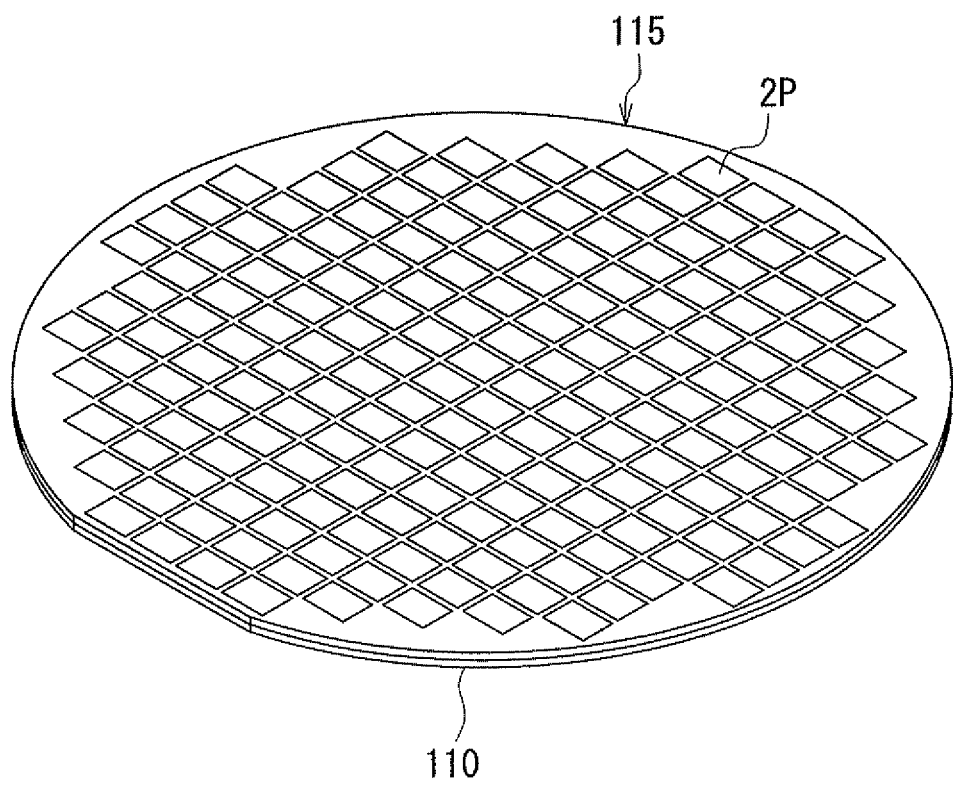
FIG. 27 is a perspective view showing an initial layered substructure fabricated in the step of FIG. 26.

FIG. 26 shows a step that follows the step shown in FIG. 25. In this step, two substructures 110 bonded to the respective jigs 112 are bonded to each other with an insulating adhesive, with the respective second surfaces 110b arranged to face each other. An initial layered substructure 115 is thereby fabricated which includes the two stacked substructures 110. At this time, the two substructures 110 are aligned with each other so that the plurality of ring-shaped portions 32R1 of one of the substructures 110 overlap the plurality of ring-shaped portions 32R2 of the other of the substructures 110 as seen in a direction perpendicular to the first surface 110a. Next, the two jigs 112 are removed from the initial layered substructures 115. FIG. 27 is a perspective view of the initial layered substructures 115 after the removal of the jigs 112. Each of the substructures 110 includes an array of a plurality of preliminary layer portions 10P each of which is to become one of the first and second layer portions 10S1 and 10S2. The substructures 110 are to be cut later at positions of boundaries between every adjacent ones of the preliminary layer portions 10P. The initial layered substructure 115 includes an array of a plurality of pre-separation main bodies 2P that are to be separated from each other into individual main bodies 2 later. Each single pre-separation main body 2P includes two preliminary layer portions 10P.

Now, the process for forming a plurality of subpackages 1S by using the initial layered substructure 115 will be described in detail with reference to FIG. 28 to FIG. 35.

Figure 28:
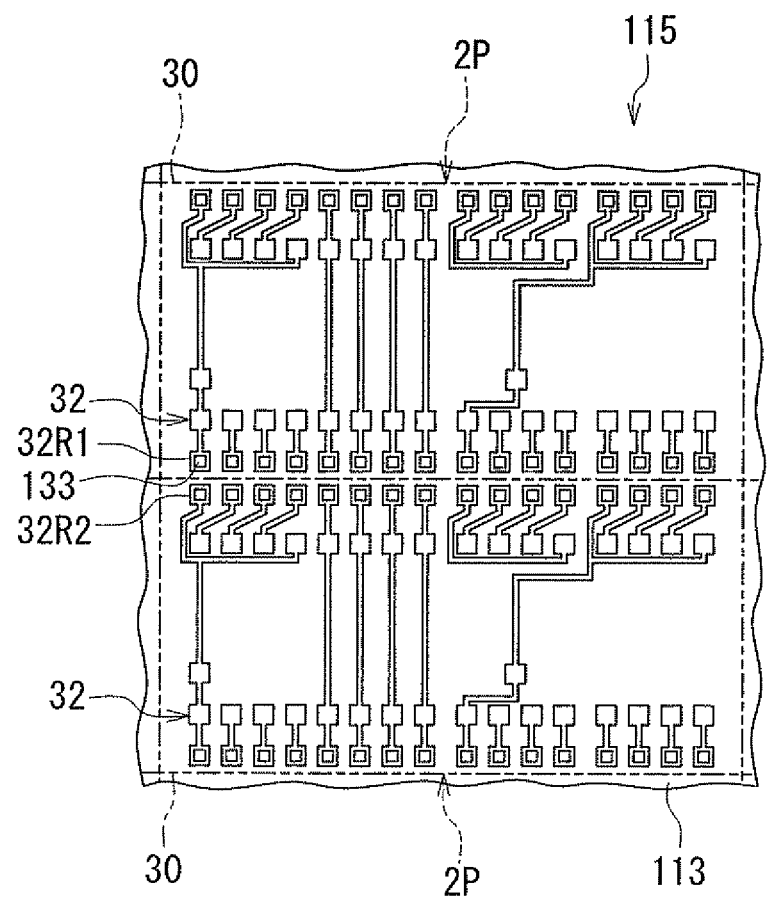
FIG. 28 is a plan view showing a part of the initial layered substructure in a step that follows the step shown in FIG. 26.
Figure 29:
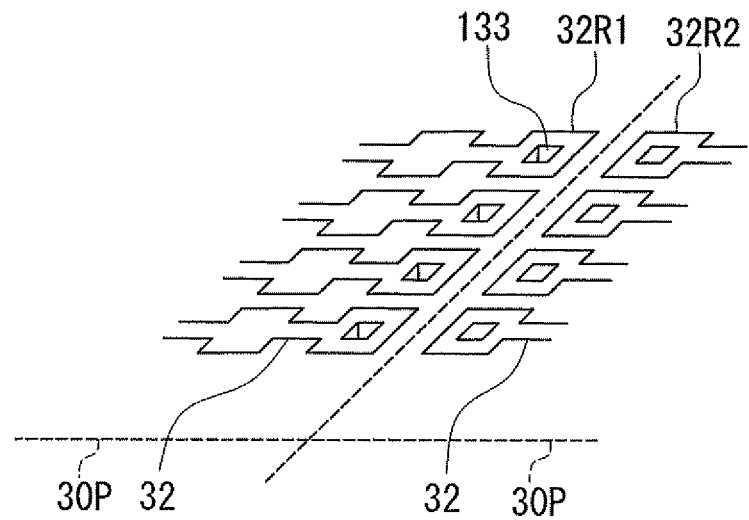
FIG. 29 is a perspective view of a part of the initial layered substructure shown in FIG. 28.
Figure 30:
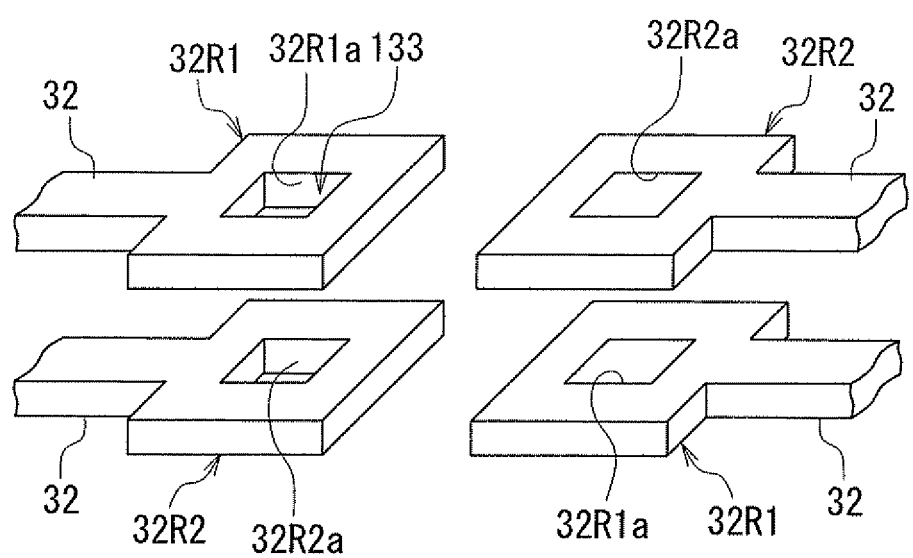
FIG. 30 is a perspective view showing ring-shaped portions of a plurality of surface electrodes in the initial layered substructure shown in FIG. 28.

First, reference is made to FIG. 28 to FIG. 30 to describe the step of forming a plurality of holes in the initial layered substructure 115. FIG. 28 to FIG. 30 show a step that follows the step shown in FIG. 26. In this step, a plurality of holes 133 for accommodating the plurality of through electrodes T are formed in the initial layered substructure 115. FIG. 28 is a plan view showing a part of the initial layered substructure 115. FIG. 29 is a perspective view of a part of the initial layered substructure 115. FIG. 30 is a perspective view showing the plurality of surface electrodes 32 of the initial layered substructure 115. For ease of understanding, FIG. 28 and FIG. 29 omit the part of the insulating layer 113 covering the top surfaces of the plurality of surface electrodes 32.

Now, with reference to FIG. 29 and FIG. 30, a detailed description will be given of the plurality of surface electrodes 32 and the plurality of holes 133 of the initial layered substructure 115. The ring-shaped portions 32R1 and 32R2 of the surface electrodes 32 have their respective openings 32R1*a* and 32R2*a*. Here, of the two substructures 110 in the initial layered substructure 115, the upper substructure 110 includes a plurality of preliminary layer portions 10P that are to become a plurality of first layer portions 10S1, while the lower substructure 110 includes a plurality of preliminary layer portions 10P that are to become a plurality of second layer portions 10S2. As shown in FIG. 30, the plurality of ring-shaped portions 32R2 of the lower substructure 110 are located under the plurality of ring-shaped portions 32R1 of the upper substructure 110, whereas the plurality of ring-shaped portions 32R1 of the lower substructure 110 are located under the plurality of ring-shaped portions 32R2 of the upper substructure 110. The plurality of holes 133 are formed to penetrate the respective openings 32R1*a* of the plurality of ring-shaped portions 32R1 of the upper substructure 110 and the respective openings 32R2*a* of the plurality of ring-shaped portions 32R2 of the lower substructure 110 located thereunder. The plurality of holes 133 are formed to also penetrate the insulator in the insulator fill holes 104 of the two substructures 110. No holes 133 are formed in the positions of the plurality of openings 32R2*a* of the plurality of ring-shaped portions 32R2 of the upper substructure 110 or the positions of the plurality of openings 32R1*a* of the plurality of ring-shaped portions 32R1 of the lower substructure 110 located thereunder.

The holes 133 are the same in diameter as the openings 32R1*a* and 32R2*a*, and are smaller in diameter than the insulator fill holes 104. Therefore, when the holes 133 have been formed, the inner walls of the ring-shaped portions 32R1 and 32R2 to define the openings 32R1*a* and 32R2*a* are exposed in the wall faces of the holes 133. Further, in the insulator fill holes 104, the insulator remains around the holes 133.

The plurality of holes 133 are formed in the insulating layers 106A, 106B, and 113 of the two substructures 110. For example, laser processing or reactive ion etching may be employed to form the holes 133. If the insulating layers 106A, 106B, and 113 are made of resin, the holes 133 can be formed easily in a short time by laser processing or reactive ion etching. If the insulating layers 106A, 106B, and 113 are made of a photosensitive material, photolithography may be employed to form the holes 133 in the insulating layers 106A, 106B, and 113 of the two substructures 110. In this case, in order to prevent the insulating film 106P from being exposed and developed in the step of forming the plurality of openings 106*a* in the insulating film 106P, it is preferred that the plurality of openings 106*a* be formed by etching, using an etching mask formed on the insulating film 106P.

Figure 31:
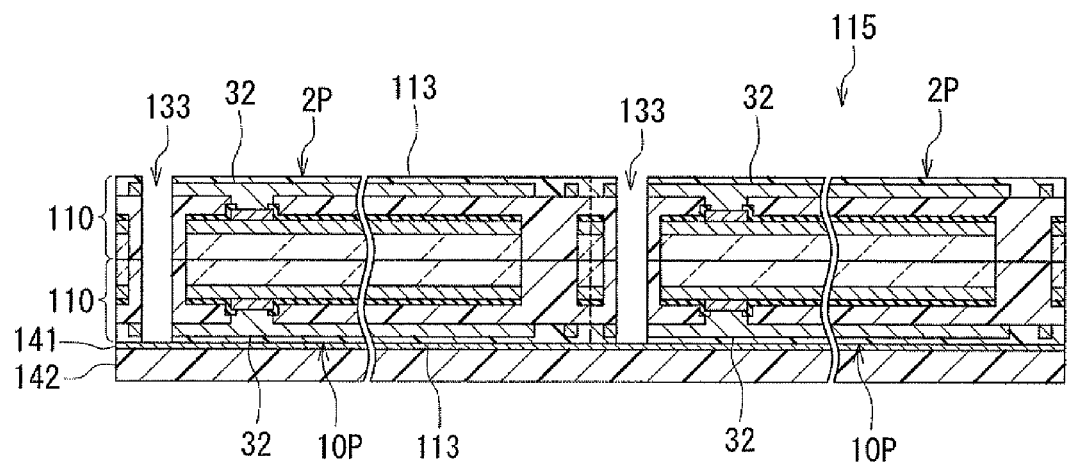
FIG. 31 is a cross-sectional view showing a step that follows the step shown in FIG. 28.

Next, with reference to FIG. 31 to FIG. 33, a description will be given of the step of forming the plurality of through electrodes T in the plurality of holes 133 of the initial layered substructure 115 by plating. FIG. 31 is a cross-sectional view showing a step that follows the step shown in FIG. 28. In this step, first, as shown in FIG. 31, a seed layer 141 for plating is bonded to the bottom surface of the lower substructure 110 of the initial layered substructure 115. The seed layer 141 is formed of a metal such as copper. The seed layer 141 may be a metal film supported by a plate 142 of resin or the like. Alternatively, the seed layer 141 may be a metal plate. In this case, the plate 142 for supporting the seed layer 141 is unnecessary.

Figure 32:
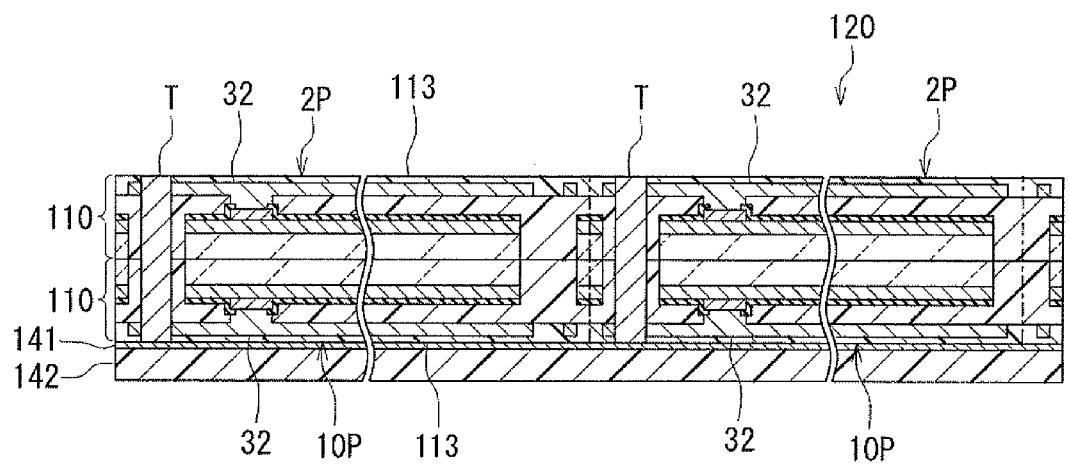
FIG. 32 is a cross-sectional view showing a step that follows the step shown in FIG. 31.

FIG. 32 is a cross-sectional view showing a step that follows the step shown in FIG. 31. In this step, the through electrodes T each made of a plating film are respectively formed in the plurality of holes 133 of the initial layered substructure 115 by electroplating. Here, the seed layer 141 is energized so that the plating films grow from the surface of the seed layer 141 to fill the holes 133. As a result of the formation of the plurality of holes 133 and the plurality of through electrodes T in the initial layered substructure 115, the initial layered substructure 115 becomes a layered substructure 120. The layered substructure 120 includes the two stacked substructures 110. Each of the two substructures 110 has the first surface 110*a* on which the plurality of surface electrodes 32 are disposed, and the second surface 110*b* opposite to the first surface. In the step of fabricating the layered substructure 120, the two substructures 110 are stacked on each other such that their respective first surfaces 110*a* face toward opposite directions. The layered substructure 120 includes an array of a plurality of pre-separation main bodies 2P.

Figure 33:
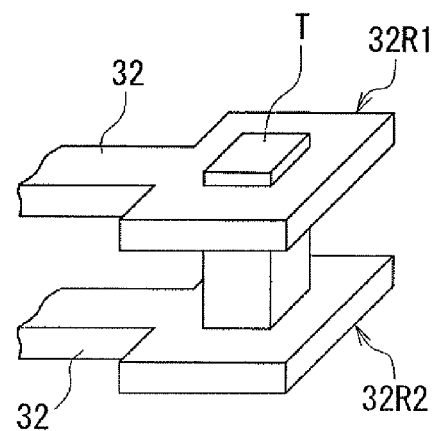
FIG. 33 is a perspective view of a through electrode formed in the step shown in FIG. 32.

FIG. 33 is a perspective view showing two surface electrodes 32 and a single through electrode T in the layered substructure 120. The single through electrode T is in contact with the two surface electrodes 32 that align in the stacking direction of the two substructures 110.

Figure 34:
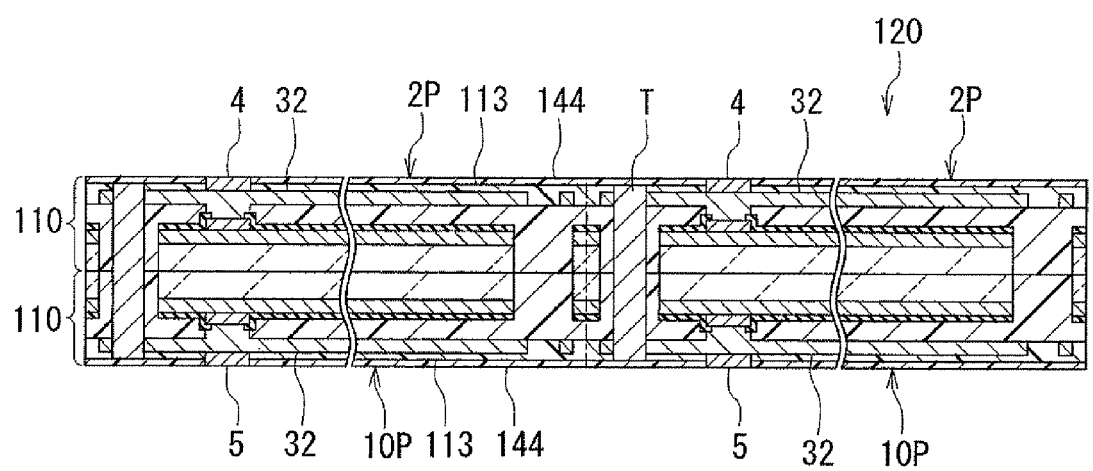
FIG. 34 is a cross-sectional view showing a step that follows the step shown in FIG. 32.

Now, with reference to FIG. 34, a description will be given of the step of forming the plurality of first terminals 4 and the plurality of second terminals 5 on the plurality of pre-separation main bodies 2P in the layered substructure 120. FIG. 34 is a cross-sectional view showing a step that follows the step shown in FIG. 32. In this step, first, the seed layer 141 and the plate 142 are separated from the layered substructure 120. Then, an insulating layer 144 made of an insulating material is formed to cover the top surface of the upper substructure 110 of the layered substructure 120 and the bottom surface of the lower substructure 110 of the layered substructure 120. The insulating layer 144 is to become a part of the insulating portion 31 later. Next, the insulating layers 113 and 144 are partially removed from each of the substructures 110 by, for example, etching, so that portions of the surface electrodes 32 to later become the first and second terminal component parts of the plurality of electrodes are exposed to form a plurality of conductor pads. A plurality of conductor layers are then formed on the plurality of conductor pads, whereby the plurality of first terminals 4 and the plurality of second terminals 5 are formed.

At least either the terminals 4 or the terminals 5 may each include a solder layer made of a solder material, the solder layer being exposed in the surface of each of the terminals 4 or each of the terminals 5. An example of the solder material is AuSn. The solder layer has a thickness in the range of 1 to 2 μm, for example. The solder layer is formed on the surface of each of the surface electrodes 32 directly or via an underlayer by plating, for example.

AuSn is highly adhesive to Au. When either the terminals 4 or the terminals 5 each include a solder layer made of AuSn, it is preferred that the other of the terminals 4 and 5 each include an Au layer that is exposed in the surface of each of the terminals 4 or 5. The Au layer is formed by plating or sputtering, for example. The melting point of AuSn varies according to the ratio between Au and Sn. For example, if the ratio between Au and Sn is 1:9 by weight, AuSn has a melting point of 217° C. If the ratio between Au and Sn is 8:2 by weight, AuSn has a melting point of 282° C.

Figure 35:
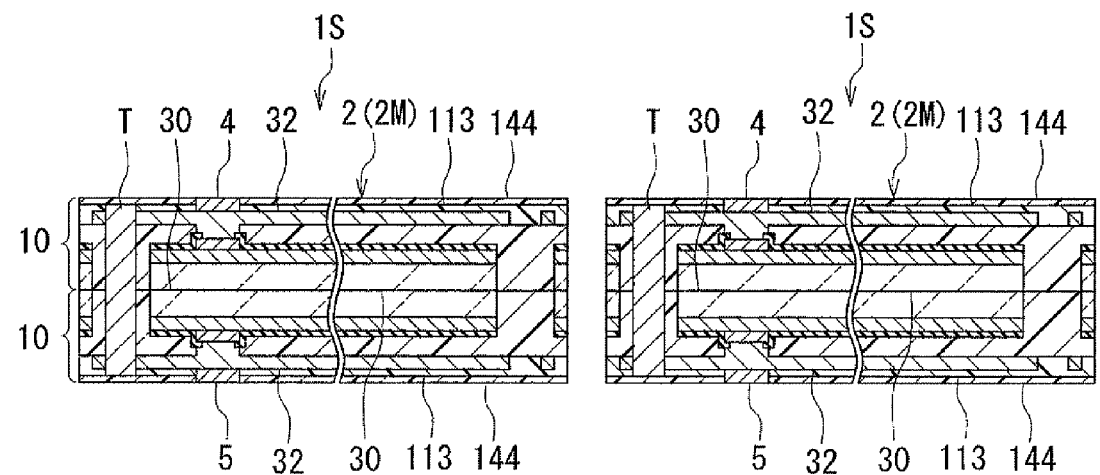
FIG. 35 is a cross-sectional view showing a step that follows the step shown in FIG. 34.

Next, the step of cutting the layered substructure 120 will be described with reference to FIG. 35. FIG. 35 is a cross-sectional view showing a step that follows the step shown in FIG. 34. In this step, as shown in FIG. 35, the layered substructure 120 is cut to separate the plurality of pre-separation main bodies 2P from each other so that a plurality of subpackages 1S are formed. Being separated from each other, the plurality of pre-separation main bodies 2P become individual main bodies 2. The plurality of pre-semiconductor-chip portions 30P are also separated from each other into individual semiconductor chips 30. The through electrodes T are each electrically connected to two surface electrodes 32 that align in the stacking direction of the two layer portions 10 in the main body 2.

A plurality of subpackages 1S are thus formed through the series of steps that have been described with reference to FIG. 14 to FIG. 35. In the present embodiment, a structure composed of a single substructure 110 with a plurality of second additional portion terminals 55 formed on its bottom surface may be fabricated instead of the initial layered substructure 115, and such a structure may be used instead of the initial layered substructure 115 to form a plurality of packages each of which includes only a single layer portion 10, through the series of steps described with reference to FIG. 28 to FIG. 35. It is thereby possible to form a plurality of additional portions 51 such as ones shown in FIG. 6 to FIG. 8.

If the composite layered chip package 1 does not include any additional portion 51, the method of manufacturing the composite layered chip package 1 according to the present embodiment includes the steps of: fabricating a plurality of subpackages 1S; and stacking the plurality of subpackages 1S and electrically connecting them to each other.

If the composite layered chip package 1 includes the additional portion 51, the method of manufacturing the composite layered chip package 1 according to the present embodiment includes the steps of: fabricating a plurality of subpackages 1S; fabricating the additional portion 51; and stacking the plurality of subpackages 1S and the additional portion 51 and electrically connecting them to each other.

Figure 36:
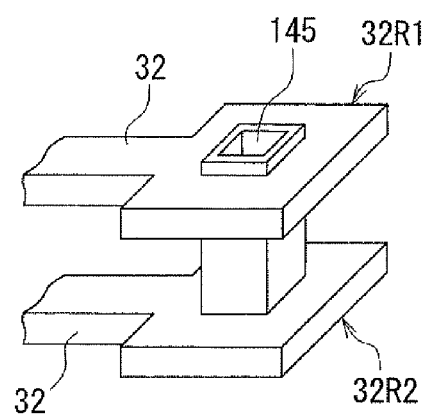
FIG. 36 is a perspective view showing a step of a first modification example of a method of manufacturing the layered chip package according to the first embodiment of the invention.

A description will now be given of first and second modification examples of the method of manufacturing the layered chip package (subpackage 1S) according to the present embodiment. The first modification example will be described first, with reference to FIG. 36. In the first modification example, seed layers 145 each made of a metal film are formed on the wall faces of the plurality of holes 133 of the initial layered substructure 115 by electroless plating prior to forming the through electrodes T by electroplating. Subsequently, the through electrodes T each made of a plating film are respectively formed in the plurality of holes 133 of the initial layered substructure 115 by electroplating. Here, the seed layers 145 are energized so that the plating films grow from the surfaces of the seed layers 145 to fill the holes 133. As a result of the formation of the plurality of holes 133 and the plurality of through electrodes T in the initial layered substructure 115, the initial layered substructure 115 becomes the layered substructure 120.

Figure 37:
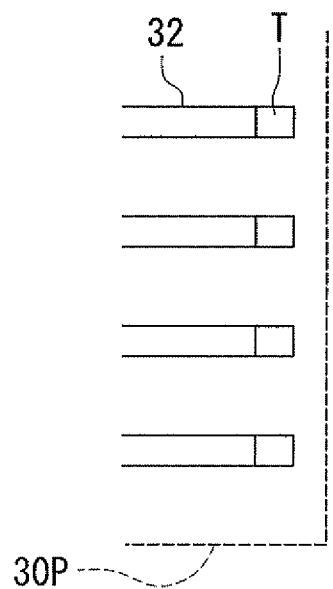
FIG. 37 is a plan view showing a step of a second modification example of the method of manufacturing the layered chip package according to the first embodiment of the invention.
Figure 38:
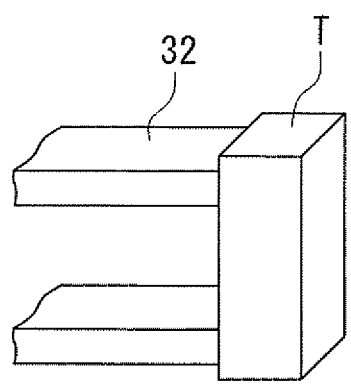
FIG. 38 is a perspective view showing the step of FIG. 37.

Next, the second modification example will be described with reference to FIG. 37 and FIG. 38. FIG. 37 is a plan view showing a part of the layered substructure 120 of the second modification example. FIG. 38 is a perspective view showing two surface electrodes 32 and a single through electrode T in the layered substructure 120 shown in FIG. 37. For ease of understanding, FIG. 37 omits the part of the insulating layer 113 covering the top surfaces of the plurality of surface electrodes 32. In the second modification example, the surface electrodes 32 are without the ring-shaped portions 32R1 and 32R2. The ends of the surface electrodes 32 are exposed in the wall faces of the holes 133 prior to the formation of the through electrodes T in the initial layered substructure 115. When the through electrodes T are formed in the holes 133, the through electrodes T are therefore electrically connected to the surface electrodes 32. The layered substructure 120 is cut subsequently.

As has been described, the subpackage 1S or the layered chip package according to the present embodiment has the main body 2. The main body 2 includes: the main part 2M having the top surface 2Ma and the bottom surface 2Mb; the plurality of first terminals 4 disposed on the top surface 2Ma of the main part 2M; and the plurality of second terminals 5 disposed on the bottom surface 2Mb of the main part 2M. The main part 2M includes the first and second layer portions 10 stacked, and the plurality of through electrodes T each penetrating the first and second layer portions 10. The plurality of through electrodes T are electrically connected to the plurality of first terminals 4 and the plurality of second terminals 5. With the subpackage 1S of such a configuration, electrical connection between two or more subpackages 1S can be established by stacking the two or more subpackages 1S and electrically connecting the second terminals 5 of the upper one of two vertically adjacent subpackages 1S to the first terminals 4 of the lower one. It is thereby possible to form the composite layered chip package 1 according to the present embodiment.

In the present embodiment, the plurality of first terminals 4 are formed by using the plurality of surface electrodes 32 of the first layer portion 10S1, while the plurality of second terminals 5 are formed by using the plurality of surface electrodes 32 of the second layer portion 10S2. According to the present embodiment, it is therefore possible to electrically connect a plurality of layered chip packages (subpackages 1S) to each other in a simple configuration. Consequently, according to the present embodiment, it is possible to stack a plurality of layered chip packages (subpackages 1S) and electrically connect them to each other in a simple configuration. A package that includes a desired number of semiconductor chips 30 can thus be provided at low cost.

In the present embodiment, the plurality of surface electrodes 32 of the first layer portion 10S1 and those of the second layer portion 10S2 have the same layout. The plurality of surface electrodes 32 include a plurality of first terminal component parts that are used to form the plurality of first terminals 4 in the first layer portion 10S1, and a plurality of second terminal component parts that are used to form the plurality of second terminals 5 in the second layer portion 10S2. According to the present embodiment, different areas of the plurality of surface electrodes 32 of the same layout can thus be used to form the first terminals 4 and the second terminals 5 of different layouts. This can further reduce the manufacturing costs of the subpackages 1S and the composite layered chip package 1.

In each subpackage 1S, the first layer portion 10S1 and the second layer portion 10S2 are bonded to each other such that the respective second surfaces 30b face each other. In the initial layered substructure 115 which is fabricated in the process of manufacturing the subpackages 1S, two substructures 110 are bonded to each other with their second surfaces 110b arranged to face each other. If there is a stress that acts to warp each individual substructure 110, the stress can be cancelled out between the two substructures 110 in the initial layered substructure 115. According to the present embodiment, it is therefore possible to maintain the flatness of the two substructures 110 included in the initial layered substructure 115.

Each subpackage 1S includes a plurality of pairs of the first terminal 4 and the second terminal 5, the first and second terminals 4 and 5 being electrically connected to each other by the through electrodes T. The plurality of pairs include the plurality of non-overlapping terminal pairs. As has been described in detail, according to the present embodiment, when a plurality of subpackages 1S having the same configuration are stacked on each other and electrically connected to each other, some of the plurality of signals associated with the semiconductor chips 30 that fall on the same layers in the respective plurality of subpackages 1S can be easily made different from one subpackage 1S to another. According to the present embodiment, it is therefore possible to stack a plurality of subpackages 1S of the same configuration and give the subpackages 1S respective different functions.

According to the present embodiment, a composite layered chip package 1 including a predetermined number of semiconductor chips 30 is formed by stacking a plurality of subpackages 1S. This makes it possible to reduce the number of semiconductor chips 30 to be included in a single subpackage 1S. It is thereby possible to reduce the possibility for a single subpackage 1S to include a defective semiconductor chip 30. According to the present embodiment, a composite layered chip package 1 including no defective semiconductor chip 30 can thus be easily formed by stacking subpackages 1S that each include only conforming semiconductor chips 30. According to the present embodiment, in particular, it is possible to make the possibility even lower that a single subpackage 1S includes a defective semiconductor chip 30, since the number of the semiconductor chips 30 included in each subpackage 1S is two. Consequently, according to the present embodiment, a composite layered chip package 1 including no defective semiconductor chip 30 can be easily formed by stacking subpackages 1S that each include only conforming semiconductor chips 30.

According to the present embodiment, when at least one of the subpackages 1S in the composite layered chip package 1 includes the second-type layer portion 10B, the additional portion 51 can be added to the plurality of subpackages 1S to form a composite layered chip package 1. According to the present embodiment, even if at least one of the subpackages 1S includes a defective semiconductor chip 30, it is thus possible to easily provide a composite layered chip package 1 having the same functions as those of a composite layered chip package 1 that includes no defective semiconductor chip 30.

Figure 39:
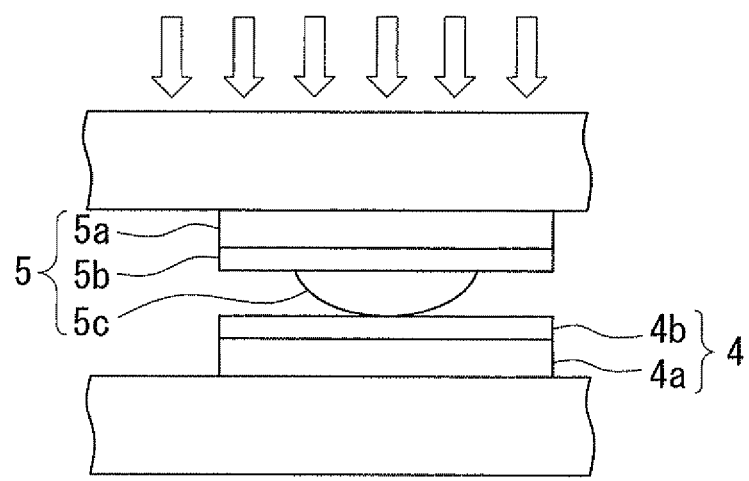
FIG. 39 is a side view showing connecting parts of the terminals of two vertically adjacent subpackages.
Figure 40:
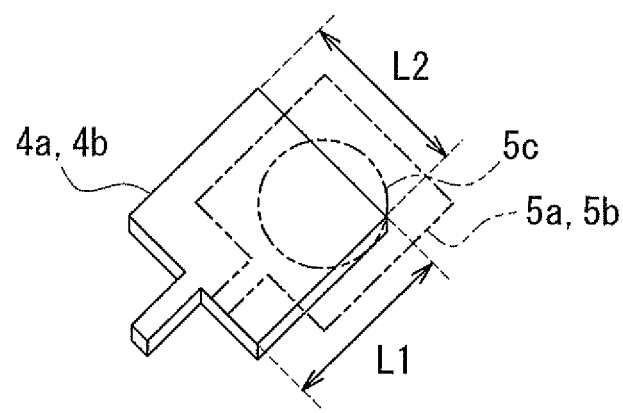
FIG. 40 is an explanatory diagram for explaining misalignment between the terminals of two vertically adjacent subpackages.

Moreover, the present embodiment facilitates the alignment between every two vertically adjacent subpackages 1S when stacking a plurality of subpackages 1S. This advantageous effect will now be described with reference to FIG. 39 and FIG. 40. FIG. 39 is a side view showing connecting parts of the terminals of two vertically adjacent subpackages 1S. FIG. 40 is an explanatory diagram for explaining misalignment between the terminals of two vertically adjacent subpackages 1S.

In the example shown in FIG. 39 and FIG. 40, the terminal 4 includes a conductor pad 4a of rectangular shape and an Au layer 4b that is formed on the surface of the conductor pad 4a. The conductor pad 4a constitutes a part of the surface electrode 32, and is made of Cu, for example. The terminal 5 includes a conductor pad 5a of rectangular shape, an underlayer 5b formed on the surface of the conductor pad 5a, and a solder layer 5c formed on the surface of the underlayer 5b. The conductor pad 5a constitutes a part of the surface electrode 32, and is made of Cu, for example. The underlayer 5b is made of Au, and the solder layer 5c is made of AuSn. Alternatively, contrary to this example, it is possible that the terminal 4 includes a conductor pad, an underlayer and a solder layer, while the terminal 5 includes a conductor pad and an Au layer. Both of the terminals 4 and 5 may include a solder layer. Here, the lengths of two orthogonal sides of the conductor pad 4a will be represented by L1 and L2. L1 and L2 are both 40 to 80 μm, for example. The conductor pad 5a has the same shape as that of the conductor pad 4a.

In the example shown in FIG. 39, the corresponding terminals 4 and 5 of the two vertically adjacent subpackages 1S are electrically connected in the following way. The Au layer 4b and the solder layer 5c of the corresponding terminals 4 and 5 are put into contact with each other. By applying heat and pressure, the solder layer 5c is melted, and then solidified to bond the terminals 4 and 5 to each other.

FIG. 40 shows a state where the terminals 4 and 5 are out of alignment. The state where the terminals 4 and 5 are out of alignment refers to the state where the edges of the conductor pad 4a and those of the conductor pad 5a do not coincide in position with each other when viewed in a direction perpendicular to the plane of the conductor pads 4a and 5a. In the present embodiment, the corresponding terminals 4 and 5 may be out of alignment as long as the terminals 4 and 5 can be bonded with a sufficiently small resistance at the interface between the terminals 4 and 5. Assuming that L1 and L2 are 30 to 60 μm, the maximum permissible misalignment between the terminals 4 and 5 is smaller than L1 and L2 yet several tens of micrometers.

According to the present embodiment, some misalignment between the terminals 4 and 5 is thus acceptable when stacking a plurality of subpackages 1S. This facilitates the alignment between two vertically adjacent subpackages 1S. Consequently, according to the present embodiment, it is possible to reduce the manufacturing cost of the composite layered chip package 1.

For the same reason as with the stacking of a plurality of subpackages 1S as described above, the present embodiment facilitates alignment between a subpackage 1S and an additional portion 51 that are adjacent vertically or alignment between two vertically adjacent additional portions 51. Consequently, according to the present embodiment, it is possible to reduce the manufacturing cost of the composite layered chip package 1 including one or more additional portions 51.

Figure 41:
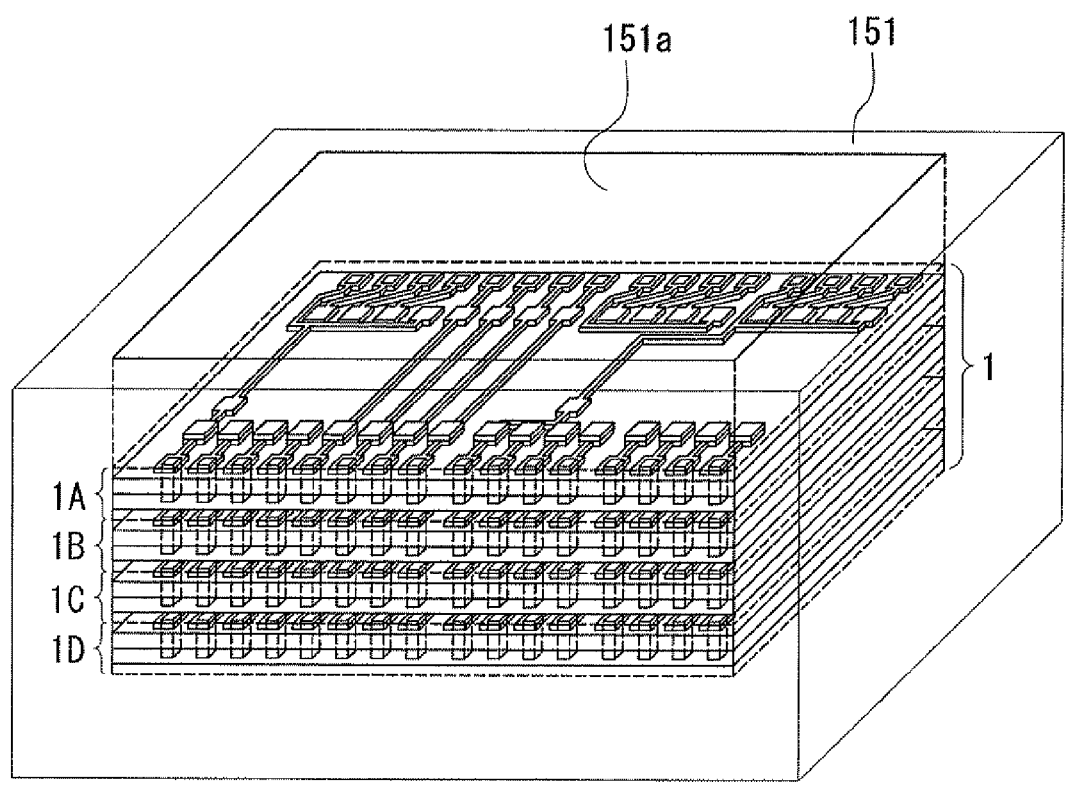
FIG. 41 is a perspective view showing an example of the method of stacking four subpackages.

FIG. 41 shows an example of a method of manufacturing a composite layered chip package 1 that includes four subpackages 1S stacked. The method shown in FIG. 41 uses a heat-proof container 151. The container 151 has an accommodating part 151a in which a plurality of subpackages 1S can be stacked and accommodated. The accommodating part 151a has such a size that the side surfaces of the subpackages 1S accommodated in the accommodating part 151a and the inner walls of the accommodating part 151a leave a slight gap therebetween. In the method, a plurality of subpackages 1S are stacked and accommodated in the accommodating part 151a of the container 151, and then the container 151 and the plurality of subpackages 1S are heated at temperatures at which the solder layer melts (for example, 320° C.). This melts the solder layer, whereby the terminals 4 and 5 of two vertically adjacent subpackages 1S are bonded to each other. According to the method, a plurality of subpackages 1S are stacked and accommodated in the accommodating part 151a of the container 151, whereby the plurality of subpackages 1S can be easily aligned with each other. This makes it easy to manufacture the composite layered chip package 1. FIG. 41 shows an example where four subpackages 1A to 1D are stacked to manufacture a composite layered chip package 1. However, the method shown in FIG. 41 can also be used in manufacturing a composite layered chip package 1 that includes one or more additional portions 51.

In the present embodiment, defective semiconductor chips 30 are electrically connected to none of the through electrodes T. The defective semiconductor chips 30 may thus be regarded as a mere insulating layer. Consequently, according to the present embodiment, it is possible to disable the defective semiconductor chips 30 and to prevent the defective semiconductor chips 30 from causing malfunction of the layered chip package.

In the present embodiment, the plurality of surface electrodes 32 of the first layer portion 10S1 can be used to form the plurality of first terminals 4 even if the first layer portion 10S1 is the second-type layer portion 10B. Similarly, the plurality of surface electrodes 32 of the second layer portion 10S2 can be used to form the plurality of second terminals 5 even if the second layer portion 10S2 is the second-type layer portion 10B. The plurality of surface electrodes 32 of the layer portion 10B do not have the function of electrically connecting the semiconductor chip 30 to the plurality of through electrodes T, but have an interposer function of electrically connecting a single subpackage 1S to another subpackage 1S or to the additional portion 51.

Regardless of whether a layer portion 10 is the first-type layer portion 10A or second-type layer portion 10B, the plurality of surface electrodes 32 except the first-type and sixth-type electrodes do not have the function of electrically connecting the semiconductor chip 30 to the plurality of through electrodes T, but have an interposer function of electrically connecting a single subpackage 1S to another subpackage 1S or to the additional portion 51.

In the composite layered chip package 1 according to the present embodiment, the additional portion 51 includes at least one additional semiconductor chip 80 and additional portion wiring 53. The additional portion wiring 53 defines electrical connections between the at least one additional semiconductor chip 80 and the plurality of first terminals 4 or second terminals 5 of any of the plurality of subpackages 1S so that the at least one additional semiconductor chip 80 substitutes for the semiconductor chip 30 of at least one second-type layer portion 10B. Consequently, according to the present embodiment, it is possible to easily provide a composite layered chip package 1 having the same functions as those of a composite layered chip package 1 that includes no defective semiconductor chip 30, regardless of the number and location(s) of the second-type layer portion(s) 10B in a subpackage 1S. The location(s) of the second-type layer portion(s) 10B in a subpackage 1S can be known from the location information on the normally functioning pre-semiconductor-chip portions 30P and the malfunctioning pre-semiconductor-chip portions 30P which was obtained by the wafer sort test.

In the present embodiment, the method of manufacturing the subpackages 1S includes the steps of: fabricating the layered substructure 120 by stacking two substructures 110; and cutting the layered substructure 120 so that a plurality of subpackages 1S are formed. Each of the two substructures 110 has the first surface 110a on which the plurality of surface electrodes 32 are disposed, and the second surface 110b opposite to the first surface. In the step of fabricating the layered substructure 120, the two substructures 110 are stacked on each other such that their respective first surfaces 110a face toward opposite directions.

The step of fabricating the layered substructure 120 includes the steps of: fabricating the initial layered substructure 115 that is to later become the layered substructure 120 by being provided with the plurality of holes 133 for the plurality of through electrodes T to be accommodated in and the plurality of through electrodes T; forming the plurality of holes 133 in the initial layered substructure 115; and forming the plurality of through electrodes T in the plurality of holes 133.

According to the method of manufacturing the subpackages 1S or the layered substructure 120 described above, a plurality of subpackages 1S each having a plurality of through electrodes T are produced by cutting the layered substructure 120. This involves only a small number of steps. According to the present embodiment, it is thus possible to mass-produce the subpackages 1S at low cost in a short time.

In the present embodiment, in the case where the plurality of surface electrodes 32 have the ring-shaped portions 32R1 and 32R2 as shown in FIG. 29 and FIG. 30, the surface electrodes 32 come in contact with the through electrodes T in large areas. In this case, it is possible to increase the reliability of electrical connection between the surface electrodes 32 and the through electrodes T.

According to the present embodiment, in a subpackage 1S including a plurality of semiconductor chips 30 stacked, the stacked semiconductor chips 30 are electrically connected to each other by the plurality of through electrodes T penetrating the first and second layer portions 10S1 and 10S2. The present embodiment therefore eliminates the problems of the wire bonding method, that is, the problem that it is difficult to reduce the distance between the electrodes so as to avoid contact between the wires, and the problem that the high resistances of the wires hamper quick circuit operation.

Furthermore, in the present embodiment, the plurality of holes 133 are formed to penetrate the two stacked substructures 110 of the initial layered substructure 115. The plurality of through electrodes T are then formed in the plurality of holes 133. The plurality of through electrodes T penetrate the two stacked substructures 110. Two semiconductor chips 30 vertically adjacent to each other in a layered chip package (subpackage 1S) are electrically connected to each other by the plurality of through electrodes T penetrating the two semiconductor chips 30. If two vertically adjacent semiconductor chips 30 each have through electrodes and the respective through electrodes of the two semiconductor chips 30 are to be electrically connected to each other, it is necessary to carry out alignment and electrical connection between the respective through electrodes of the two semiconductor chips. The present embodiment does not require the alignment and electrical connection between the through electrodes of the two semiconductor chips. The present embodiment therefore allows increasing the reliability of electrical connection between two vertically adjacent semiconductor chips 30.

According to the method of manufacturing the subpackages 1S of the present embodiment, the initial layered substructure 115 is fabricated by the method described with reference to FIG. 24 to FIG. 27. This makes it possible to easily reduce the thickness of the two substructures 110 that constitute the initial layered substructure 115 while preventing damage to the substructures 110. The present embodiment thus allows a high-yield manufacture of the subpackages 1S that achieve a smaller size and higher integration.

In the present embodiment, the through electrodes T can be formed not only by plating, but also by other methods. For example, the through electrodes T may be formed by filling the holes 133 with a conductive paste that contains silver, copper or other metal powder and a binder, and then heating the conductive paste to decompose the binder and sinter the metal. Alternatively, the through electrodes T may be formed by pressing silver, copper or other metal powder into the holes 133 and then heating the metal powder to sinter the metal.

[Second Embodiment]

A second embodiment of the invention will now be described. In the method of manufacturing a layered chip package according to the present embodiment, the step of fabricating the layered substructure is different from that of the first embodiment. The steps of the method of manufacturing the layered chip package according to the present embodiment are the same as those of the first embodiment up to the step shown in FIG. 19. Then, in the present embodiment, a plurality of openings for exposing the plurality of electrode pads 38 are formed in the insulating film 106P in the normally functioning pre-semiconductor-chip portions 30P, as in the first embodiment. At this time, in the present embodiment, a plurality of holes for accommodating a plurality of conductor parts are also formed in the insulating film 106P at the positions of the grooves 104P. The plurality of conductor parts are intended to form the plurality of through electrodes T.

Figure 42:
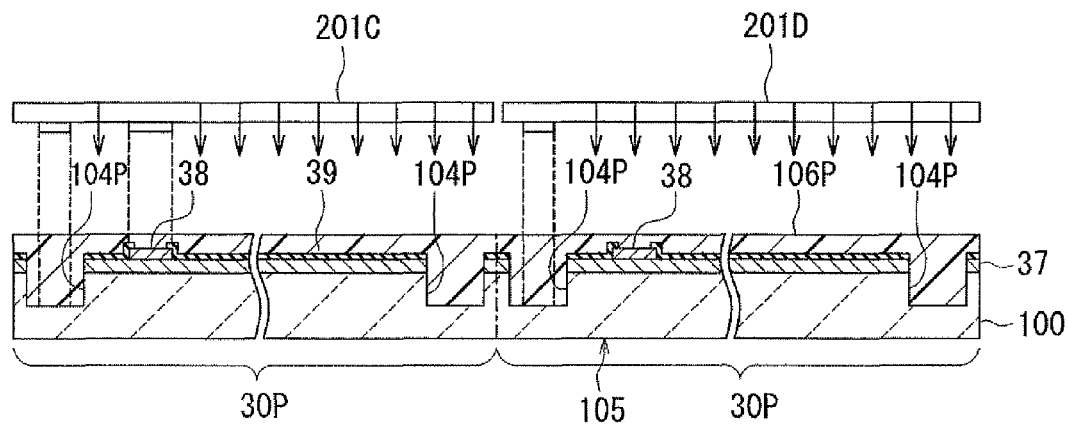
FIG. 42 is a cross-sectional view showing a step of a method of manufacturing a composite layered chip package according to a second embodiment of the invention.
Figure 43:
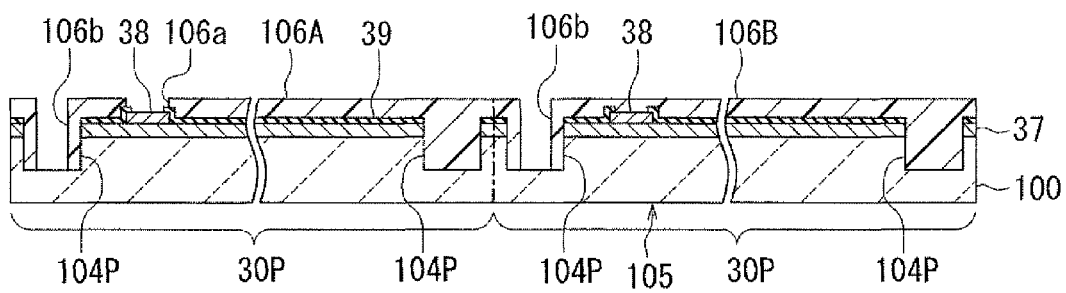
FIG. 43 is a cross-sectional view showing a step that follows the step shown in FIG. 42.

Reference is now made to FIG. 42 and FIG. 43 to describe the step of forming the plurality of openings and the plurality of holes in the insulating film 106P. FIG. 42 shows a step that follows the step shown in FIG. 19. FIG. 43 shows a step that follows the step shown in FIG. 42. Here, an example where the entire insulating film 106P shown in FIG. 19 is made of a negative photosensitive material will be taken for the description. In the step shown in FIG. 42, the insulating film 106P is exposed to light, using a mask 201C shown in FIG. 42 in the normally functioning pre-semiconductor-chip portion 30P (the left side), while using a mask 201D shown in FIG. 42 in the malfunctioning pre-semiconductor-chip portion 30P (the right side). This exposure process uses the location information on the normally functioning pre-semiconductor-chip portions 30P and the malfunctioning pre-semiconductor-chip portions 30P in each pre-substructure wafer 101 which was obtained by the wafer sort test.

The mask 201C has such a pattern that the areas of the insulating film 106P where to form the openings and the holes are not irradiated with light while the other areas are irradiated with light. The mask 201D has such a pattern that the areas of the insulating film 106P where to form the holes are not irradiated with light while the other areas are irradiated with light. The non-irradiated areas of the insulating film 106P are soluble in a developing solution, and the irradiated areas become insoluble in the developing solution.

Next, the insulating film 106P is developed with the developing solution. As a result, as shown in FIG. 43, a plurality of openings 106a for exposing the plurality of electrode pads 38 and a plurality of holes 106b for accommodating the plurality of conductor parts are formed in the insulating film 106P in the normally functioning pre-semiconductor-chip portion 30P (the left side). On the other hand, in the malfunctioning pre-semiconductor-chip portion 30P (the right side), the plurality of holes 106b are formed but no openings 106a are formed in the insulating film 106P. After the development, the area of the insulating film 106P corresponding to the normally functioning pre-semiconductor-chip portion 30P becomes a first-type insulating layer 106A, and the area corresponding to the malfunctioning pre-semiconductor-chip portion 30P becomes a second-type insulating layer 106B. The first-type insulating layer 106A has the plurality of openings 106a for exposing the plurality of electrode pads 38, and surrounds the plurality of electrode pads 38. The second-type insulating layer 106B covers the plurality of electrode pads 38 so as to avoid exposure.

The bottom ends of the plurality of holes 106b reach the bottoms of the grooves 104P. The plurality of holes 106b are formed at positions where the through electrodes T are to be formed later. In a pre-polishing substructure main body 105 for use to fabricate a plurality of first layer portions 10S1, the plurality of holes 106b are formed near a side of the top surface of the pre-semiconductor-chip portion 30P corresponding to the side surface 30c of the semiconductor chip 30. In a pre-polishing substructure main body 105 for use to fabricate a plurality of second layer portions 10S2, the plurality of holes 106b are formed near a side of the top surface of the pre-semiconductor-chip portion 30P corresponding to the side surface 30d of the semiconductor chip 30.

Figure 44:
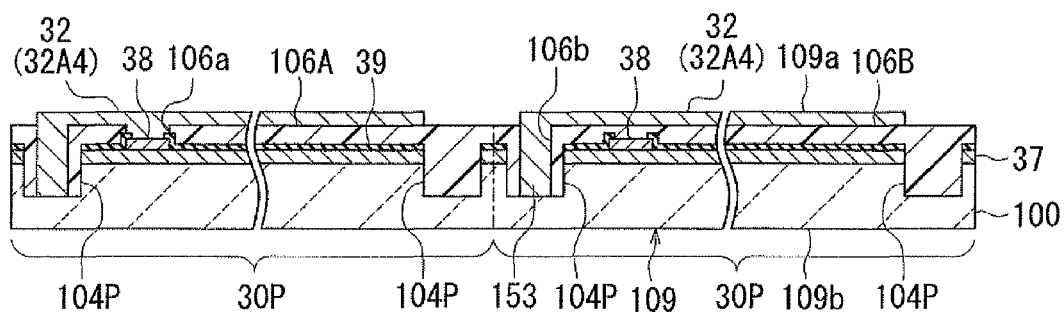
FIG. 44 is a cross-sectional view showing a step that follows the step shown in FIG. 43.

FIG. 44 shows a step that follows the step shown in FIG. 43. In this step, a plurality of surface electrodes 32 are formed on the insulating layers 106A and 106B and a plurality of conductor parts 153 are formed in the plurality of holes 106b, by plating, for example. The plurality of conductor parts 153 are connected to the plurality of surface electrodes 32. A pre-polishing substructure 109 shown in FIG. 44 is thus fabricated. The pre-polishing substructure 109 has a first surface 109a and a second surface 109b.

Figure 45:
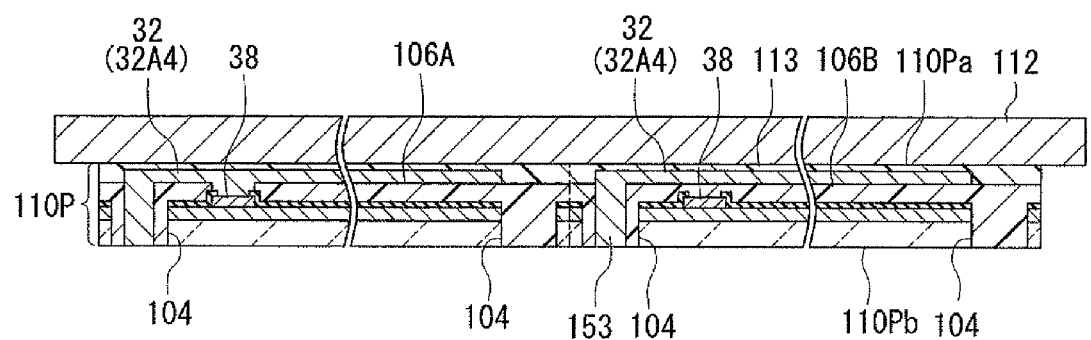
FIG. 45 is a cross-sectional view showing a step that follows the step shown in FIG. 44.

FIG. 45 shows a step that follows the step shown in FIG. 44. In this step, first, using an insulating adhesive, the pre-polishing substructure 109 is bonded to a plate-shaped jig 112 shown in FIG. 45, with the first surface 109a of the pre-polishing substructure 109 arranged to face a surface of the jig 112. Reference numeral 113 in FIG. 45 indicates an insulating layer formed by the adhesive. The insulating layer 113 is to become a part of the insulating portion 31 later. The plurality of surface electrodes 32 and the plurality of conductor parts 153 are covered by the insulating layer 113.

Next, the second surface 109b of the pre-polishing substructure 109 bonded to the jig 112 is polished. The polishing is performed until the plurality of grooves 104P are exposed, that is, until the plurality of conductor parts 153 are exposed. By polishing the second surface 109b of the pre-polishing substructure 109, the pre-polishing substructure 109 is thinned. Consequently, there is formed an initial substructure 110P in the state of being bonded to the jig 112. The initial substructure 110P has a first surface 110Pa corresponding to the first surface 109a of the pre-polishing substructure 109, and a second surface 110Pb opposite to the first surface 110Pa. The second surface 110Pb is the polished surface. By polishing the second surface 109b of the pre-polishing substructure 109 until the plurality of grooves 104P are exposed, the plurality of grooves 104P become a plurality of insulator fill holes 104.

Figure 46:
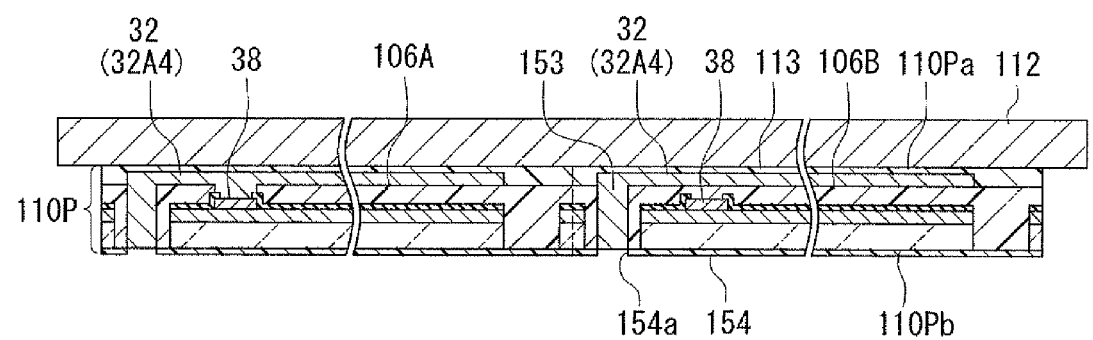
FIG. 46 is a cross-sectional view showing a step that follows the step shown in FIG. 45.

FIG. 46 shows a step that follows the step shown in FIG. 45. In this step, an insulating layer 154 is formed on the second surface 110Pb of the initial substructure 110P. The insulating layer 154 has a plurality of openings 154a for exposing the plurality of conductor parts 153. The insulating layer 154 is preferably adhesive. The insulating layer 154 that is adhesive and has the plurality of openings 154a can be formed by, for example, patterning a photosensitive adhesive sheet by photolithography.

Figure 47:
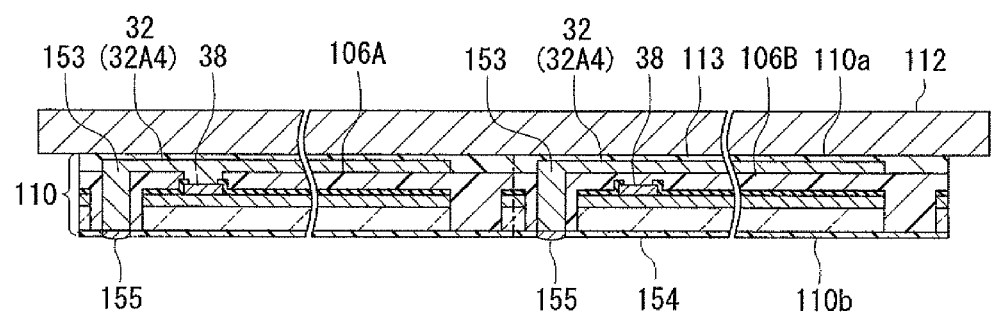
FIG. 47 is a cross-sectional view showing a step that follows the step shown in FIG. 46.

FIG. 47 shows a step that follows the step shown in FIG. 46. In this step, a plurality of solder layers 155 that are electrically connected to the respective conductor parts 153 are formed in the plurality of openings 154a of the insulating layer 154. The initial substructure 110P thereby becomes a substructure 110. The substructure 110 has a first surface 110a corresponding to the first surface 110Pa of the initial substructure 110P, and a second surface 110b opposite to the first surface 110a. The second surface 110b is composed of the surfaces of the insulating layer 154 and the plurality of solder layers 155.

Figure 48:
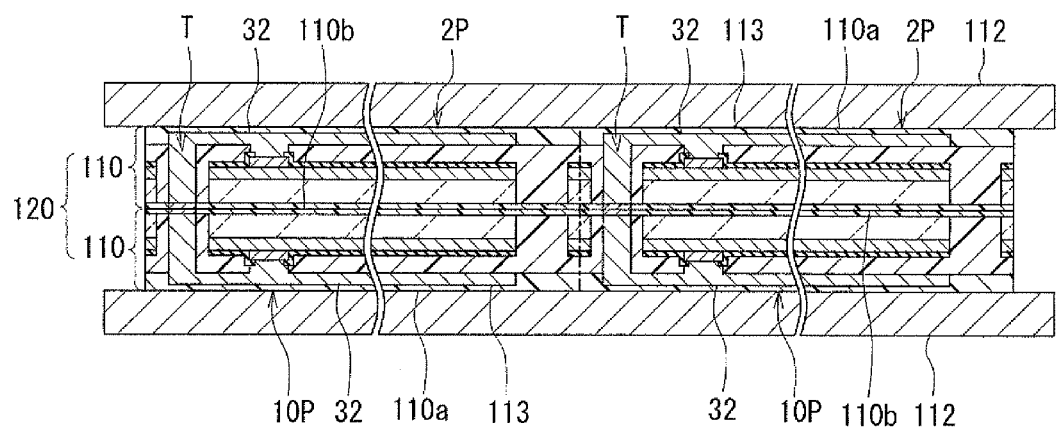
FIG. 48 is a cross-sectional view showing a step that follows the step shown in FIG. 47.

FIG. 48 shows a step that follows the step shown in FIG. 47. In this step, two substructures 110 each constructed as shown in FIG. 47 are bonded to each other with the respective second surfaces 110b arranged to face each other. A layered substructure 120 is thereby fabricated which includes the two stacked substructures 110. At this time, the plurality of solder layers 155 of the two substructures 110 are heated to melt and then solidified, whereby the corresponding solder layers 155 of the two substructures 110 are electrically connected to each other. The respective insulating layers 154 of the two substructures 110 are also bonded to each other. As a result of the electrical connection between the corresponding solder layers 155 of the two substructures 110, the plurality of conductor parts 153 of one of the two substructures 110 and those of the other are electrically connected to each other via the plurality of solder layers 155. A pair of conductor parts 153 that are electrically connected to each other via a pair of solder layers 155 constitute one through electrode T. Next, the two jigs 112 are removed from the layered substructure 120.

As described above, in the present embodiment, each of the two substructures 110 that constitute the layered substructure 120 includes the plurality of conductor parts 153 intended for forming the plurality of through electrodes T. In the step of fabricating the layered substructure 120, the plurality of conductor parts 153 of one of the two substructures 110 and those of the other are electrically connected to each other to form the plurality of through electrodes T.

Figure 49:
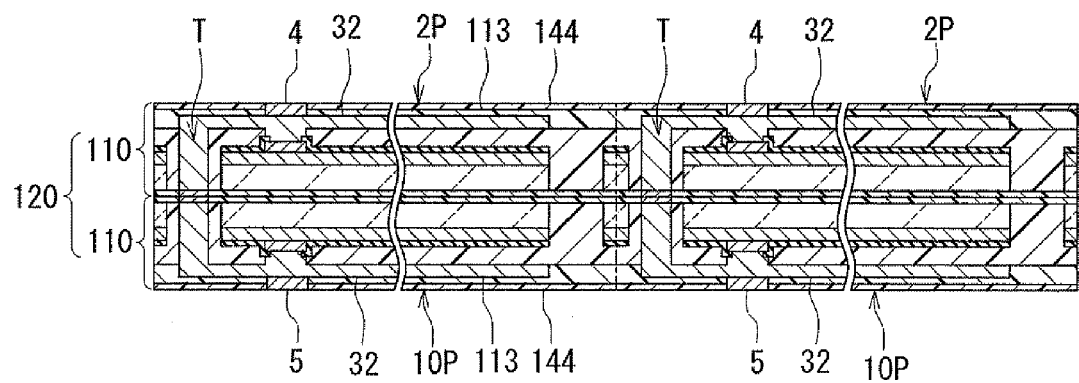
FIG. 49 is a cross-sectional view showing a step that follows the step shown in FIG. 48.

FIG. 49 shows a step that follows the step shown in FIG. 48. In this step, the plurality of first terminals 4 and the plurality of second terminals 5 are formed on the plurality of pre-separation main bodies 2P in the layered substructure 120 in the same way as the step shown in FIG. 34 described in the first embodiment.

Figure 50:
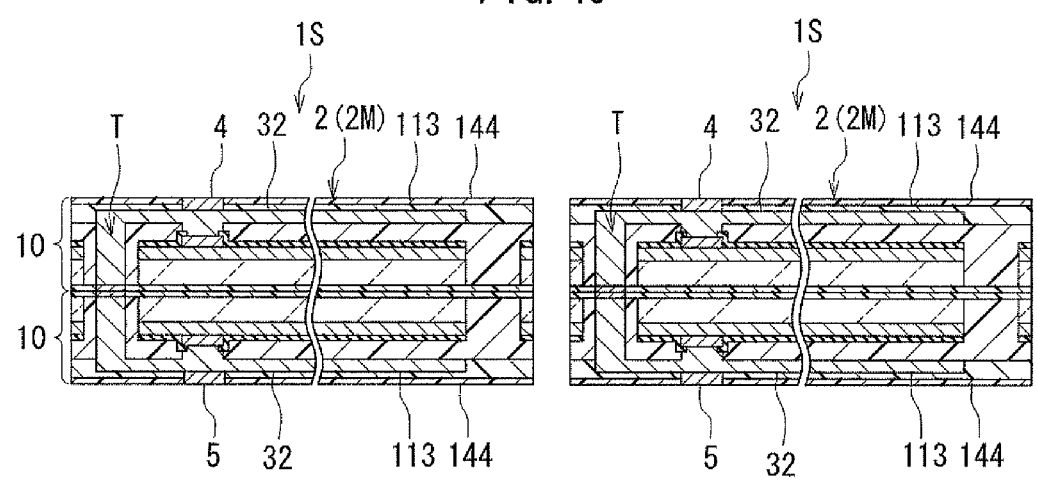
FIG. 50 is a cross-sectional view showing a step that follows the step shown in FIG. 49.

FIG. 50 shows a step that follows the step shown in FIG. 49. In this step, as in the step shown in FIG. 35 described in the first embodiment, the layered substructure 120 is cut to separate the plurality of pre-separation main bodies 2P from each other so that a plurality of subpackages 1S are formed. Being separated from each other, the plurality of pre-separation main bodies 2P become individual main bodies 2.

The advantage of the first embodiment that results from the formation of the plurality of holes 133 to penetrate two stacked substructures 110 and the formation of the through electrodes T in the plurality of holes 133 is not available in the present embodiment. Instead, the present embodiment eliminates the need for the steps of forming the plurality of holes 133 and forming the plurality of through electrodes T which are involved in the first embodiment. The present embodiment further provides the advantage that the plurality of surface electrodes 32 and the plurality of conductor parts 153 can be formed at the same time.

The remainder of configuration, function and effects of the present embodiment are similar to those of the first embodiment.

The present invention is not limited to the foregoing embodiments, and various modifications may be made thereto. For example, in the foregoing embodiments, a single through electrode T passes through a corresponding single insulator fill hole 104. In the present invention, however, the insulator fill hole 104 may be formed to have a large diameter so that a plurality of through electrodes T can pass through such a single insulator fill hole 104.

It is apparent that the present invention can be carried out in various forms and modifications in the light of the foregoing descriptions. Accordingly, within the scope of the following claims and equivalents thereof, the present invention can be carried out in forms other than the foregoing most preferred embodiments.

What is claimed is:

1. A layered chip package comprising a main body having a top surface and a bottom surface, the main body including:
a main part having a top surface and a bottom surface;
a plurality of first terminals disposed on the top surface of the main part; and
a plurality of second terminals disposed on the bottom surface of the main part, wherein:
the main part includes a first layer portion and a second layer portion stacked, and a plurality of through electrodes that each penetrate the first and second layer portions;
the plurality of through electrodes are electrically connected to the plurality of first terminals and the plurality of second terminals;
each of the first and second layer portions includes a semiconductor chip and a plurality of surface electrodes, the semiconductor chip of each of the first and second layer portions having a first surface and a second surface opposite to the first surface, the plurality of surface electrodes of each of the first and second layer portions being disposed on a side of the semiconductor chip opposite to the second surface of the semiconductor chip;
the first layer portion and the second layer portion are bonded directly to each other such that the second surface of the semiconductor chip of the first layer portion and the second surface of the semiconductor chip of the second layer portion face each other;
the plurality of surface electrodes of the first layer portion have a layout that is the same as a layout of the plurality of surface electrodes of the second layer portion;
the plurality of surface electrodes of each of the first and second layer portions include a plurality of first terminal component parts and a plurality of second terminal component parts;
the plurality of first terminal component parts of the plurality of surface electrodes of the first layer portion are used to form the plurality of first terminals, whereas the plurality of second terminal component parts of the plurality of surface electrodes of the first layer portion are not used to form the plurality of first terminals; and
the plurality of second terminal component parts of the plurality of surface electrodes of the second layer portion are used to form the plurality of second terminals, whereas the plurality of first terminal component parts of the plurality of surface electrodes of the second layer portion are not used to form the plurality of second terminals.

2. The layered chip package according to claim 1, wherein the plurality of surface electrodes of each of the first and second layer portions further include one or more connecting parts that electrically connect one of the first terminal component parts and one of the second terminal component parts to each other.

3. The layered chip package according to claim 1, wherein:
the plurality of surface electrodes of each of the first and second layer portions include a plurality of chip connection surface electrodes for electrical connection to the semiconductor chip; and
in at least one of the first and second layer portions, the plurality of chip connection surface electrodes are in contact with and electrically connected to the semiconductor chip.

4. The layered chip package according to claim 1, wherein:
the plurality of surface electrodes of the first layer portion include one or more surface electrodes that are not used to form the plurality of first terminals; and
the plurality of surface electrodes of the second layer portion include one or more surface electrodes that are not used to form the plurality of second terminals.

5. The layered chip package according to claim 1, wherein:
the plurality of second terminals are positioned to overlap the plurality of first terminals as viewed in a direction perpendicular to the top surface of the main body;

the plurality of second terminals are electrically connected to corresponding ones of the first terminals via the respective through electrodes to constitute a plurality of pairs of the first and second terminals, the first and second terminals in each of the pairs being electrically connected to each other; and the plurality of pairs include a plurality of non-overlapping terminal pairs, each of the non-overlapping terminal pairs consisting of any one of the first terminals and any one of the second terminals, the first and second terminals in each of the non-overlapping terminal pairs being electrically connected to each other and being positioned not to overlap each other as viewed in the direction perpendicular to the top surface of the main body.

6. The layered chip package according to claim 5, wherein the plurality of pairs further include a plurality of overlapping terminal pairs, each of the overlapping terminal pairs consisting of any one of the first terminals and any one of the second terminals, the first and second terminals in each of the overlapping terminal pairs being electrically connected to each other and being positioned to overlap each other as viewed in the direction perpendicular to the top surface of the main body.

7. The layered chip package according to claim 5, wherein the plurality of through electrodes include: a chip connection through electrode that is electrically connected to any one of the plurality of non-overlapping terminal pairs and used for electrical connection to the semiconductor chip of at least one of the first and second layer portions; and a bypass through electrode that is electrically connected to any one of the plurality of non-overlapping terminal pairs and to neither of the semiconductor chips included in the first and second layer portions.

8. The layered chip package according to claim 1, wherein the semiconductor chip of each of the first and second layer portions includes a plurality of memory cells.

9. The layered chip package according to claim 1, wherein:
one of the first and second layer portions is a first-type layer portion, whereas the other of the first and second layer portions is a second-type layer portion;
in the first-type layer portion, the semiconductor chip is electrically connected to two or more of the plurality of through electrodes; and
in the second-type layer portion, the semiconductor chip is electrically connected to none of the through electrodes.

10. The layered chip package according to claim 9, wherein the semiconductor chip of the first-type layer portion is a normally functioning one, whereas the semiconductor chip of the second-type layer portion is a malfunctioning one.

11. A method of manufacturing a plurality of layered chip packages of claim 1, comprising the steps of:
fabricating a layered substructure by stacking two substructures each of which includes an array of a plurality of preliminary layer portions, each of the preliminary layer portions being intended to become one of the first and second layer portions, the substructures being intended to be cut later at positions of boundaries between every adjacent ones of the preliminary layer portions; and
forming the plurality of layered chip packages from the layered substructure.

12. The method of manufacturing the layered chip packages according to claim 11, wherein:
the step of fabricating the layered substructure includes the steps of:
fabricating an initial layered substructure that is to later become the layered substructure by being provided with a plurality of holes for the plurality of through electrodes to be accommodated in and the plurality of through electrodes;
forming the plurality of holes in the initial layered substructure; and
forming the plurality of through electrodes in the plurality of holes.

13. The method of manufacturing the layered chip packages according to claim 11, wherein:
each of the two substructures includes a plurality of conductor parts for forming the plurality of through electrodes; and
in the step of fabricating the layered substructure, the plurality of conductor parts of one of the two substructures and those of the other of the two substructures are electrically connected to each other to form the plurality of through electrodes.

14. The method of manufacturing the layered chip packages according to claim 11, wherein:
the plurality of surface electrodes of each of the first and second layer portions include a plurality of chip connection surface electrodes for electrical connection to the semiconductor chip; and
the step of fabricating the layered substructure includes, as a series of steps for forming each of the substructures, the steps of:
fabricating a pre-substructure wafer that includes an array of a plurality of pre-semiconductor-chip portions, the pre-semiconductor-chip portions being intended to become the semiconductor chips, respectively;
distinguishing the plurality of pre-semiconductor-chip portions included in the pre-substructure wafer into normally functioning pre-semiconductor-chip portions and malfunctioning pre-semiconductor-chip portions; and
forming the plurality of chip connection surface electrodes so that the pre-substructure wafer is made into the substructure, the plurality of chip connection surface electrodes being formed such that they are in contact with and electrically connected to the normally functioning pre-semiconductor-chip portions while not in contact with the malfunctioning pre-semiconductor-chip portions.

15. A composite layered chip package comprising a plurality of subpackages stacked, every vertically adjacent two of the subpackages being electrically connected to each other, each of the plurality of subpackages including a main body having a top surface and a bottom surface, the main body including:
a main part having a top surface and a bottom surface;
a plurality of first terminals disposed on the top surface of the main part; and
a plurality of second terminals disposed on the bottom surface of the main part, wherein:
the main part includes a first layer portion and a second layer portion stacked, and a plurality of through electrodes that each penetrate the first and second layer portions;
the plurality of through electrodes are electrically connected to the plurality of first terminals and the plurality of second terminals;
each of the first and second layer portions includes a semiconductor chip and a plurality of surface electrodes, the semiconductor chip of each of the first and second layer portions having a first surface and a second surface opposite to the first surface, the plurality of surface electrodes of each of the first and second layer portions being disposed on a side of the semiconductor chip opposite to the second surface of the semiconductor chip;

the first layer portion and the second layer portion are bonded directly to each other such that the second surface of the semiconductor chip of the first layer portion and the second surface of the semiconductor chip of the second layer portion face each other;

the plurality of surface electrodes of the first layer portion have a layout that is the same as a layout of the plurality of surface electrodes of the second layer portion;

the plurality of surface electrodes of each of the first and second layer portions include a plurality of first terminal component parts and a plurality of second terminal component parts;

the plurality of first terminal component parts of the plurality of surface electrodes of the first layer portion are used to form the plurality of first terminals whereas the plurality of second terminal component parts of the plurality of surface electrodes of the first layer portion are not used to form the plurality of first terminals;

the plurality of second terminal component parts of the plurality of surface electrodes of the second layer portion are used to form the plurality of second terminals, whereas the plurality of first terminal component parts of the plurality of surface electrodes of the second layer portion are not used to form the plurality of second terminals; and for any vertically adjacent two of the subpackages, the plurality of second terminals of the upper one of the subpackages are electrically connected to the plurality of first terminals of the lower one.

16. The composite layered chip package according to claim 15, wherein the plurality of surface electrodes of each of the first and second layer portions further include one or more connecting parts that electrically connect one of the first terminal component parts and one of the second terminal component parts to each other.

17. The composite layered chip package according to claim 15, wherein:
the plurality of surface electrodes of each of the first and second layer portions include a plurality of chip connection surface electrodes for electrical connection to the semiconductor chip; and
in at least one of the first and second layer portions, the plurality of chip connection surface electrodes are in contact with and electrically connected to the semiconductor chip.

18. The composite layered chip package according to claim 15, wherein:
the plurality of surface electrodes of the first layer portion include one or more surface electrodes that are not used to form the plurality of first terminals; and
the plurality of surface electrodes of the second layer portion include one or more surface electrodes that are not used to form the plurality of second terminals.

19. The composite layered chip package according to claim 15, wherein:
the plurality of second terminals are positioned to overlap the plurality of first terminals as viewed in a direction perpendicular to the top surface of the main body;
the plurality of second terminals are electrically connected to corresponding ones of the first terminals via the respective through electrodes to constitute a plurality of pairs of the first and second terminals, the first and second terminals in each of the pairs being electrically connected to each other; and the plurality of pairs include a plurality of non-overlapping terminal pairs, each of the non-overlapping terminal pairs consisting of any one of the first terminals and any one of the second terminals, the first and second terminals in each of the non-overlapping terminal pairs being electrically connected to each other and being positioned not to overlap each other as viewed in the direction perpendicular to the top surface of the main body.

20. The composite layered chip package according to claim 19, wherein the plurality of pairs further include a plurality of overlapping terminal pairs, each of the overlapping terminal pairs consisting of any one of the first terminals and any one of the second terminals, the first and second terminals in each of the overlapping terminal pairs being electrically connected to each other and being positioned to overlap each other as viewed in the direction perpendicular to the top surface of the main body.

21. The composite layered chip package according to claim 19, wherein the plurality of through electrodes include: a chip connection through electrode that is electrically connected to any one of the plurality of non-overlapping terminal pairs and used for electrical connection to the semiconductor chip of at least one of the first and second layer portions; and a bypass through electrode that is electrically connected to any one of the plurality of non-overlapping terminal pairs and to neither of the semiconductor chips included in the first and second layer portions.

22. The composite layered chip package according to claim 15, wherein the semiconductor chip of each of the first and second layer portions includes a plurality of memory cells.

23. The composite layered chip package according to claim 15, wherein:
in at least one of the plurality of subpackages, one of the first and second layer portions is a first-type layer portion, whereas the other of the first and second layer portions is a second-type layer portion;
in the first-type layer portion, the semiconductor chip is electrically connected to two or more of the plurality of through electrodes; and
in the second-type layer portion, the semiconductor chip is electrically connected to none of the through electrodes,
the composite layered chip package further comprising an additional portion that is electrically connected to any of the plurality of subpackages, the additional portion including:
at least one additional semiconductor chip; and
additional portion wiring that defines electrical connections between the at least one additional semiconductor chip and the plurality of first or second terminals of any of the plurality of subpackages so that the at least one additional semiconductor chip substitutes for the semiconductor chip of the second-type layer portion of the at least one of the subpackages.

24. The composite layered chip package according to claim 23, wherein the semiconductor chip of each of the first and second layer portions and the additional semiconductor chip each include a plurality of memory cells.

25. A method of manufacturing the composite layered chip package of claim 15, comprising the steps of:
fabricating the plurality of subpackages; and
stacking the plurality of subpackages and electrically connecting them to each other.

26. A method of manufacturing the composite layered chip package of claim 23, comprising the steps of:
fabricating the plurality of subpackages;
fabricating the additional portion; and
stacking the plurality of subpackages and the additional portion and electrically connecting them to each other.

* * * * *